United States Patent
Kanda et al.

(10) Patent No.: US 10,923,533 B2
(45) Date of Patent: Feb. 16, 2021

(54) SEMICONDUCTOR DEVICE HAVING A VOLATILE ELEMENT AND A PLURALITY OF NON-VOLATILE ELEMENTS

(71) Applicant: SONY CORPORATION, Tokyo (JP)

(72) Inventors: Yasuo Kanda, Kanagawa (JP); Takashi Yokoyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/763,178

(22) PCT Filed: Sep. 16, 2016

(86) PCT No.: PCT/JP2016/077402
§ 371 (c)(1),
(2) Date: Mar. 26, 2018

(87) PCT Pub. No.: WO2017/057046
PCT Pub. Date: Apr. 6, 2017

(65) Prior Publication Data
US 2018/0277594 A1 Sep. 27, 2018

(30) Foreign Application Priority Data
Oct. 2, 2015 (JP) ................ 2015-196478

(51) Int. Cl.
*H01L 27/22* (2006.01)
*G11C 14/00* (2006.01)
(Continued)

(52) U.S. Cl.
CPC ........ *H01L 27/228* (2013.01); *G11C 14/0081* (2013.01); *H01L 27/0617* (2013.01);
(Continued)

(58) Field of Classification Search
CPC ............... H01L 27/228; H01L 27/0617; H01L 27/2436; H01L 43/08; H01L 29/82;
(Continued)

(56) References Cited

U.S. PATENT DOCUMENTS 6,414,873 B1 * 7/2002 Herdt .................... G11C 14/00
365/154
2006/0265684 A1 11/2006 Buehler
(Continued)

FOREIGN PATENT DOCUMENTS

JP 2005-101535 4/2005
JP 2008-541308 11/2008
(Continued)

OTHER PUBLICATIONS

International Search Report prepared by the Japan Patent Office dated Nov. 24, 2016, for International Application No. PCT/JP2016/077402.
(Continued)

*Primary Examiner* — Jerome Leboeuf
(74) *Attorney, Agent, or Firm* — Sheridan Ross P.C.

(57) ABSTRACT

A volatile logic circuit has a storage node, and stores inputted information. A plurality of non-volatile elements are connected to the storage node of the volatile logic circuit through the same connection gate, and control lines for control for these non-volatile elements are connected to the respective non-volatile elements, every non-volatile element. A plurality of non-volatile elements are connected to the volatile logic circuit through the same connection gate in such a way, thereby enabling the yield to be enhanced.

6 Claims, 42 Drawing Sheets

(51) Int. Cl.
*H01L 29/82* (2006.01)
*H03K 19/17736* (2020.01)
*H01L 27/06* (2006.01)
*H01L 43/08* (2006.01)
*H01L 27/24* (2006.01)
*H03K 19/003* (2006.01)
*H03K 19/0948* (2006.01)
*H01L 27/092* (2006.01)
*H01L 27/11* (2006.01)

(52) U.S. Cl.
CPC .......... *H01L 27/2436* (2013.01); *H01L 29/82* (2013.01); *H01L 43/08* (2013.01); *H03K 19/00315* (2013.01); *H03K 19/00392* (2013.01); *H03K 19/17736* (2013.01); *H01L 27/0694* (2013.01); *H01L 27/092* (2013.01); *H01L 27/1104* (2013.01); *H03K 19/003* (2013.01); *H03K 19/0948* (2013.01)

(58) Field of Classification Search
CPC ............... H01L 27/092; H01L 27/0694; H01L 27/1104; H03K 19/17736; H03K 19/00392; H03K 19/00315; H03K 19/0948; H03K 19/003; G11C 14/0081
See application file for complete search history.

(56) References Cited

U.S. PATENT DOCUMENTS

| | | | |
|---|---|---|---|
| 2011/0273925 A1 | 11/2011 | Yamamoto | |
| 2012/0195096 A1* | 8/2012 | Summerfelt | G11C 11/22 365/145 |
| 2013/0114325 A1* | 5/2013 | Lin | G11C 14/009 365/148 |
| 2015/0357376 A1* | 12/2015 | Seo | H01L 27/228 257/252 |
| 2017/0092692 A1* | 3/2017 | Kalnitsky | H01L 43/12 |

FOREIGN PATENT DOCUMENTS

| | | |
|---|---|---|
| JP | 2010-041705 | 2/2010 |
| JP | 2012-119683 | 6/2012 |
| JP | 2012-242287 | 12/2012 |
| WO | WO 2009-028298 | 3/2009 |

OTHER PUBLICATIONS

Official Action (no English translation available) for Japanese Patent Application No. 2017-543137, dated Jun. 23, 2020, 5 pages.

* cited by examiner

FIG. 3
| SELECT | OUT0 | OUT1 |
|---|---|---|
| 0 | IN0 | Z |
| 1 | Z | IN1 |
A11
| IN0 | IN1 | SELECT | OUT0 | OUT1 |
|---|---|---|---|---|
| 0 | 0 | 0 | 0 | Z |
| 1 | 0 | 0 | 1 | Z |
| 0 | 1 | 0 | 0 | Z |
| 1 | 1 | 0 | 1 | Z |
| 0 | 0 | 1 | Z | 0 |
| 1 | 0 | 1 | Z | 0 |
| 0 | 1 | 1 | Z | 1 |
| 1 | 1 | 1 | Z | 1 |
A12

US 10,923,533 B2

SEMICONDUCTOR DEVICE HAVING A VOLATILE ELEMENT AND A PLURALITY OF NON-VOLATILE ELEMENTS

CROSS REFERENCE TO RELATED APPLICATIONS

This application is a national stage application under 35 U.S.C. 371 and claims the benefit of PCT Application No. PCT/JP2016/077402 having an international filing date of 16 Sep. 2016, which designated the United States, which PCT application claimed the benefit of Japan Patent Application No. 2015-196478 filed 2 Oct. 2015, the entire disclosures of each of which are incorporated herein by reference.

TECHNICAL FIELD

The present technology relates to a semiconductor device, and more particularly to a semiconductor device for which yield can be enhanced.

BACKGROUND ART

Heretofore, for the purpose of enhancing the yield of the semiconductor devices, redundant relief has been carried out. For example, a technology with which a redundant cell having the same configuration as that of each of basic cells within a logic area is provided for the basic cells has been proposed as such a technology (for example, refer to PTL 1).

In this technology, an input of a signal to the basic cell or the redundant cell is switched by an input selector. In addition, which of signals outputted from the basic cells and the redundant cell is to be outputted is switched by an output selector, thereby relieving a broken-down basic cell. That is to say, one redundant cell is connected to a plurality of basic cells arranged in an array. In the case where there is a defect in any of these basic cells, the redundant cell is used instead of the basic cell having the defect.

Incidentally, in recent years, along with the high integration of logic circuits, reduction in power consumption of the semiconductor device has been required. Then, for example, at the time of the operation of the semiconductor device, the power consumption is reduced by the low voltage promotion of a drive voltage, and at the time of the stand-by of the semiconductor device, in a word, at the time of the clock stop, the power consumption is reduced by PG (Power Grating).

However, since in the PG, the power supply to the logic circuit becoming a target is stopped, a state of the logic circuit cannot be returned back to the state before the stop of the power supply. That is to say, the logic return cannot be carried out.

Then, there is proposed an NVPG (Non-Volatile Power Gating) technology with which an NVM (Non-Volatile Memory) is connected to a logic circuit such as a flip flop circuit becoming a PG target, and at the time of the power restorage, the logic return can be carried out.

CITATION LIST

Patent Literature

[PTL 1]
JP 2010-41705A

SUMMARY

Technical Problem

Now, unlike Memory Macro, that is, an SRAM (Static Random Access Memory), the logic circuits becoming the targets of the NVPG do not have an array configuration. Therefore, the relief by IO (Input Output) redundancy, WL (Word Line) redundancy or the like cannot be carried out.

For this reason, the yield of the non-volatile memories connected to the logic circuits each becoming the target of the NVPG is directly linked to the yield of the semiconductor devices. That is to say, when the yield of the non-volatile memories is reduced, the yield of the semiconductor devices themselves is also reduced.

The present technology has been made in the light of such a situation, and enables the yield to be enhanced.

Solution to Problem

A semiconductor device of a first aspect of the present technology is provided with a volatile logic circuit, a plurality of non-volatile elements connected to the volatile logic circuit through a same connection gate, and each of a plurality of control lines connected to the respective non-volatile elements.

The plurality of non-volatile elements can be connected through the connection gate every storage node within the volatile logic circuit.

The non-volatile elements can be either a ferromagnetic tunnel junction element or a resistance variable element.

The plurality of non-volatile elements can be made to have the same size.

The plurality of non-volatile elements can be made to have sizes different from one another.

The plurality of non-volatile elements can include the non-volatile elements having the same size and the non-volatile elements having sizes different from one another.

The plurality of non-volatile elements can include a non-volatile element for redundant relief.

The plurality of non-volatile elements can be provided in layers different from one another.

In the first aspect of the present technology, the volatile logic circuit, the plurality of non-volatile elements connected to the volatile logic circuit through the same connection gate, and each of the plurality of control lines connected to the respective non-volatile elements are provided in the semiconductor device.

A semiconductor device of a second aspect of the present technology is provided with a volatile storage element, and a non-volatile element provided on a back surface side opposite to a principal surface side on which the volatile storage element is provided in a substrate, and connected to a storage node of the volatile storage element by a contact through which the principal surface side and the back surface side of the substrate are connected to each other.

A control line for control for the non-volatile element can be provided on the back surface side of the substrate.

A selection transistor through which the non-volatile element and the storage node are electrically connected to each other can be provided on the principal surface side of the substrate, and one diffusion region of the selection transistor can be connected to the contact, and the other diffusion region of the selection transistor can be connected to the storage node.

The non-volatile element can be a ferromagnetic tunnel junction element.

The non-volatile element can be a resistance variable memory.

A plurality of transistors configuring the volatile storage element and the selection transistor can be provided in such a way that gate electrodes of the transistors and a gate electrode of the selection transistor become parallel to each other, and the gate electrodes are arranged side by side in a linear fashion, and two selection transistors as the selection transistor can be arranged in diagonal positions opposing to each other so as to be adjacent to a region in which the plurality of transistors are provided.

A plurality of transistors configuring the volatile storage element can be arranged in a predetermined region in such a way that gate electrodes of the plurality of transistors become parallel to one another, and the selection transistor and the non-volatile element can be arranged in a region adjacent to the predetermined region. The selection transistor can be arranged in such a way that a gate electrode of the selection transistor becomes parallel to the gate electrodes of the transistors.

A p-type well region and an n-type well region adjacent to each other can be provided in the substrate, and a plurality of transistors configuring the volatile storage element can be arranged in the p-type well region and the n-type well region. The selection transistor can be arranged in both end positions of a region in which the transistors are arranged in the p-type well region. The plurality of transistors and the selection transistors can be arranged in such a way that gate electrodes of the transistors and gate electrodes of the selection transistors become parallel to each other.

A p-type well region and an n-type well region adjacent to each other can be provided in the substrate, and a plurality of transistors configuring the volatile storage element can be arranged in the p-type well region and the n-type well region. The selection transistor can be arranged in a region adjacent, in a direction approximately vertical to a direction in which the p-type well region and the n-type well region are arranged side by side, to a region in which the plurality of transistors configuring the volatile storage element are arranged. In addition, the plurality of transistors and the selection transistor can be arranged in such a way that gate electrodes of the transistors and a gate electrode of the selection transistor become parallel to each other.

A p-type well region and an n-type well region adjacent to each other can be provided in the substrate, and a plurality of transistors configuring the volatile storage element can be arranged in the p-type well region and the n-type well region, and the selection transistor can be arranged in both end positions of a region in which the transistors are arranged in the n-type well region. In addition, the plurality of transistors and the selection transistors can be arranged side by side in a direction approximately vertical to a direction in which the p-type well region and the n-type well region are arranged side by side in such a way that gate electrodes of the plurality of transistors and gate electrodes of the selection transistors become parallel to each other.

A selection transistor through which the non-volatile element and the control line are electrically connected to each other can be provided on the principal surface side of the substrate. One end of the non-volatile element can be connected to the contact, and the other end of the non-volatile element can be connected to the selection transistor.

A p-type well region and an n-type well region adjacent to each other can be provided in the substrate, and a plurality of transistors configuring the volatile storage element can be arranged in the p-type well region and the n-type well region, and the selection transistor can be arranged in both end positions of a region in which the transistors are arranged in the n-type well region. In addition, the plurality of transistors and the selection transistors can be arranged side by side in a direction approximately vertical to a direction in which the p-type well region and the n-type well region are arranged side by side in such a way that gate electrodes of the plurality of transistors and gate electrodes of the selection transistors become parallel to each other.

The plurality of non-volatile elements including the non-volatile element connected to the storage node can be provided on the back surface side of the substrate.

Some of the plurality of non-volatile elements can be the non-volatile elements for redundant relief.

In the second aspect of the present technology, there are provided the volatile storage element, and the non-volatile element which is provided on the back surface side opposite to the principal surface side on which the volatile storage element is provided in the substrate, and connected to the storage node of the volatile storage element by the contact through which the principal surface side and the back surface side of the substrate are connected to each other.

A semiconductor device of a third aspect of the present technology has a volatile storage element, a selection transistor connected to a storage node of the volatile storage element, and a non-volatile element connected to the storage node through the selection transistor. A plurality of transistors configuring the volatile storage element and the selection transistor are provided in such a way that gate electrodes of the transistors and a gate electrode of the selection transistor become parallel to each other, and the gate electrodes are arranged side by side in a linear fashion. In addition, two selection transistors as the selection transistor are arranged in diagonal positions opposing to each other so as to be adjacent to a region in which the plurality of transistors are provided.

In the third aspect of the present technology, there are provided the volatile storage element, the selection transistor connected to the storage node of the volatile storage element, and the non-volatile element connected to the storage node through the selection transistor. The plurality of transistors configuring the volatile storage element and the selection transistor are provided in such a way that gate electrodes of the transistors and the gate electrode of the selection transistor become parallel to each other, and the gate electrodes are arranged side by side in a linear fashion. In addition, the two selection transistors are arranged in the diagonal positions opposing to each other so as to be adjacent to the region in which the plurality of transistors are provided.

A semiconductor device of a fourth aspect of the present technology is provided with a first non-volatile circuit and a second non-volatile circuit. In this case, the first non-volatile circuit has a volatile storage element, a first selection transistor connected to a storage node of the volatile storage element, and a non-volatile element connected to the storage node through the first selection transistor. The second non-volatile circuit has the volatile storage element, a second selection transistor which is different in kind from the first selection transistor and which is connected to the storage node of the volatile storage element, and the non-volatile element connected to the storage node through the second selection transistor.

The first non-volatile circuit and the second non-volatile circuit can be provided adjacent to each other.

The first selection transistor can be an nMOS transistor, and the second selection transistor can be a pMOS transistor.

The first selection transistor and the second selection transistor can be connected to control lines different from each other.

A first control line can be connected to the non-volatile element provided in the first non-volatile circuit, and a second control line different from the first control line can be connected to the non-volatile element provided in the second non-volatile circuit.

At the time of storage of information held in the storage node, a voltage at a high level, and a voltage at a low level can be applied in order to the first control line and the second control line. At the time of restorage of the information, a voltage at a low level can be applied to the first control line, and a voltage at a high level can be applied to the second control line.

The volatile storage element, the first selection transistor, and the second selection transistor can be provided on a principal surface side in a substrate, and the non-volatile element, the first control line, and the second control line can be provided on a back surface side opposite to the principal surface side of the substrate. The first selection transistor and the second selection transistor, and the non-volatile element of the first non-volatile circuit and the non-volatile element of the second non-volatile circuit can be connected to each other by a contact through which the principal surface side and the back surface side of the substrate are connected to each other.

The plurality of non-volatile elements including the non-volatile element connected to the storage node can be provided on the back surface side of the substrate.

Some of the plurality of non-volatile elements can be non-volatile elements for redundant relief.

In the fourth aspect of the present technology, there are provided the first non-volatile circuit and the second non-volatile circuit. In this case, the first non-volatile circuit has the volatile storage element, the first selection transistor connected to the storage node of the volatile storage element, and the non-volatile element connected to the storage node through the first selection transistor. The second non-volatile circuit has the volatile storage element, the second selection transistor which is different in kind from the first selection transistor and which is connected to the storage node of the volatile storage element, and the non-volatile element connected to the storage node through the second selection transistor.

Advantageous Effect of Invention

According to the first aspect to the fourth aspect of the present technology, the yield can be enhanced.

BRIEF DESCRIPTION OF DRAWINGS

FIG. 3 is a diagram explaining an operation of a selection circuit.

DESCRIPTION OF EMBODIMENTS

Hereinafter, embodiments to each of which the present technology is applied will be described with reference to the drawings.

First Embodiment

<Example of Configuration of Semiconductor Device>

The present technology relates to a semiconductor device in which a plurality of non-volatile elements including a non-volatile element for redundancy are connected to a volatile logic circuit becoming a target of an NVPG through the same connection gate, thereby enhancing the yield at the time of manufacture.

Figure 1:
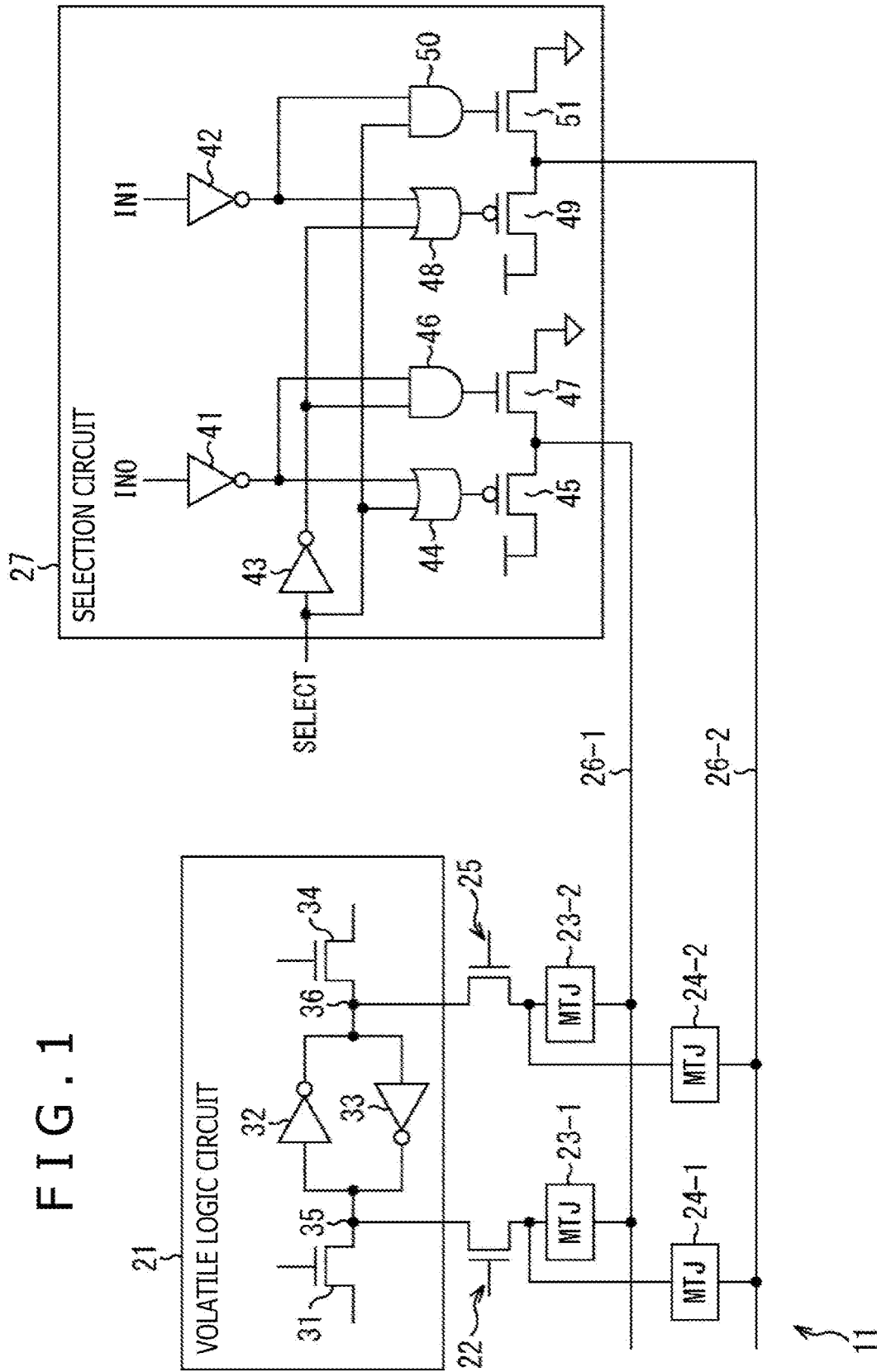
FIG. 1 is a diagram depicting an example of a configuration of a semiconductor device.

FIG. 1 is a diagram depicting an example of a configuration of an embodiment of a semiconductor device to which the present technology is applied.

A semiconductor device 11 includes various kinds of electronic apparatuses each having a logic circuit, and devices with which these electronic apparatuses are loaded. Although, for example, the semiconductor device 11 is provided with a plurality of logic circuits or the like, in this example, only a part thereof is illustrated.

The semiconductor device 11 has a volatile logic circuit 21, a transistor 22, an MTJ (Magnetic Tunnel Junction) 23-1, an MTJ 23-2, an MTJ 24-1, an MTJ 24-2, a transistor 25, a control line 26-1, a control line 26-2, and a selection circuit 27.

The volatile logic circuit 21 is a logic circuit becoming a target of an NVPG in which supply of an electric power is stopped at the time of stand-by, and serves as a volatile storage element. In this example, the volatile logic circuit 21 is a volatile bi-stable circuit for storing therein inputted information.

In addition, the semiconductor device 11 has a configuration in which, for example, a plurality of volatile logic circuits 21 are sprinkled on a semiconductor substrate, and does not have a configuration in which a plurality of volatile logic circuits 21 are arranged in an array.

The volatile logic circuit 21 has a transistor 31, an inverter 32, an inverter 33, and a transistor 34. The transistor 31 and the transistor 34 are each an nMOS transistor.

In the volatile logic circuit 21, an input terminal of the inverter 32, and an output terminal of the inverter 33 are connected to an end of the transistor 31, and an connection portion of the end of the transistor 31, the input terminal of the inverter 32, and the output terminal of the inverter 33 becomes a storage node 35. An end of the transistor 22 is also connected to the storage node 35.

In addition, in the volatile logic circuit 21, an output terminal of the inverter 32, and an input terminal of the inverter 33 are connected to an end of the transistor 34, and a connection portion of the end of the transistor 34, the output terminal of the inverter 32, and the input terminal of the inverter 33 becomes a storage node 36. An end of the transistor 25 is also connected to the storage node 36.

The transistor 22 is an nMOS transistor. One end of the transistor 22 is connected to the storage node 35, and the other end of the transistor 22 is connected to the MTJ 23-1 and the MTJ 24-1. That is to say, the transistor 22 functions as a connection gate through which the storage node 35, and the MTJ 23-1 and the MTJ 24-1 are electrically connected to each other.

In addition, the transistor 25 is an nMOS transistor. One end of the transistor 25 is connected to the storage node 36, and the other end of the transistor 25 is connected to the MTJ 23-2 and the MTJ 24-2. That is to say, the transistor 25 functions as a connection gate through which the storage node 36, and the MTJ 23-2 and the MTJ 24-2 are electrically connected to each other.

Incidentally, in the case where the MTJ 23-1 and the MTJ 23-2 do not need to be especially distinguished from each other, the MTJ 23-1 and the MTJ 23-2 shall also be simply referred to as the MTJ 23, and in the case where the MTJ 24-1 and the MTJ 24-2 do not need to be especially distinguished from each other, the MTJ 24-1 and the MTJ 24-2 shall also be simply referred to as the MTJ 24.

The MTJ 23 and the MTJ 24 are each a non-volatile element for storing therein information held (stored) in the storage node of the volatile logic circuit 21, and are each a ferromagnetic tunnel junction element (MTJ) in this example. It should be noted that in this case, a description will be given with respect to an example in which the MTJ is used as the MTJ 23 and the MTJ 24. Alternatively, instead of the MTJ, a resistance variable element, especially, a resistance variable element (bipolar variable element) which causes a current to flow bi-directionally to make an operation, or the like may be used.

A control line 26-1 and a control line 26-2 are connected to ends of the MTJ 23-1 and the MTJ 24-1, respectively, on the side opposite to the side of the transistor 22. In addition, the control line 26-1 and the control line 26-2 are connected to ends of the MTJ 23-2 and the MTJ 24-2, respectively, on the side opposite to the side of the transistor 25.

An STT-MRAM (Spin Transfer Torque-Magnetic Random Access Memory) for writing the information held in the volatile logic circuit 21 to the MTJ 23-1 and the MTJ 23-2, or reading out the information stored in the MTJ 23-1 and the MTJ 23-2 to the volatile logic circuit 21, for example, is configured by the MTJ 23-1 and the MTJ 23-2. In addition, an STT-MRAM for redundant relief for the STT-MRAM including the MTJ 23 is configured by, for example, the MTJ 24-1 and the MTJ 24-2. Therefore, in this example, even in the case where a defect is generated in the MTJ 23, the storage and restorage of the information held in the volatile logic circuit 21 can be carried out by selectively using the MTJ 24.

It should be noted that hereinafter, in the case where the control line 26-1 and the control line 26-2 do not need to be especially distinguished from each other, the control line 26-1 and the control line 26-2 shall also be simply referred to as the control line 26 as well.

In such a way, in the semiconductor device 11, the non-volatile logic circuit is realized by the volatile logic circuit 21, the transistor 22 and the transistor 25, and the MTJ 23 and the MTJ 24.

The selection circuit 27 selects any one of a control signal IN0 and a control signal IN1 inputted thereto in response to an inputted selection signal SELECT, and outputs the selected control signal IN0 or control signal IN1 to the control line 26. In other words, the selection circuit 27 selects any one of the MTJ 23 and the MTJ 24 in response to the selection signal SELECT and controls an operation of the selected MTJ.

The selection circuit 27 has an inverter 41, an inverter 42, an inverter 43, an OR circuit 44, a transistor 45, an AND circuit 46, a transistor 47, an OR circuit 48, a transistor 49, an AND circuit 50, and a transistor 51. In the selection circuit 27, the transistor 45 and the transistor 49 are each a pMOS transistor, and the transistor 47 and the transistor 51 are each an nMOS transistor.

The inverter 41 inverts the supplied control signal IN0 and supplies the inverted control signal IN0 to each of input terminals of the OR circuit 44 and the AND circuit 46. The inverter 42 inverts the supplied control signal IN1 and supplies the inverted control signal IN1 to each of input terminals of the OR circuit 48 and the AND circuit 50.

The inverter 43 inverts the supplied selection signal SELECT, and supplies the inverted selection signal SELECT to each of input terminals of the AND circuit 46 and the OR circuit 48. In addition, the selection signal SELECT is supplied to each of input terminals of the OR circuit 44 and the AND circuit 50.

One end of the transistor 45 is connected to a power source, and the other end of the transistor 45 is connected to the control line 26-1. In addition, an output terminal of the OR circuit 44 is connected to a gate electrode of the transistor 45.

One end of the transistor 47 is connected to the ground, and the other end of the transistor 47 is connected to the control line 26-1. In addition, an output terminal of the AND circuit 46 is connected to a gate electrode of the transistor 47.

One end of the transistor 49 is connected to a power source, and the other end of the transistor 49 is connected to the control line 26-2. In addition, an output terminal of the OR circuit 48 is connected to a gate electrode of the transistor 49.

One end of the transistor 51 is connected to the ground, and the other end of the transistor 51 is connected to the control line 26-2. In addition, an output terminal of the AND circuit 50 is connected to a gate electrode of the transistor 51.

<MTJ>

Subsequently, a description will be given with respect to the MTJ 23 and the MTJ 24 which are provided in the semiconductor device 11. In this case, a description is given by exemplifying the MTJ 23-1.

Figure 2:
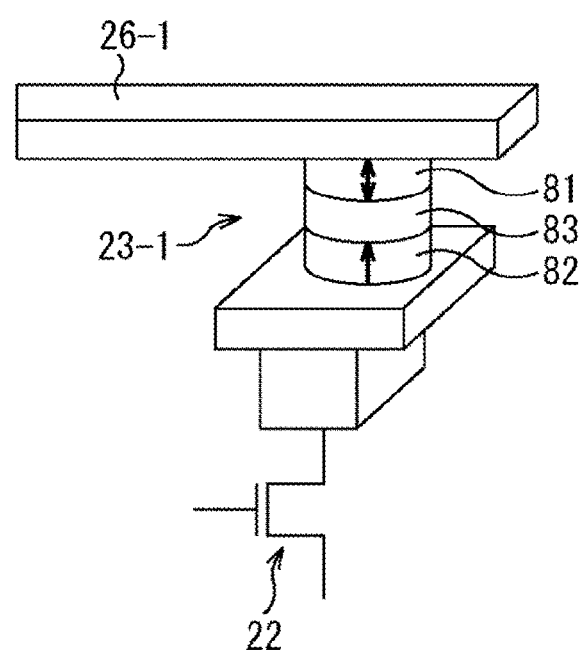
FIG. 2 is a view explaining an MTJ.

The MTJ 23-1, for example, as depicted in FIG. 2, has a free layer 81, a pin layer 82, and a tunnel insulating film 83. It should be noted that in FIG. 2, portions corresponding to those in the case of FIG. 1 are assigned the same reference signs, and a description thereof is suitably omitted herein.

In the example depicted in FIG. 2, the free layer 81 is connected to the control line 26-1, the pin layer 82 is connected to the transistor 22, and the tunnel insulating film 83 is arranged between the free layer 81 and the pin layer 82.

In addition, in the free layer 81, a magnetization direction can be changed, whereas in the pin layer 82, the magnetization direction is fixed. In particular, a state in which the magnetization directions of the free layer 81 and the pin layer 82 are parallel to each other is called as a parallel magnetization state. A state in which the magnetization directions of the free layer 81 and the pin layer 82 are anti-parallel is called as an anti-parallel magnetization state.

Moreover, in this case, the parallel magnetization state is referred to as a low resistance state as well in which the resistance of the MTJ 23-1 is small, and the anti-parallel magnetization state is referred to as a high resistance state as well in which the resistance of the MTJ 23-1 is large.

For example, if a voltage is applied to the free layer 81 when the MTJ 23-1 is in the anti-parallel magnetization state, a current is caused to flow from the free layer 81 to the pin layer 82 to invert the magnetization of the free layer 81, so that the MTJ 23-1 becomes the parallel magnetization state, in a word, the low resistance state.

On the other hand, if a voltage is applied to the pin layer 82 when the MTJ 23-1 is in the parallel magnetization state, the current is caused to flow from the pin layer 82 to the free layer 81 to invert the magnetization of the free layer 81, so that the MTJ 23-1 becomes the anti-parallel magnetization state, in a word, the high resistance state.

In such a way, in the MTJ 23-1, the resistance of the MTJ 23-1 can be changed by the voltage applied to the MTJ 23-1. Therefore, the information can be stored in the MTJ 23-1 in such a way that, for example, "1" is made to correspond to the high resistance state, and "0" is made to correspond to the low resistance state.

It should be noted that similarly to the case of the MTJ 23-1, in the MTJ 23-2 and the MTJ 24-2 as well, the free layer shall be connected to the control line 26, and the pin layer shall be connected to the transistor 25. Likewise, in the MTJ 24-1 as well, the free layer shall be connected to the control line 26, and the pin layer shall be connected to the transistor 22.

<Operation of Semiconductor Device>

Next, a description will be given with respect to an operation of the semiconductor device 11.

Firstly, a description will be given with respect to writing and reading of the information to and from the volatile logic circuit 21.

For example, at the time of writing of the information to the volatile logic circuit 21, the transistor 31 and the transistor 34 are turned ON, that is, set to a conduction state, so that the information is written to the storage node 35 and the storage node 36.

In addition, each of the ends of the transistor 31 and the transistor 34 on the side opposite to the side of the respective inverters 32 is set to a floating state, and when the transistor 31 and the transistor 34 are turned ON, the information held (stored) in the storage node 35 and the storage node 36 is read out.

Subsequently, a description will be given with respect to the storage of the information from the volatile logic circuit 21 to the MTJ 23 or the MTJ 24. It should be noted that although in this case, the description will be given with respect to the storage of the information to the MTJ 23, the storage of the information to the MTJ 24 is similar to the case of the storage of the information to the MTJ 23.

It is assumed that, for example, the storage node 35 is in a state of a high level, and the storage node 36 is in a state of a low level, that is, "1" is held as the information in the storage node 35, and "0" is held as the information in the storage node 36. At this time, the transistor 31 and the transistor 34 are in an OFF state (in a non-conduction state).

In this case, firstly, the transistor 22 and the transistor 25 are turned ON, and the control line 26-1 is set at the low level, in a word, set to "0." Then, since the storage node 35 is at the high level, the current is caused to flow from the transistor 22 to the control line 26-1 through the MTJ 23-1, so that the MTJ 23-1 becomes the high resistance state. As a result, the information "1" is stored in the MTJ 23-1. At this time, since the storage node 36 is at the low level, no current is caused to flow through the MTJ 23-2.

Thereafter, when the control line 26-1 is set at the high level, the current is caused to flow from the control line 26-1 to the transistor 25 through the MTJ 23-2, so that the MTJ 23-2 becomes the low resistance state. As a result, the information "0" is stored in the MTJ 23-2. At this time, since the storage node 35 is at the high level, no current is caused to flow through the MTJ 23-1.

From the above operation, the information held in the storage node 35 is stored in the MTJ 23-1, and the information held in the storage node 36 is stored in the MTJ 23-2.

It should be noted that since the storage operation in a state in which the storage node 35 is at the low level, and the storage node 36 is at the high level is similar to the above case described above, a description thereof is omitted herein.

Next, a description will be given with respect to the restorage of the information from the MTJ 23 to the volatile logic circuit 21, in a word, the logic return in the volatile logic circuit 21. It should be noted that although in this case, the description will be given with respect to the restorage of the information from the MTJ 23, the restorage of the information from the MTJ 24 is similar to the case of the restorage of the information from the MTJ 23.

It is assumed that, for example, the information "1" is stored in the MTJ 23-1, and the information "0" is stored in the MTJ 23-2.

In this case, firstly, the transistor 22 and the transistor 25 are turned ON, and the control line 26-1 is set at the low level, in a word, set to "0." In addition, the voltage of the power source connected to the volatile logic circuit 21 is changed from the low level to the high level. At this time, since the storage node 35 and the storage node 36 are held at the low level, the current is caused to flow from the inverter 33 to the storage node 35, and the current is also caused to flow from the inverter 32 to the storage node 36.

In this state, since the MTJ 23-1 is in the high resistance state, the current which is caused to flow from the storage node 35 to the control line 26-1 is small in magnitude. On the other hand, since the MTJ 23-2 is in the low resistance state, the current which is caused to flow from the storage node 36 to the control line 26-1 is large in magnitude. In addition, in a state in which the voltage in the storage node 35 is larger than the voltage in the storage node 36 due to a difference between the current caused to flow through the MTJ 23-1 and the current caused to flow through the MTJ 23-2, in a word, due to a difference in electrical resistance, the voltages in these storage nodes rise.

Then, the output from the inverter 32 is inverted from the high level to the low level. As a result, the storage node 35 becomes the high level state, and the storage node 36 becomes the low level state. That is to say, the semiconductor device 11 becomes a state in which the information "1" is held in the storage node 35, and the information "0" is held in the storage node 36. As a result, the restorage of the information from the MTJ 23 to the volatile logic circuit 21 is completed.

Incidentally, since the restorage operation in the state in which the information "0" is stored in the MTJ 23-1 and the information "1" is stored in the MTJ 23-2 is similar to the above case, a description thereof is omitted herein.

When the storage operation and restorage operation of the information held in the volatile logic circuit 21 are carried out in the manner as described above, the control for switching the control line 26 between the high level and the low level is carried out.

For example, in the case where in the semiconductor device 11, normally, the MTJ 23 is used, and the MTJ 23 is not properly operated due to the defect or the like generated in the MTJ 23, the redundant relief is carried out, and the MTJ 24 for redundant relief is used. Therefore, at the time of the storage operation or at the time of the restorage operation, normally, the voltage application control is carried out for the control line 26-1, and when the redundant relief is carried out, the voltage application control is carried out for the control line 26-2.

Hereinafter, a description will be given with respect to the control for the voltage application to the control line 26 by the selection circuit 27.

For example, in the selection circuit 27, the control depicted in FIG. 3 is carried out. It should be noted that FIG. 3 depicts the levels of the control line 26 for combinations of the values of the control signal IN0, the control signal IN1, and the selection signal SELECT.

In addition, in FIG. 3, "SELECT" exhibits the selection signal SELECT, "OUT0" exhibits the output to the control line 26-1, in a word, the level of the control line 26-1, and "OUT1" exhibits the output to the control line 26-2. In addition, "IN0" exhibits the control signal IN0, "IN1" exhibits the control signal IN1, and "Z" exhibits that the control line is in the floating state.

In the selection circuit 27, when the selection signal SELECT is 0 as indicated by an arrow A11, in a word, when the selection signal SELECT is set at the low level, the level of the control signal IN0 is set at the level of the control line 26-1 as it is, so that the control line 26-2 is set in the floating state.

On the other hand, when the selection signal SELECT is 1, in a word, when the selection signal SELECT is set at the high level, the level of the control signal IN1 is set at the level of the control line 26-2 as it is, so that the control line 26-1 is set in the floating state.

Here, eFuse, for example, is used for the supply of the selection signal SELECT. That is to say, in the case where the redundant relief is unnecessary for the MTJ 23 and thus the MTJ 23 is operated as usual, a state in which eFuse is not cut is kept. In this case, the selection signal SELECT is set to 0. On the other hand, in the case where the redundant relief is carried out and the MTJ 24 is operated, eFuse is cut, and in and after the cut of eFuse, the selection signal SELECT continuously becomes 1.

For example, in the case where as indicated by an arrow A12, the selection signal SELECT is set to 0, since "1" as the inverted selection signal SELECT is supplied from the inverter 43 to the OR circuit 48, the output from the OR circuit 48 is usually "1," in a word, becomes the high level. Therefore, the transistor 49 is usually kept OFF.

In addition, in the case where the selection signal SELECT is set to 0, since "0" is supplied as the selection signal SELECT to the AND circuit 50, the output from the AND circuit 50 is usually "0," in a word, becomes the low level. Therefore, the transistor 51 is usually kept OFF.

As a result, in the case where the selection signal SELECT is 0, the transistor 49 and the transistor 51 are usually kept OFF, and thus the control line 26-2 becomes the floating state.

Moreover, in the case where the selection signal SELECT is 0, and the control signal IN0 is 0, since "0" as the selection signal SELECT, and "1" obtained by inverting the control signal IN0 by the inverter 41 are both supplied to the OR circuit 44, the output from the OR circuit 44 becomes the high level, in a word, becomes "1." Therefore, the transistor 45 is kept OFF.

In the case where the selection signal SELECT is 0, and the control signal IN0 is 0, since "1" obtained by inverting the selection signal SELECT by the inverter 43, and "1" obtained by inverting the control signal IN0 by the inverter 41 are both supplied to the AND circuit 46, the output from the AND circuit 46 becomes the high level, in a word, becomes "1." As a result, the transistor 47 is turned ON, and as a result, the control line 26-1 is connected to the ground. Thus, the control line 26-1 becomes the low level, in a word, becomes "0."

On the other hand, in the case where the selection signal SELECT is 0, and the control signal IN0 is 1, since "1" obtained by inverting the selection signal SELECT by the inverter 43, and "0" obtained by inverting the control signal IN0 by the inverter 41 are both supplied to the AND circuit 46, the output from the AND circuit 46 becomes the low level, in a word, becomes "0." Therefore, the transistor 47 is kept OFF.

In addition, in the case where the selection signal SELECT is 0, and the control signal IN0 is 1, since "0" as the selection signal SELECT, and "0" obtained by inverting the control signal IN0 by the inverter 41 are both supplied to the OR circuit 44, the output from the OR circuit 44 becomes the low level, in a word, becomes "0." As a result, the transistor 45 is turned ON, so that the control line 26-1 is connected to the power source. As a result, the control line 26-1 becomes the high level, in a word, becomes "1."

In the case where the selection signal SELECT is 0 in such a way, the level of the control signal IN0 becomes the level of the control line 26-1 as it is, and the control line 26-2 becomes the floating state. Therefore, in the semiconductor device 11, by changing the level of the control signal IN0, the storage operation and the restorage operation each using the MTJ 23 can be carried out.

Contrary to this, in the case where as indicated by the arrow A12, the selection signal SELECT is set to 1, since "1" is supplied as the selection signal SELECT to the OR circuit 44, the output from the OR circuit 44 usually becomes "1," in a word, becomes the high level. Therefore, the transistor 45 is usually kept OFF.

In addition, in the case where the selection signal SELECT is set to 1, since "0" obtained by inverting the selection signal SELECT by the inverter 43 is supplied to the AND circuit 46, the output from the AND circuit 46 usually becomes "0," in a word, becomes the low level. Therefore, the transistor 47 is usually kept OFF.

As a result, in the case where the selection signal SELECT is 1, the transistor 45 and the transistor 47 are usually kept OFF, and the control line 26-1 becomes the floating state.

Moreover, in the case where the selection signal SELECT is 1, and the control signal IN1 is 0, since "0" obtained by inverting the selection signal SELECT by the inverter 43, and "1" obtained by inverting the control signal IN1 by the inverter 42 are both supplied to the OR circuit 48, the output from the OR circuit 48 becomes the high level, in a word, becomes "1." Therefore, the transistor 49 is kept OFF.

In the case where the selection signal SELECT is 1, and the control signal IN1 is 0, since "1" as the selection signal SELECT and "1" obtained by inverting the control signal IN1 by the inverter 42 are both supplied to the AND circuit 50, the output from the AND circuit 50 becomes the high level, in a word, becomes "1." As a result, the transistor 51 is turned ON, so that the control line 26-2 is connected to the ground. As a result, the control line 26-2 becomes the low level, in a word, becomes "0."

On the other hand, in the state where the selection signal SELECT is 1, and the control signal IN1 is 1, since "1" as the selection signal SELECT and "0" obtained by inverting the control signal IN1 by the inverter 42 are both supplied to the AND circuit 50, the output from the AND circuit 50 becomes the low level, in a word, becomes "0." Therefore, the transistor 51 is kept OFF.

In addition, in the case where the selection signal SELECT is 1, the control signal IN1 is 1, "0" obtained by inverting the selection signal SELECT by the inverter 43, and "0" obtained by inverting the control signal IN1 by the inverter 42 are both supplied to the OR circuit 48, the output from the OR circuit 48 becomes the low level, in a word, becomes "0." As a result, the transistor 49 is turned ON, so that the control line 26-2 is connected to the power source. As a result, the control line 26-2 becomes the high level, in a word, becomes "1."

In the case where the selection signal SELECT is 1 in such a way, the level of the control signal IN1 becomes the level of the control line 26-2 as it is, and the control line 26-1 becomes the floating state. Therefore, in the semiconductor device 11, by changing the level of the control signal IN1, the storage operation and the restorage operation each using the MTJ 24 can be carried out.

As described above, in the semiconductor device 11, in addition to the MTJ 23 connected to the volatile logic circuit 21, the MTJ 24 for redundant relief is connected. Therefore, even in the case where the MTJ 23 is defective, the storage operation and restorage operation for the information held in the volatile logic circuit 21 can be carried out by using the MTJ 24 for redundant relief. In such a way, the MTJ 23 for holding the information is connected to the volatile logic circuit 21, and the MTJ 24 for redundant relief is also connected thereto, thereby enabling the yield of the semiconductor device 11 to be enhanced.

In particular, in the semiconductor device 11, the provision of the MTJ 24 as the element for redundant relief results in that the size of the semiconductor device 11 can be further reduced than the case where the non-volatile logic circuit having the same configuration as that of the non-volatile logic circuit including the volatile logic circuit 21 and the MTJ 23 is mounted as the circuit for redundant relief to the non-volatile logic circuit including the volatile logic circuit 21 and the MTJ 23.

In addition, with regard to the MTJ 23 and the MTJ 24, the sizes of these MTJs, for example, the diameter sizes (diameters) of the MTJs may be equal to each other, or may be different from each other. Here, the diameter size of the MTJ means a transverse diameter, for example, in the figure of the MTJ 23-1 depicted in FIG. 2, in a word, a width in a direction vertical to a direction in which the free layer 81 and the pin layer 82 are arranged side by side in the MTJ 23-1.

For example, in the non-volatile logic circuit using the STT-MRAM including the MTJ, an influence exerted on the characteristics dispersion of the STT-MRAM due to the processing dispersion of the MTJs is large. Specifically, since a write current becomes large if the diameter size of the MTJ is large, write failure becomes easy to be generated. Contrary to this, if the diameter size of the MTJ becomes small, the characteristics of holding the information are reduced.

Then, for example, by forming the MTJ 23 and the MTJ 24 different in diameter size from each other in the semiconductor device 11, after the manufacture, one which has the excellent characteristics of the MTJ 23 and the MTJ 24 can be used. For example, if the MTJ 23 and the MTJ 24 are formed in different diameter sizes, then, even in the case where the dispersion is generated in the diameter size of the MTJ 23 in the process for manufacturing a wafer, and thus the write failure or the holding failure is generated in the MTJ 23, the possibility that the redundant relief can be carried out becomes high by using the MTJ 24 different in diameter size from the MTJ 23. As a result, the yield can be further enhanced.

It should be noted that in the foregoing, the description has been given with respect to the configuration in which one MTJ 24 for redundant relief is provided for one MTJ 23 connected to the storage node of the volatile logic circuit 21.

However, a plurality of MTJs 24 for redundant relief may be provided for one MTJ 23 connected to the storage node of the volatile logic circuit 21.

In such a case, the diameter sizes of a plurality of MTJs 24 provided for one MTJ 23 may be identical to one another or may be different from one another. A plurality of MTJs 24 provided for one MTJ 23 may include the MTJ 24 identical in diameter size to the MTJ 23, and the MTJ 24 different in diameter size from the MTJ 23. In addition, the MTJs 24 having three or more kinds of diameter sizes different from one another may also be provided for one MTJ 23.

Moreover, in the semiconductor device 11, the MTJ 23 and the MTJ 24 may be formed in the same wiring layer, or the MTJ 23 and the MTJ 24 may be formed in the wiring layers different from one another.

For example, in the case where the MTJ 23 and the MTJ 24 are formed in the same wiring layer, the manufacturing cost of the semiconductor device 11 can be kept low. In addition, in the case where the MTJ 23 and the MTJ 24 are formed in the wiring layers different from one another, since these MTJs can be arranged side by side in a direction of lamination of the wiring layers, the semiconductor device 11 can be miniaturized.

Second Embodiment

<Increase in Circuit Area>

Now, how the power consumption is suppressed is important in a mobile product and a wearable product including a smartphone. An LSI (Large-Scale Integration) such as a processor for controlling these products attributes to the large power consumption.

Then, a technique called PG (power gating) is known as one means for suppressing the power consumption of the LSI. A technique for stopping the supply of the power source to a block which is not operated of circuit blocks of the LSI, thereby suppressing the power consumption is known as the PG.

In addition, the power source supply control in units of smaller granularity, that is, in the units of smaller blocks, and in the units of shorter time is effective for suppressing the power consumption of the LSI. A technique which is capable of putting into practice at a flip flop level using a pair of non-volatile elements is also proposed as such a PG technique. For example, an example using the non-volatile element includes an example using a ferroelectric substance, an example using a resistance variable element, and an example using a magnetic material such as an MRAM.

Moreover, a technology for adopting a circuit configuration using an MTJ as the non-volatile element is also proposed (for example, refer to WO2009/028298). This proposal adopts a configuration in which an NVPG circuit is added to an SRAM circuit configuration, or a flip flop circuit configuration.

However, since the MTJ including the magnetic material is low in heat resistance, it is necessary to adopt a configuration with which thermal budget in a process of BEOL (Back End Of Line) including a Cu wiring, that is, a wiring forming process is avoided. Thus, normally, the MTJ is formed on the wiring in the vicinity of the uppermost layer.

Therefore, for electrically connecting the transistor and the MTJ to each other, it is necessary to draw the wiring from the contact of the transistor up to the upper layer wiring layer by using the via and the wiring. However, if such a structure is adopted, another wiring cannot be passed through a portion of the via and the wiring for the wiring drawing. As a result, due to the routing of the wiring, the circuit area is increased.

Figure 4:
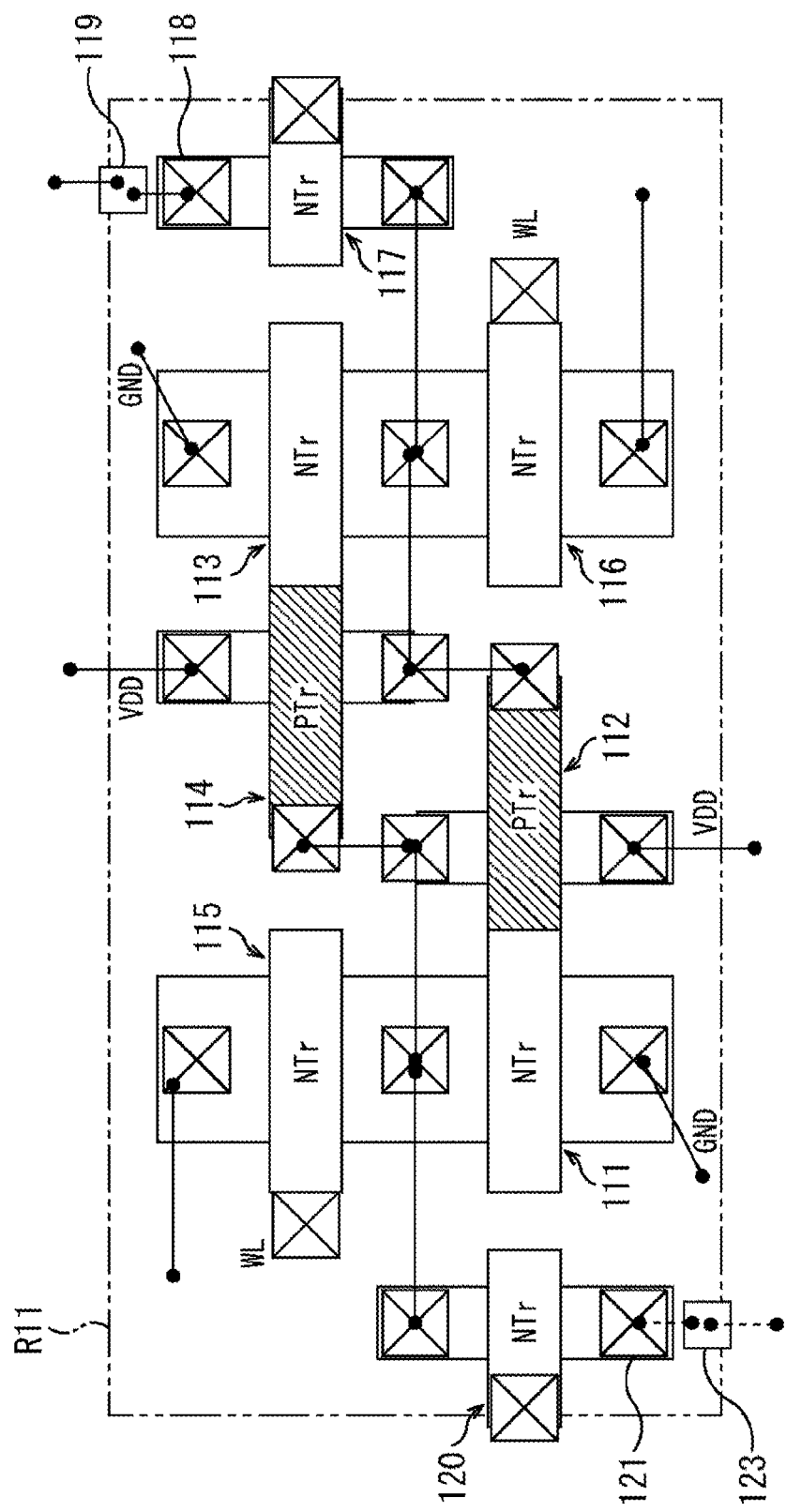
FIG. 4 is a view explaining connection of the MTJ to an SRAM.

Let us consider a configuration in which, for example, as depicted in FIG. 4, the MTJ is added to the SRAM through the transistor.

In FIG. 4, a region R11 exhibits a region of a cell of an SRAM, and a transistor 111 to a transistor 116 configuring the SRAM are provided in the region R11.

Here, the transistor 111, the transistor 113, the transistor 115, and the transistor 116 are each an nMOS transistor, and the transistor 112 and the transistor 114 are each a pMOS transistor. In addition, a bi-stable circuit is configured by an inverter including the transistor 111 and the transistor 112, and an inverter including the transistor 113 and the transistor 114.

Moreover, in the region R11, the MTJ 119 is connected to the transistor 113 and the transistor 116 through the transistor 117 and a contact 118. Likewise, an MTJ 123 is connected to the transistor 111 and the transistor 115 through a transistor 120 and a contact 121.

Figure 5:
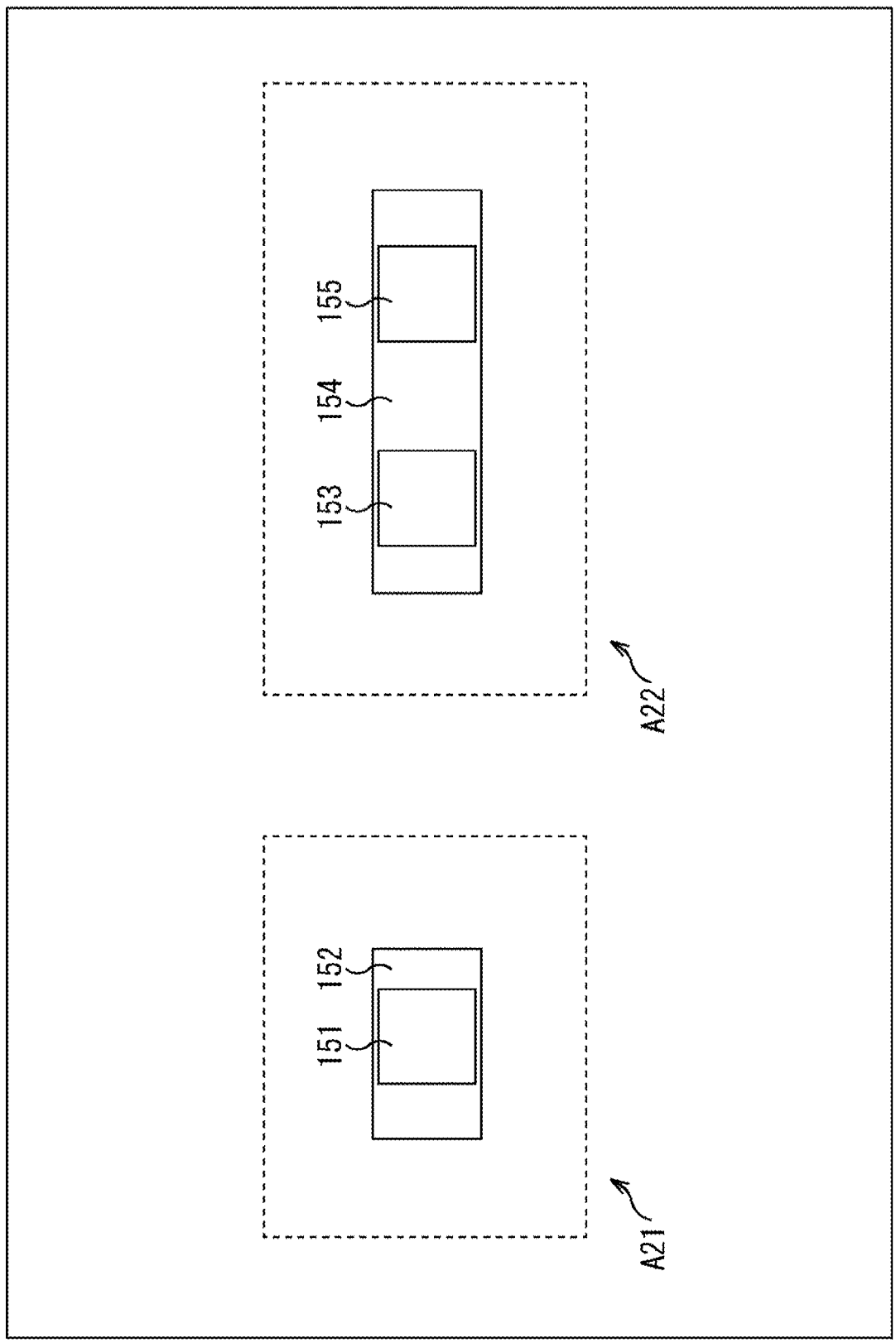
FIG. 5 is a view explaining a stack via.

In the case where such a layout is adopted, it is considered that, for example, as indicated by an arrow A21 of FIG. 5, a contact 118 and an MTJ 119 depicted in FIG. 4 are electrically connected to each other by a simple stack via obtained by alternately laminating a via 151 and a wiring 152.

In addition, the simple stack via cannot be provided in some cases. In such cases, the contact 118 and the MTJ 119 depicted in FIG. 4 shall be electrically connected to each other by a stack via obtained by laminating a via 153, a wiring 154, a via 155, and another wiring (not depicted) in order, for example, as depicted by an arrow A22.

In the stack via indicated by the arrow A22, the via provided between the wirings is alternately arranged in a position of a via 153 and in a position of a via 155.

Figure 6:
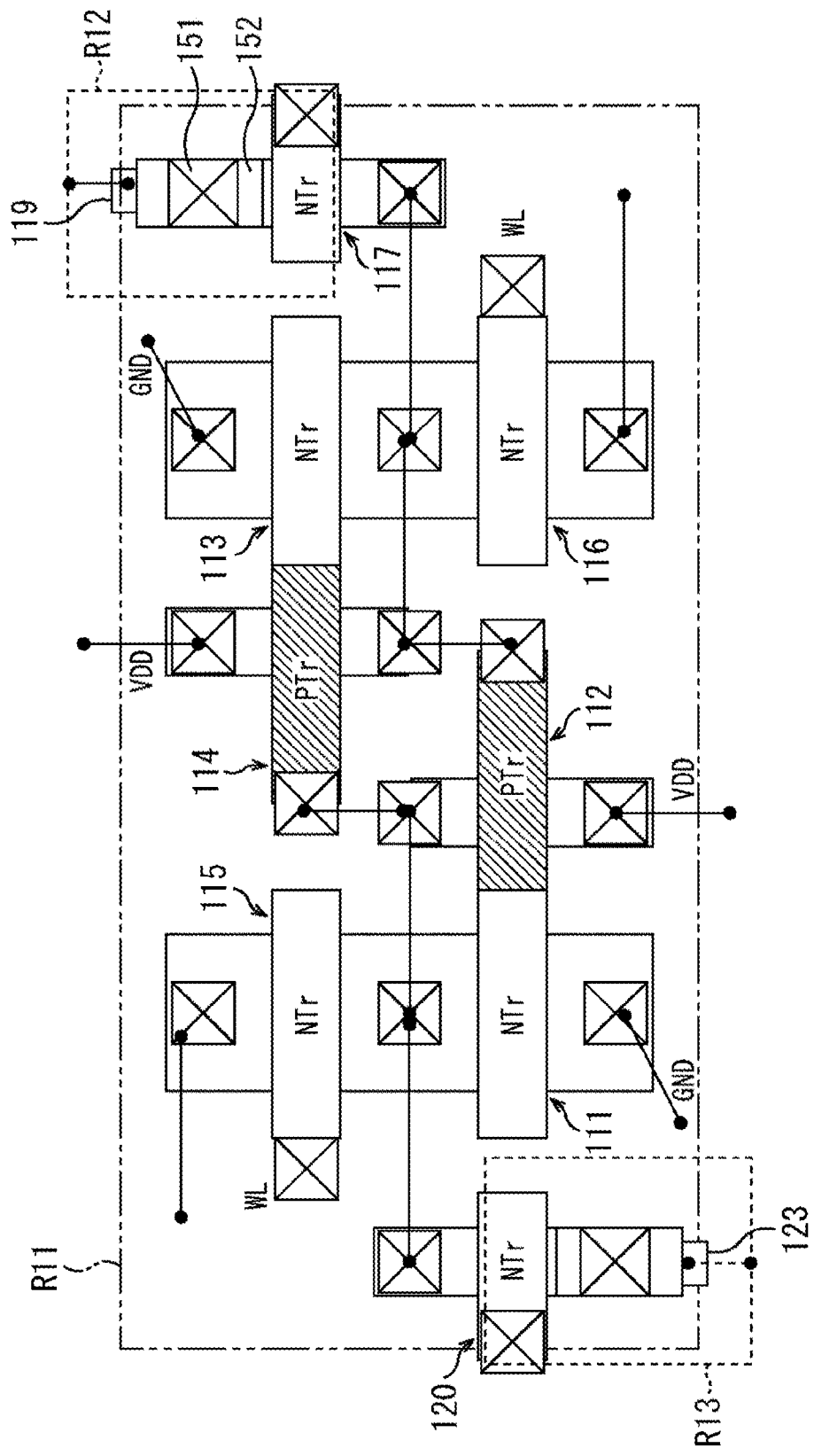
FIG. 6 is a view explaining an increase in circuit area.

In the case where the bi-stable circuit of the SRAM, and the MTJ 119 are connected to each other by the stack via in such a way, other wiring cannot be provided in a portion of the stack via, and a portion of the vicinity thereof. Specifically, in the case where the simple stack via is used, for example, as depicted in FIG. 6, the wiring cannot be provided in a portion of the region R12 near the via 151. It should be noted that in FIG. 6, portions corresponding to those in the case of FIG. 4 or FIG. 5 are assigned the same reference signs, and a description thereof is suitably omitted herein.

In FIG. 6, in the figure of the contact 118, since the simple stack via including the via 151 and the wiring 152 is provided on this side, other wiring cannot be provided in the region R12 in the periphery of the simple stack via. Likewise, in the figure of the contact 121, since the simple stack via including the via and the wiring is provided on this side, other wiring cannot be provided in the region R13 in the periphery of the simple stack via.

Figure 7:
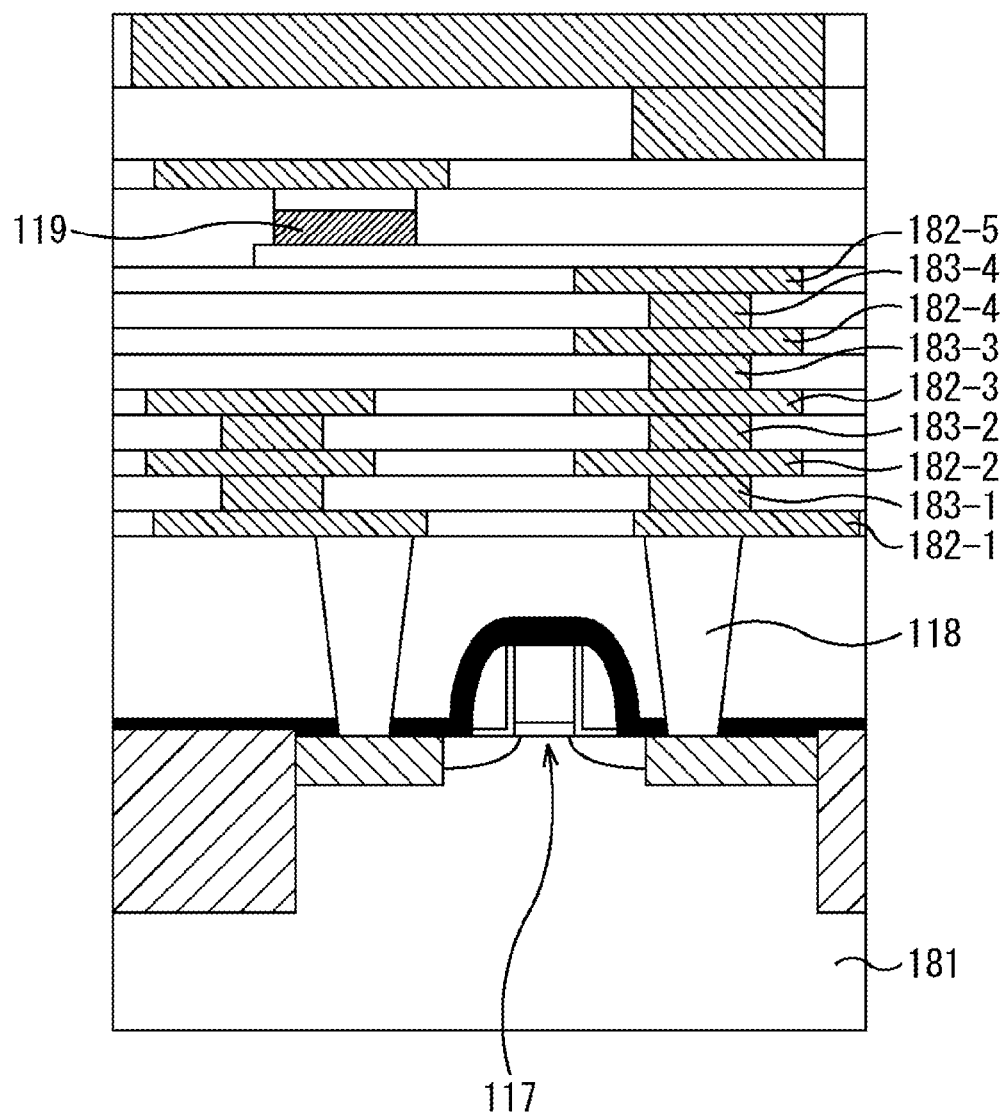
FIG. 7 is a view explaining an increase in circuit area.

More specifically, it is assumed that, for example, as depicted by FIG. 7, the transistor 117 is provided in the principal surface side of a predetermined substrate 181, in a word, on the surface side, and the MTJ 119 is provided in the upper layer above the layer in which the transistor 117 is provided. It should be noted that in FIG. 7, portions corresponding to those in the case of FIG. 4 are assigned the same reference signs, and a description thereof is suitably omitted herein.

FIG. 7 depicts a cross-sectional view of a portion in the vicinity of the transistor 117 depicted in FIG. 4.

In this example, the contact 118 is connected to a diffusion region of the transistor 117 provided on the principal surface side of the substrate 181. In addition, the MTJ 119 is connected to the contact 118 through a stack via including a wiring 182-1 to a wiring 182-5, and a via 183-1 to a via 183-4.

It should be noted that hereinafter, in the case where the wiring 182-1 to the wiring 182-5 do not need to be especially distinguished from one another, the wiring 182-1 to the wiring 182-5 are simply referred to as the wiring 182 as well, and in the case where the via 183-1 to the via 183-4 do not need to be especially distinguished from one another, the via 183-1 to the via 183-4 are simply referred to as the via 183 as well.

In this example, the stack via is configured by alternately laminating the wiring 182 and the via 183, and a connection portion with the transistor 117 is drawn up to the higher layer by the contact 118 and the stack via. Therefore, other wiring cannot be provided in a portion of the stack via of the layer between the contact 118 and the MTJ 119.

In the case where the NVPG is carried out by connecting the MTJ to the volatile circuit such as an SRAM through the transistor in the manner described above, the MTJ needs to be provided in the wiring layer in the vicinity of the uppermost layer due to the low heat resistance of the MTJ. In this case, if, for example, as depicted in FIG. 6, the bi-stable circuit of the SRAM, and the MTJ are connected to each other by the stack via, then, since a partial region within the region R11 of the cell is used for the stack via, the area of the region R11 of the cell is increased. In particular, in the case where the stack via having the structure indicated by the arrow A22 of FIG. 5 is used, the area of the region R11 of the cell is further increased than the case where the simple stack via is used.

Then, in the present technology, even in the case where the NVPG is carried out, the more compact semiconductor device is enabled to be obtained.

<Example of Configuration of Semiconductor Device>

Hereinafter, the present technology will be more concretely described.

Figure 8:
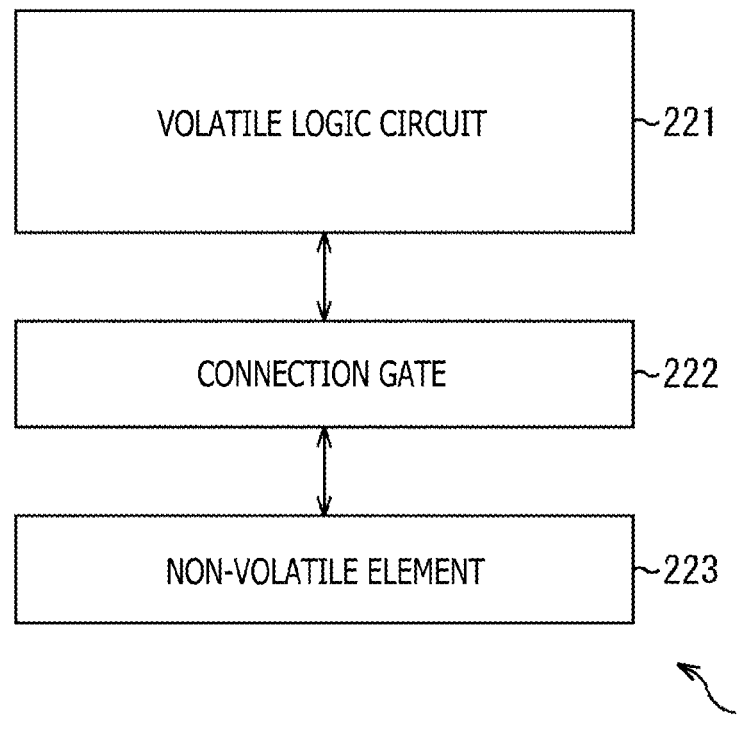
FIG. 8 is a diagram depicting an example of a configuration of a semiconductor device.

For example, a semiconductor device to which the present technology is applied is configured as depicted in FIG. 8.

A semiconductor device 211 depicted in FIG. 8 has a volatile logic circuit 221, a connection gate 222, and a non-volatile element 223.

The volatile logic circuit 221 is a volatile storage element which, for example, includes a cell of an SRAM, a flip flop circuit or the like, and becomes a target of the PG. The non-volatile element 223 is connected to a storage node of a bi-stable circuit configuring the cell of the SRAM or the flip flop circuit as the volatile logic circuit 221 through the connection gate 222.

The connection gate 222, for example, includes a transistor, and is turned ON or turned OFF in accordance with control made from the outside, thereby electrically connecting the volatile logic circuit 221 and the non-volatile element 223 to each other, or electrically disconnecting the volatile logic circuit 221 and the non-volatile element 223 from each other.

The non-volatile element 223, for example, includes a current write type MTJ, a ReRAM (Resistance Random Access Memory) element (resistance variable memory) or the like. The non-volatile element 223 stores the information held in the storage node of the volatile logic circuit 221 or restores the stored information in the storage node of the volatile logic circuit 221.

The semiconductor device 211 includes such a volatile logic circuit 221, a connection gate 222, and a non-volatile element 223, and has one or a plurality of non-volatile logic circuits each becoming the target of the NVPG.

Next, a description will be given with respect to an example of a more concrete configuration of the semiconductor device 211.

Figure 9:
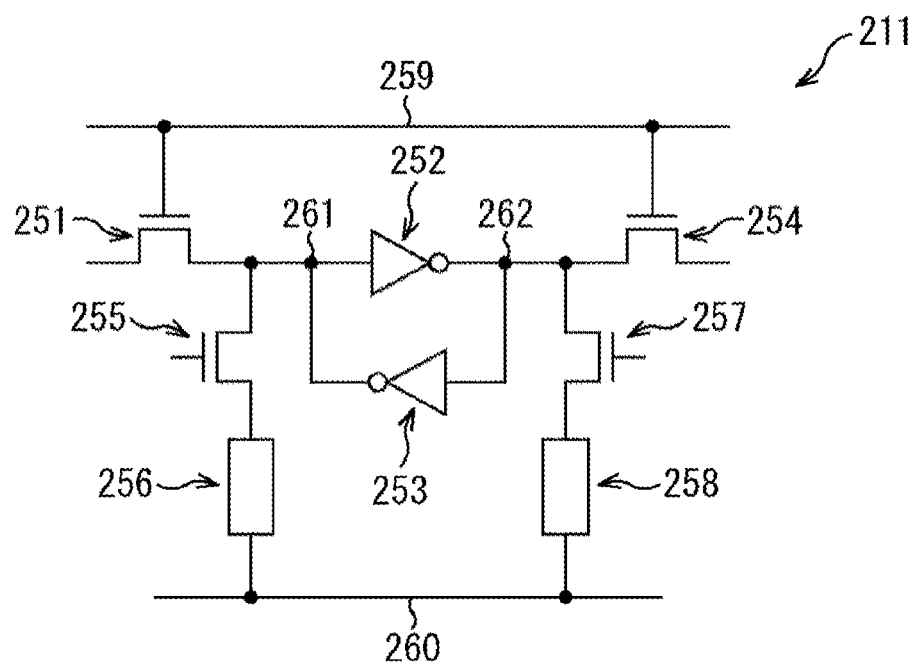
FIG. 9 is a diagram depicting an example of a more concrete configuration of the semiconductor device.

For example, more specifically, the semiconductor device 211 has a configuration depicted in FIG. 9.

The semiconductor device 211 depicted in FIG. 9 has a transistor 251, an inverter 252, an inverter 253, a transistor 254, a selection transistor 255, an MTJ 256, a selection transistor 257, and an MTJ 258.

In this example, a cell of an SRAM including the transistor 251 to the transistor 254 corresponds to the volatile logic circuit 221. The selection transistor 255 and the selection transistor 257 correspond to the connection gate 222. In addition, the MTJ 256 and the MTJ 258 correspond to the non-volatile element 223.

In the semiconductor device 211, a control line 259 as a word line used to control the transistor 251 and the transistor 254 is connected to each of gate electrodes of the transistor 251 and the transistor 254. Further, a control line 260 used to control the MTJ 256 and the MTJ 258 is connected to an end, on a side opposite to an end to which the selection transistor 255 is connected, of the MTJ 256, and an end, on a side opposite to an end to which the selection transistor 257 is connected, of the MTJ 258.

Here, ends on the control line 260 side of the MTJ 256 and the MTJ 258 become a free layer, and ends on the side opposite to the control line 260 side of the MTJ 256 and the MTJ 258 become a pin layer.

In the semiconductor device 211, the MTJ 256 and the storage node 261 are electrically connected to each other by turning ON the selection transistor 255, and the MTJ 258 and the storage node 262 are electrically connected to each other by turning ON the selection transistor 257.

Moreover, in the semiconductor device 211, a bi-stable circuit includes the inverter 252 and the inverter 253. A portion to which the transistor 251, an input terminal of the inverter 252, an output terminal of the inverter 253, and the selection transistor 255 are connected becomes the storage node 261. In addition, a portion to which the transistor 254, an output terminal of the inverter 252, an input terminal of the inverter 253, and the selection transistor 257 are connected becomes the storage node 262.

The transistors 251 to the MTJ 258 correspond to the transistor 31, the inverter 32, the inverter 33, the transistor 34, the transistor 22, the MTJ 23-1, the transistor 25, and the MTJ 23-2 depicted in FIG. 1, respectively.

In addition, the storage node 261 and the storage node 262 correspond to the storage node 35 and the storage node 36 of FIG. 1, respectively, and the control line 260 corresponds to the control line 26-1 of FIG. 1.

In the semiconductor device 211, at the time of the storage, the information held in the storage node 261 is stored in the MTJ 256 through the selection transistor 255, and the information held in the storage node 262 is stored in the MTJ 258 through the selection transistor 257.

Moreover, at the time of the restorage, the information held in the MTJ 256 is restored in the storage node 261 through the selection transistor 255, and the information held in the MTJ 258 is restored in the storage node 262 through the selection transistor 257.

It should be noted that since the configuration and operation of the semiconductor device 211 are similar to the configuration and operation of the semiconductor device 11 depicted in FIG. 1, a detailed description thereof is omitted herein.

<Example of Layout of Transistors>

Figure 10:
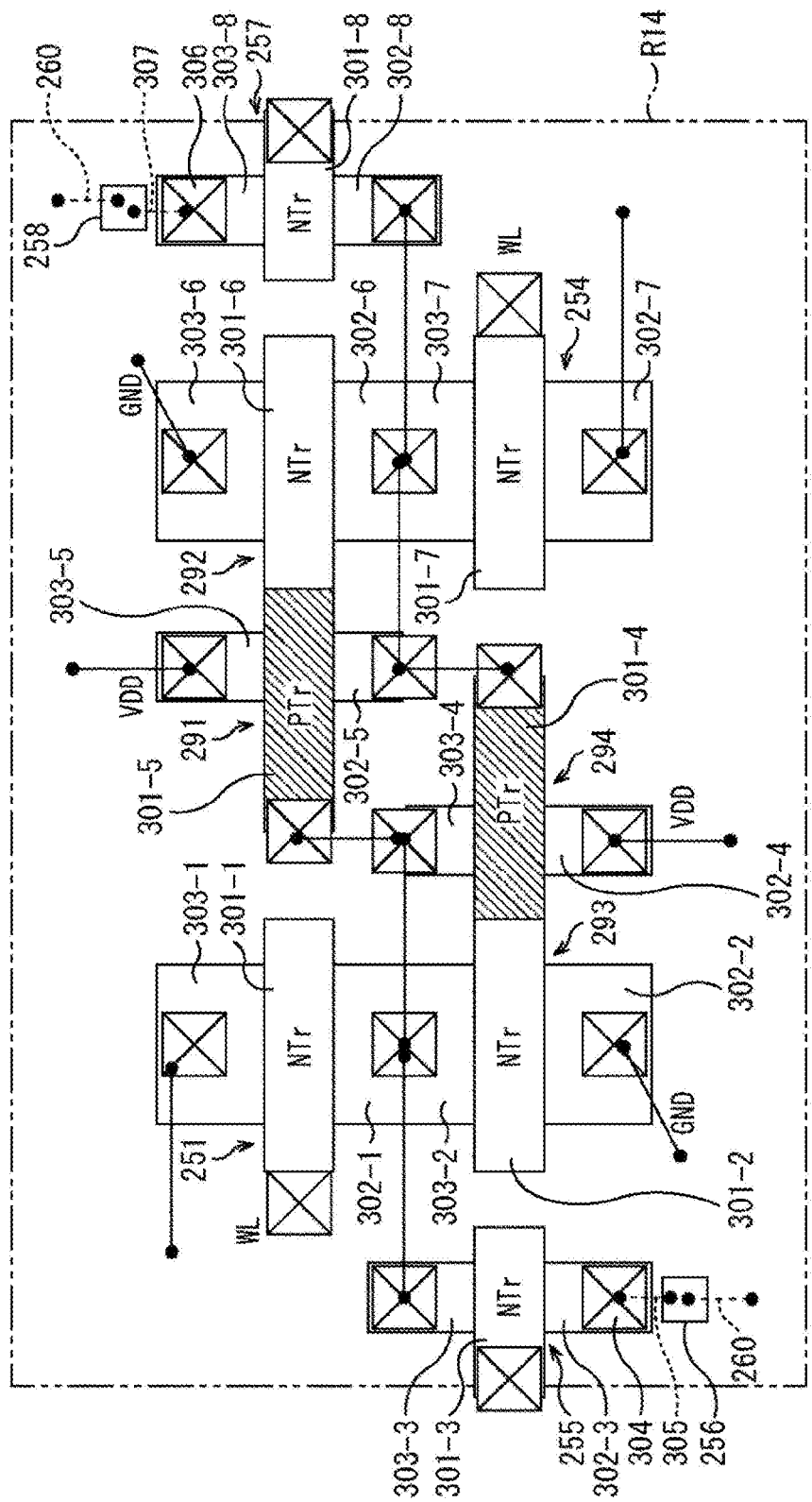
FIG. 10 is a view depicting an example of arrangement of transistors.

In addition, the transistors of the semiconductor device 211 depicted in FIG. 9, for example, are arranged in a layout depicted in FIG. 10. It should be noted that in FIG. 10, portions corresponding to those in the case of FIG. 9 are assigned the same reference signs, and a description thereof is suitably omitted herein.

FIG. 10 depicts arrangement of the transistors provided on the principal surface side of a semiconductor substrate configuring the semiconductor device 211.

In this example, the transistors and MTJs configuring the semiconductor device 211 are arranged within a region R14 of the cell of the SRAM. In particular, a transistor 251, a transistor 291, a transistor 292, a selection transistor 257, a selection transistor 255, a transistor 293, a transistor 294, and a transistor 254 are arranged on the principal surface side of the semiconductor substrate.

Here, the transistor 251, the transistor 292, the selection transistor 257, the selection transistor 255, the transistor 293, and the transistor 254 are each an nMOS transistor, and the transistor 291 and the transistor 294 are each a pMOS transistor.

Therefore, a portion in which the transistor 251, the transistor 293, and the selection transistor 255 are provided in the semiconductor substrate is a p-type well region, and a portion in which the transistor 291 and the transistor 294 are provided in the semiconductor substrate is an n-type well region. Likewise, a portion in which the transistor 292, the transistor 254, and the selection transistor 257 are provided in the semiconductor substrate is the p-type well region.

In the semiconductor device 211, the inverter 252 depicted in FIG. 9 includes the transistor 291 and the transistor 292, and the inverter 253 depicted in FIG. 9 includes the transistor 293 and the transistor 294.

The transistor 251 has a gate electrode 301-1, and a diffusion region 302-1 and a diffusion region 303-1 becoming a source region or a drain region.

In addition, the transistor 293 has a gate electrode 301-2, and a diffusion region 302-2 and a diffusion region 303-2 becoming a source region or a drain region. The diffusion region 303-2 is connected to the diffusion region 302-1 of the transistor 251.

The selection transistor 255 has a gate electrode 301-3, and a diffusion region 302-3 and a diffusion region 303-3 becoming a source region or a drain region. The diffusion region 303-3 is connected to the diffusion region 302-1 of the transistor 251 and the diffusion region 303-2 of the transistor 293.

Further, a contact 304 through which the principal surface (front surface) side and the back surface side of the semiconductor substrate are connected to each other is connected to the diffusion region 302-3 of the selection transistor 255. The selection transistor 255 provided on the principal surface side of the semiconductor substrate and the MTJ 256 provided on the back surface side of the semiconductor substrate are connected to each other through the contact 304. Here, a wiring 305 through which the contact 304 and the MTJ 256 are connected to each other, and a control line 260 connected to the MTJ 256 are provided on the back surface side of the semiconductor substrate.

The transistor 294 has a gate electrode 301-4, and a diffusion region 302-4 and a diffusion region 303-4 becoming a source region or a drain region. Likewise, the transistor 291 has a gate electrode 301-5, and a diffusion region 302-5 and a diffusion region 303-5 becoming a source region or a drain region.

In this example, the diffusion region 303-4 of the transistor 294, and the gate electrode 301-5 of the transistor 291 are connected to the diffusion region 302-1 of the transistor 251 and the diffusion region 303-2 of the transistor 293 through the wirings. In addition, the gate electrode 301-4 of the transistor 294 and the diffusion region 302-5 of the transistor 291 are connected to each other through the wiring.

The transistor 292 has a gate electrode 301-6, and a diffusion region 302-6 and a diffusion region 303-6 becoming a source region or a drain region. The transistor 254 has a gate electrode 301-7, and a diffusion region 302-7 and a diffusion region 303-7 becoming a source region or a drain region.

Moreover, the selection transistor 257 has a gate electrode 301-8, and a diffusion region 302-8 and a diffusion region 303-8 becoming a source region or a drain region.

The diffusion region 302-6 of the transistor 292, the diffusion region 303-7 of the transistor 254, and the diffusion region 302-8 of the selection transistor 257 are connected to the diffusion region 302-5 of the transistor 291 through the wirings.

In addition, the contact 306 through which the principal surface (front surface) side and the back surface side of the semiconductor substrate are electrically connected to each other is connected to the diffusion region 303-8 of the selection transistor 257. The selection transistor 257 provided on the principal surface side of the semiconductor substrate, and the MTJ 258 provided on the back surface side of the semiconductor substrate are connected to each other through the contact 306. Here, a wiring 307 through which the contact 306 and the MTJ 258 are connected to each other, and a control line 260 connected to the MTJ 258 are provided on the back surface side of the semiconductor substrate.

On the other hand, a wiring connected to the diffusion region 303-1 of the transistor 251, and a wiring connected to the diffusion region 302-7 of the transistor 254 are arranged in the wiring layer on the principal surface side of the semiconductor substrate.

It should be noted that hereinafter, in the case where the gate electrode 301-1 to the gate electrode 301-8 do not need to be especially distinguished from one another, the gate electrode 301-1 to the gate electrode 301-8 are simply referred to as the gate electrode 301 as well. In addition, in the case where the diffusion region 302-1 to the diffusion region 302-8 do not need to be especially distinguished from one another, the diffusion region 302-1 to the diffusion region 302-8 shall be simply referred to as the diffusion region 302 as well, and in the case where the diffusion region 303-1 to the diffusion region 303-8 do not need to be especially distinguished from one another, the diffusion region 303-1 to the diffusion region 303-8 shall be simply referred to as the diffusion region 303 as well.

In the semiconductor device 211, the gate electrodes 301 of the transistors are arranged side by side so as to be parallel to one another in a linear fashion.

That is to say, for example, the transistor 251, the transistor 291, the transistor 292, and the selection transistor 257 are arranged in such a way that the gate electrodes 301 of these transistors are directed in a transverse direction in the figure, and are arranged side by side on one straight line. In this example, the transistors are arranged in such a way that the longer direction of the gate electrode 301 becomes the transverse direction in the figure, in a word, the diffusion region 302 and the diffusion region 303 of the transistor is arranged side by side in the longitudinal direction in the figure. In other words, the transistors are arranged in such a way that the gate electrodes 301 of the transistors become parallel to one another.

Likewise, the transistor 254, the transistor 294, the transistor 293, and the selection transistor 255 are arranged in such a way that the gate electrodes 301 of these transistors are directed in a transverse direction in the figure, and are arranged side by side on one straight line. In the semiconductor device 211, the gate electrodes 301 of the transistors are arranged so as to be parallel to one another, in a word, the gate electrodes 301 of the transistors are arranged so as to be directed in the same direction.

In addition, within the region in which the transistors are arranged, the two selection transistors: the selection transistor 255; and the selection transistor 257 are arranged in the diagonal positions opposing to each other. In this example, the selection transistor 255 is arranged in the bottom left position in the figure, and the selection transistor 257 is arranged in the top right position in the figure.

That is to say, the selection transistor 255 and the selection transistor 257 are arranged in the diagonal positions opposing to each other and adjacent to the region in which the transistor 251, the transistor 291 to the transistor 294, and the transistor 254 are provided.

In such a way, the transistors are arranged (layout) in such a way that the gate electrodes 301 of the transistors are arranged side by side in a linear fashion, whereby the processing at the time of manufacture of the semiconductor device 211, especially, at the time of formation of the transistor can be readily carried out. Moreover, the area of the portion in which the transistors are arranged can be reduced, and the miniaturization of the semiconductor device 211 can be realized.

Furthermore, as described above, in the semiconductor device 211, the transistors are formed on the principal surface side of the semiconductor substrate configuring the semiconductor device 211, whereas the MTJ 256 and the MTJ 258 are formed on the back surface side of the semiconductor substrate.

Figure 11:
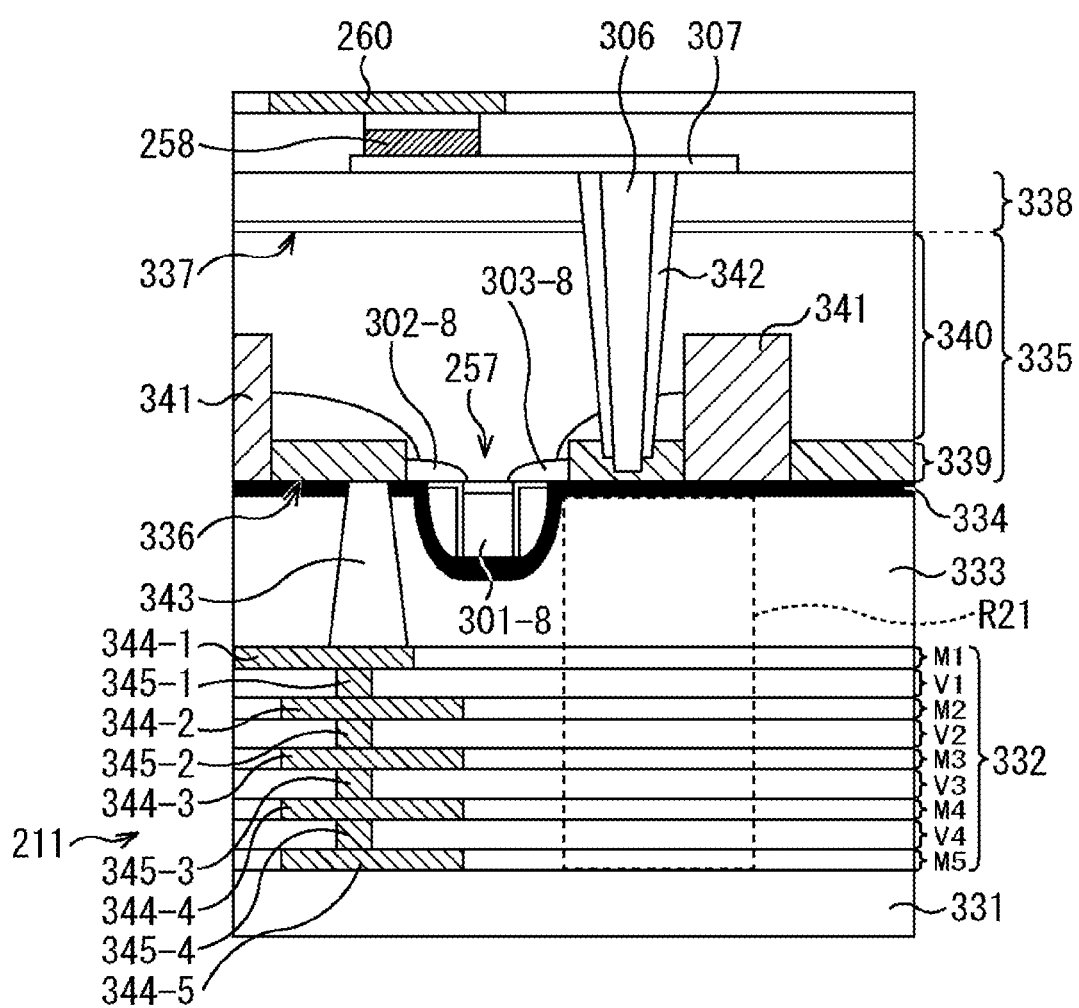
FIG. 11 is a view explaining a cross section of the semiconductor device.

Specifically, a cross section of the semiconductor device 211 in the MTJ 258 portion, for example, becomes one as depicted in FIG. 11. It should be noted that in FIG. 11, portions corresponding to those in the case of FIG. 10 are assigned the same reference signs, and a description thereof is suitably omitted herein.

In the semiconductor device 211 depicted in FIG. 11, a multi-layer interconnection forming portion 332, an interlayer insulating layer 333, an interlayer insulating layer 334, and a semiconductor substrate 335 are laminated in order on a supporting substrate 331.

In this example, the selection transistor 257 is provided on a principal surface 336 side as a front surface of the semiconductor substrate 335, and the MTJ 258 is provided on a back surface 337 on a side opposite to the principal surface 336 of the semiconductor substrate 335 through an insulating layer 338.

The semiconductor substrate 335 includes a semiconductor layer 339, and a semiconductor layer 340 including the p-type well and the n-type well. An element isolation layer 341 formed by STI (Shallow Trench Isolation) is provided in these semiconductor layer portions so as to surround the region in which, for example, the selection transistor 257 is provided. The element isolation layer 341, for example, is an insulating film including a silicon oxide film ($SiO_2$).

In addition, a contact 306 which extends completely through the semiconductor substrate 335 and the insulating layer 338 is provided in a portion adjacent to the diffusion region 303-8 in the semiconductor layer 339 of the semiconductor substrate 335. The contact 306, for example, includes a metal such as copper (Cu) or tungsten (W), and the periphery thereof is covered with an insulating film 342.

The selection transistor 257 is formed on the principal surface 336 side of the semiconductor substrate 335. That is to say, the gate electrode 301-8 of the selection transistor 257 is formed on the principal surface 336 side of the semiconductor substrate 335, and the diffusion region 302-8 and the diffusion region 303-8 of the selection transistor 257 are formed in the semiconductor layer 339 of the semiconductor substrate 335.

In addition, the diffusion region 303-8 is connected to the contact 306, and the diffusion region 302-8 is connected to a contact 343 provided in the interlayer insulating layer 333. The contact 343 extends completely through the interlayer insulating layer 333 to be connected to the wiring within the multi-layer interconnection forming portion 332. The contact 343 connected to the diffusion region 302-8, or the wiring within the multi-layer interconnection forming portion 332 corresponds to the storage node 262.

The multi-layer interconnection forming portion 332 includes a plurality of layers, and these layers are a wiring layer M1, a wiring layer V1, a wiring layer M2, a wiring layer V2, a wiring layer M3, a wiring layer V3, a wiring layer M4, a wiring layer V4, and a wiring layer M5 in order from the interlayer insulating layer 333 side.

A wiring 344-1 to a wiring 344-5 each including Cu or the like are formed in the wiring layer M1 to the wiring layer M5, respectively. A via 345-1 to a via 345-4 extending completely through the wiring layer V1 to the wiring layer V4 are formed in the wiring layer V1 to the wiring layer V4, respectively.

It should be noted that hereinafter, in the case where the wiring 344-1 to the wiring 344-5 do not need to be especially distinguished from one another, the wiring 344-1 to the wiring 344-5 shall be simply referred to as the wiring 344 as well, and in the case where the via 345-1 to the via 345-4 do not need to be especially distinguished from one another, the via 345-1 to the via 345-4 shall be simply referred to as the via 345 as well.

In the multi-layer interconnection forming portion 332, the wiring 344 and the via 345 are alternately laminated from the wiring layer M1 to the wiring layer M5, and the wiring 344-1 of the wiring layer M1 is connected to the contact 343.

In addition, the wiring layer 307 is formed on the surface on the side opposite to the semiconductor substrate 335 side in the insulating layer 338 provided on the back surface 337 side of the semiconductor substrate 335. The contact 306 is connected to one end of the wiring 307, and the MTJ 258 is connected to the other end of the wiring 307. Moreover, the control line 260 is connected to the MTJ 258.

As described above, in the semiconductor device 211, the various kinds of transistors such as the selection transistors 257, and the wirings are formed on the principal surface 336 side of the semiconductor substrate 335. The MTJ 258 and the MTJ 256, and the control line 260 are formed on the back surface 337 side of the semiconductor substrate 335.

That is to say, the MTJ 258 or the MTJ 256 as the non-volatile element 223 is drawn from the principal surface 336 side on which the transistors are formed in the semiconductor substrate 335 to the back surface 337 side opposite to the principal surface 336 in the semiconductor substrate 335 by the contact 306 or the like.

For example, in this example, the selection transistor 257 and the MTJ 258 are electrically connected to each other through the contact 306 extending completely through the semiconductor substrate 335, and the wiring 307 formed on the back surface 337 side of the semiconductor substrate 335.

By adopting such a configuration, the MTJ such as the MTJ 258 can be formed approximately in the final process of the manufacturing process for the semiconductor device 211. As a result, the addition of the temperature to the MTJ during the process for forming the multi-layer interconnection in the multi-layer interconnection forming portion 332 or the like can be reduced, and thus the characteristics deterioration of the MTJ can be prevented from being caused. As a result, the yield of the semiconductor device 211 can also be enhanced.

Moreover, the MTJ such as the MTJ 258 is arranged on the back surface 337 side of the semiconductor substrate 335. As a result, the wiring configuring the normal circuit can be freely routed on the principal surface 336 side of the semiconductor substrate 335, and thus the increase in circuit area can be suppressed.

If, for example, the MTJ 258 is desired to be formed in the multi-layer interconnection forming portion 332, the MTJ 258 itself, and a stack via through which the MTJ 258 and the diffusion region 303-8 are connected to each other are formed in a portion of a region R21. Therefore, other wiring cannot be provided in the portion of the region R21. As a result, the semiconductor device 211 is increased in size by the size of the region R21.

On the other hand, in the semiconductor device 211, the MTJ 258 and the like are arranged on the back surface 337 side of the semiconductor substrate 335. Therefore, an arbitrary wiring can be provided in the portion of the region R21, and thus the miniaturization of the semiconductor device 211 can be realized. In a word, the more compact semiconductor device 211 can be obtained.

<Manufacturing Process Flow for Semiconductor Device>

Subsequently, a description will be given with respect to a manufacturing process flow for the semiconductor device 211 as has been described so far with reference to FIG. 12 to FIG. 19. It should be noted that in FIG. 12 to FIG. 19, portions corresponding to those in the case of FIG. 10 or FIG. 11 are assigned the same reference signs, and a description thereof is suitably omitted herein.

Figure 12:
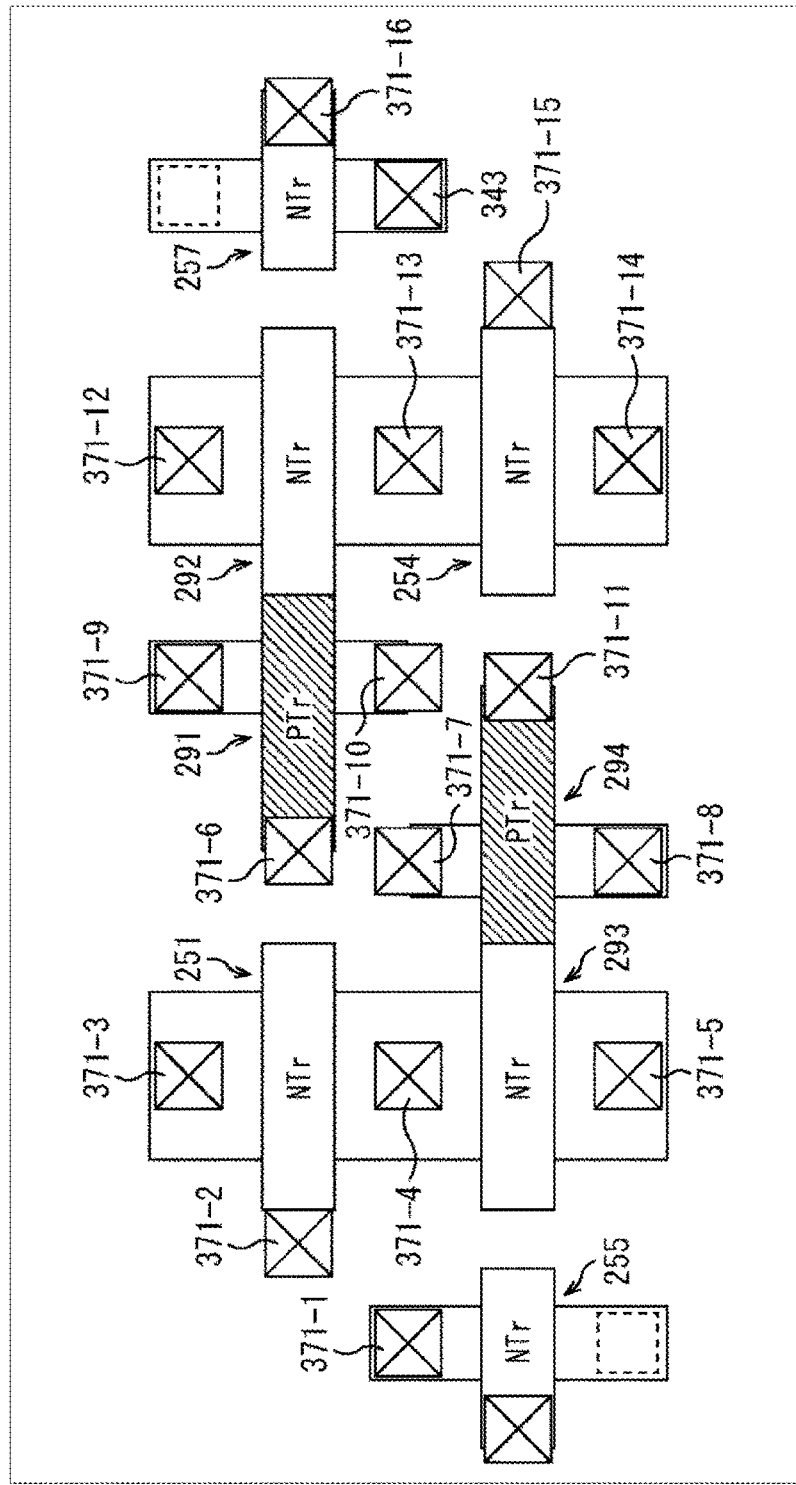
FIG. 12 is a view explaining a manufacturing process of the semiconductor device.

Firstly, in a state in which the transistor 251, the transistor 291, the transistor 292, the selection transistor 257, the selection transistor 255, the transistor 293, the transistor 294, and the transistor 254 are provided on the principal surface 336 side of the semiconductor substrate 335, as depicted in FIG. 12, the contacts are formed in the interlayer insulating layer 333.

In the example depicted in FIG. 12, a contact 371-1 to a contact 371-16, and the contact 343 are formed. For example, the contact 343 is formed on the diffusion region 302-8 of the selection transistor 257. In addition, for example, the contact 371-13 is formed in a connection portion between the diffusion region 302-6 of the transistor 292 and the diffusion region 303-7 of the transistor 254.

It should be noted that in this state, the MTJ 258, the MTJ 256, the contact 306, and the like are not yet formed.

Hereinafter, in the case where the contact 371-1 to the contact 371-16 do not need to be especially distinguished from one another, the contact 371-1 to the contact 371-16 shall be simply referred to as the contact 371 as well.

Figure 13:
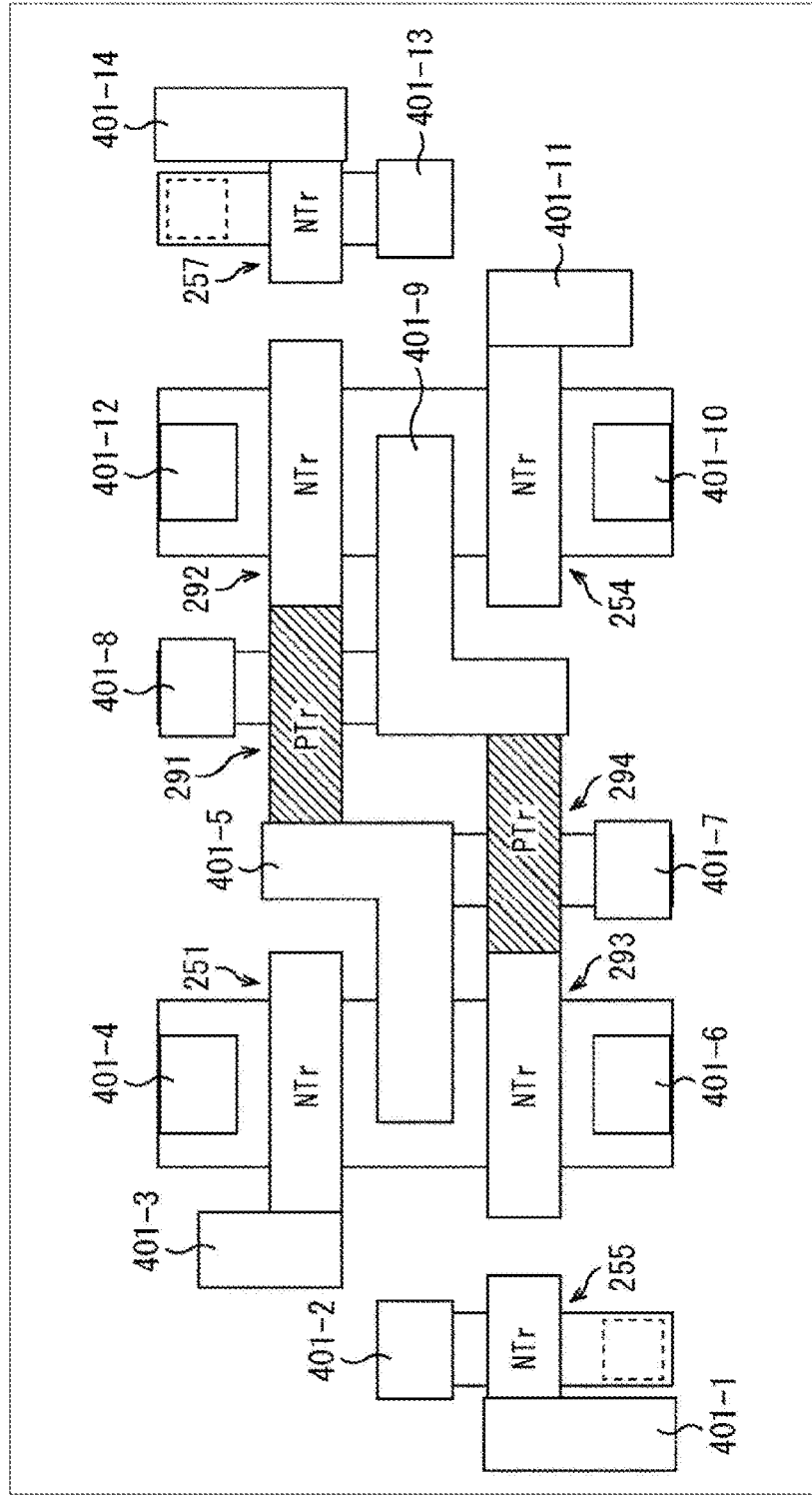
FIG. 13 is a view explaining a manufacturing process of the semiconductor device.

Subsequently, for example, as depicted in FIG. 13, a wiring 401-1 to a wiring 401-14 are formed in the portions of the contact 371 and the contact 343 in the wiring layer M1.

For example, in this example, the wiring 401-9 through which the contact 371-10, the contact 371-11, and the contact 371-13 depicted in FIG. 12 are connected to one another is formed.

In addition, the wiring 401-14 is formed in the portion of the contact 371-16. Since in the semiconductor device 211, the MTJ 258 is not formed on the principal surface 336 side of the semiconductor substrate 335, the wiring can be freely arranged in the portion or the like of the vicinity of the contact 371-16.

It should be noted that hereinafter, in the case where the wiring 401-1 to the wiring 401-14 do not need to be especially distinguished from one another, the wiring 401-1 to the wiring 401-14 shall be simply referred to as the wiring 401 as well. The wiring 401-13 depicted in FIG. 13, for example, corresponds to the wiring 344-1 depicted in FIG. 11.

Figure 14:
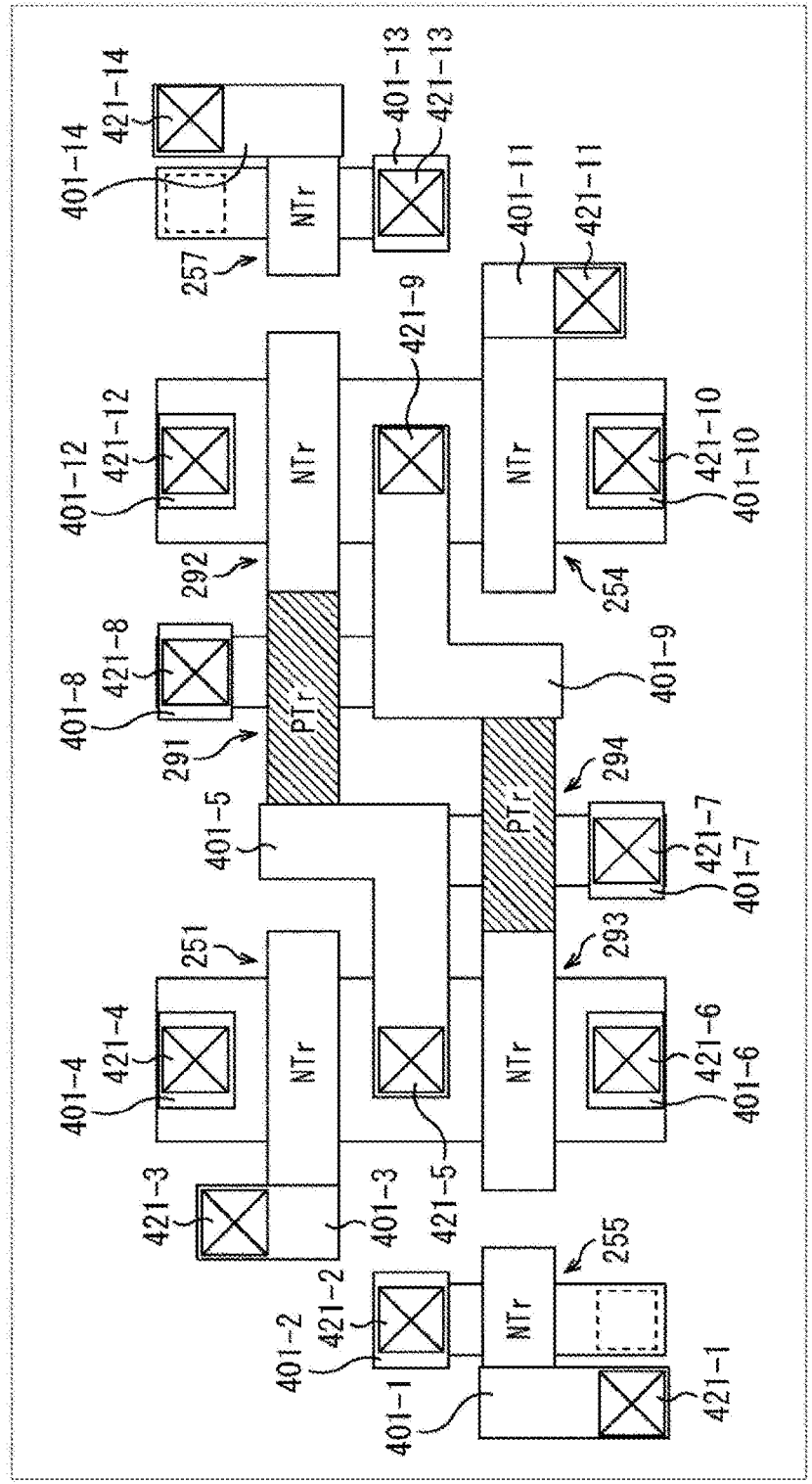
FIG. 14 is a view explaining a manufacturing process of the semiconductor device.

After that, as depicted in FIG. 14, a via 421-1 to a via 421-14 are formed in a portion of the wiring 401 in the wiring layer V1. For example, the via 421-13 corresponds to the via 345-1 of FIG. 11. It should be noted that hereinafter, in the case where the via 421-1 to the via 421-14 do not need to be especially distinguished from one another, the via 421-1 to the via 421-14 shall be simply referred to as the via 421 as well.

Figure 15:
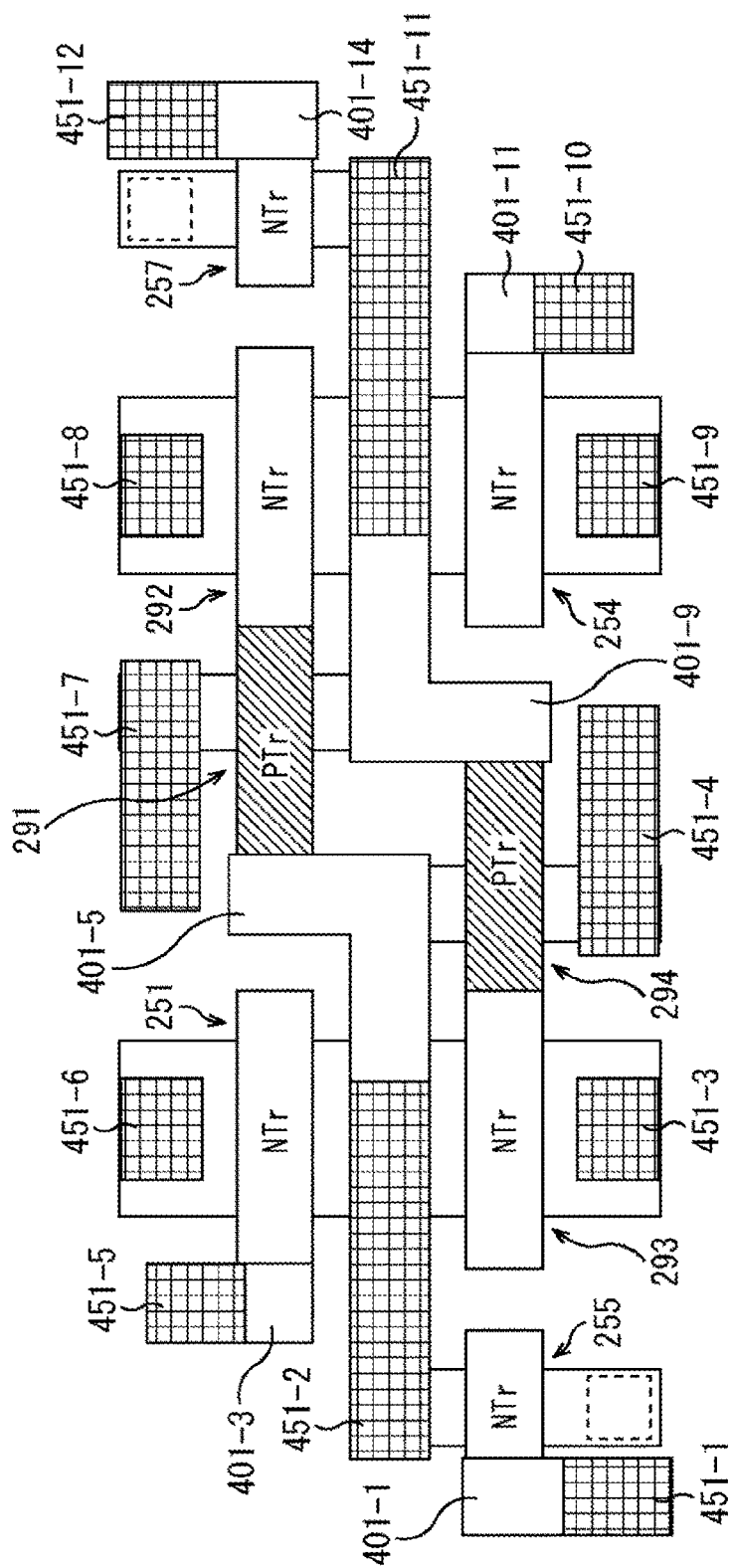
FIG. 15 is a view explaining a manufacturing process of the semiconductor device.

When the via 421 is formed in the wiring layer V1 in such a way, as depicted in FIG. 15, the wiring 451-1 to the wiring 451-12 are formed in a portion of the via 421 in the wiring layer M2.

For example, in this example, there is formed the wiring 451-11 through which the via 421-9 and the via 421-13 depicted in FIG. 14 are connected to each other. The transistor 292, the transistor 254, and the selection transistor 257 shall be connected to one another through the wiring 451-11. Therefore, the portion of the via 421-9 or the wiring 451-11 becomes the portion corresponding to the storage node 262 depicted in FIG. 9. The wiring 451-11, for example, corresponds to the wiring 344-2 depicted in FIG. 11.

It should be noted that hereinafter, in the case where the wiring 451-1 to the wiring 451-12 do not need to be especially distinguished from one another, the wiring 451-1 to the wiring 451-12 shall be simply referred to as the wiring 451 as well.

Figure 16:
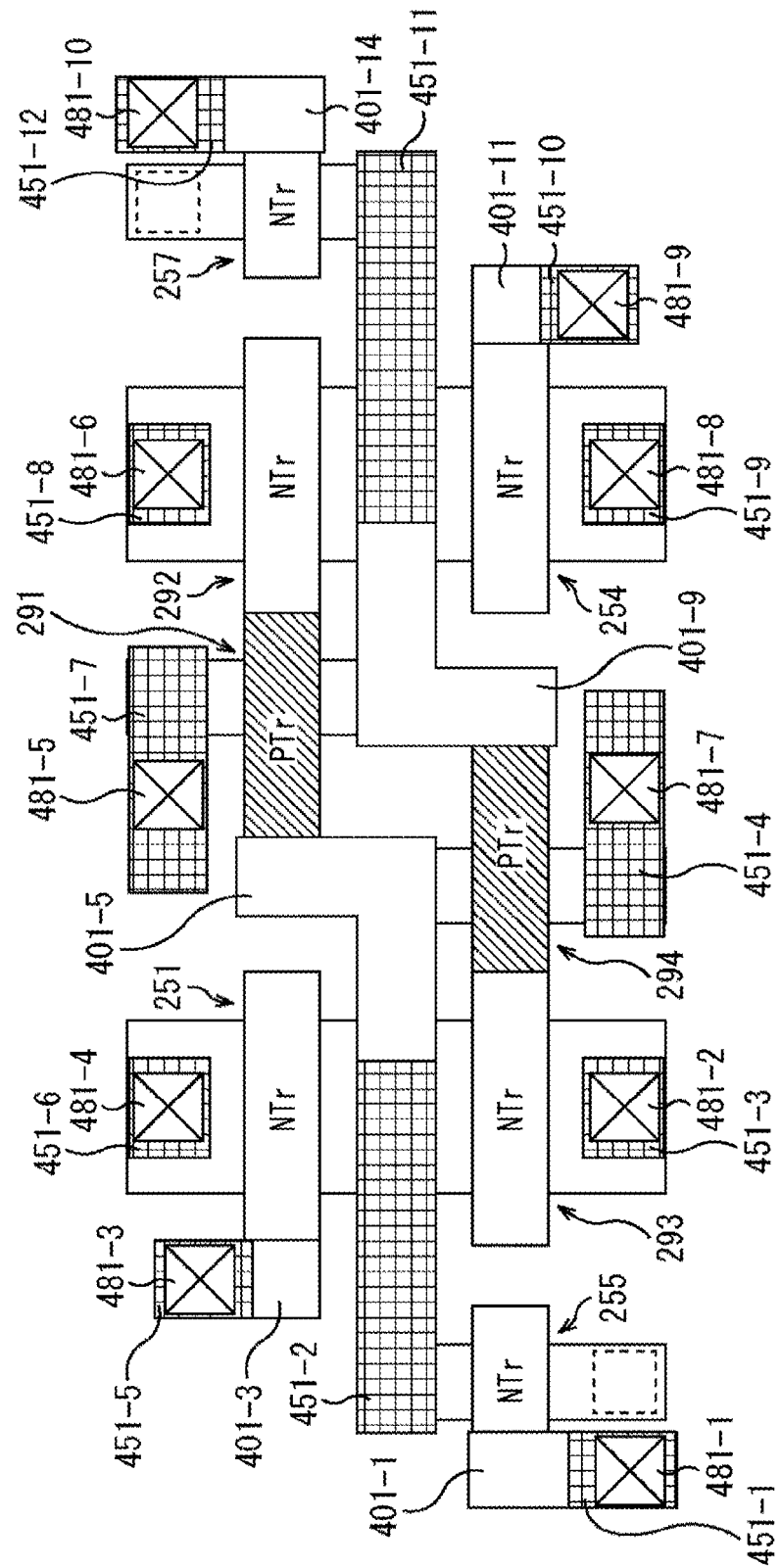
FIG. 16 is a view explaining a manufacturing process of the semiconductor device.

Next, a via 481-1 to a via 481-10 are formed in a portion of the wiring 451 in the wiring layer V2 as depicted in FIG. 16. It should be noted that hereinafter, in the case where the via 481-1 to the via 481-10 do not need to be especially distinguished from one another, the via 481-1 to the via 481-10 shall be simply referred to as the via 481 as well.

Figure 17:
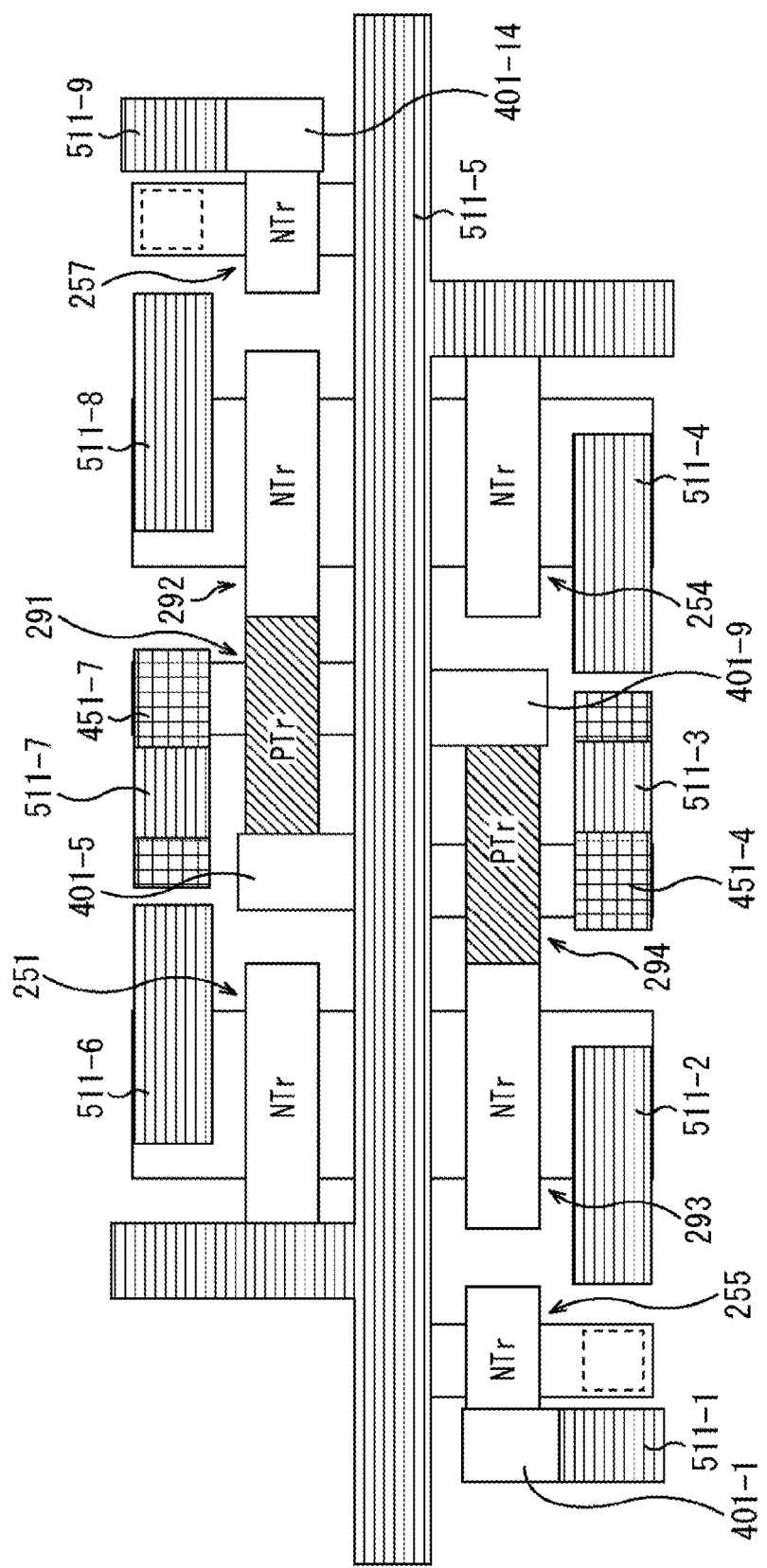
FIG. 17 is a view explaining a manufacturing process of the semiconductor device.

Moreover, a wiring 511-1 to a wiring 511-9 are formed in a portion of the via 481 in the wiring layer M3 as depicted in FIG. 17.

For example, in this example, there is formed the wiring 511-5 through which the via 481-3 and the via 481-9 depicted in FIG. 16 are connected to each other. It should be noted that hereinafter, in the case where the wiring 511-1 to the wiring 511-9 do not need to be especially distinguished from one another, the wiring 511-1 to the wiring 511-9 shall be simply referred to as the wiring 511 as well.

Figure 18:
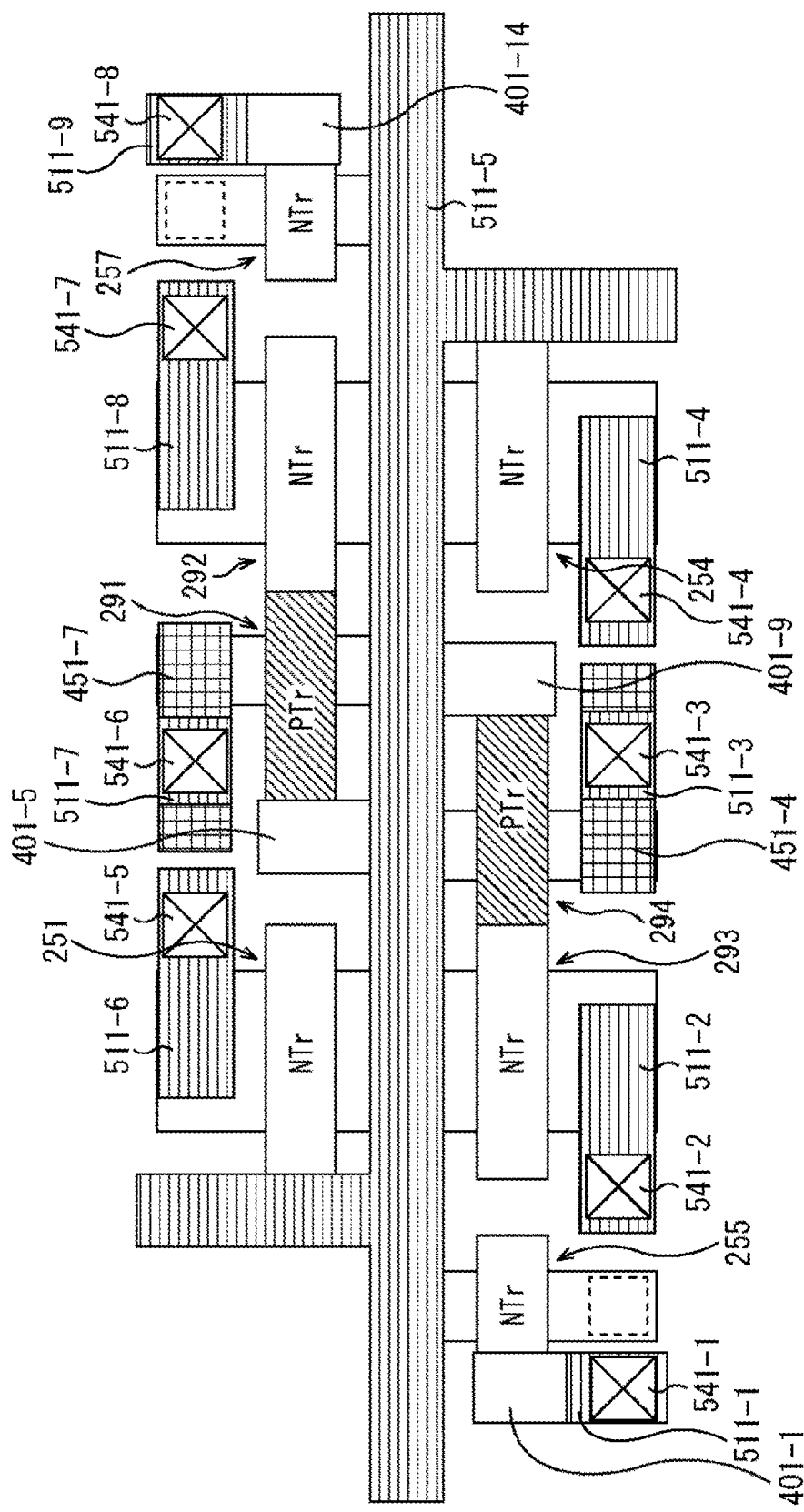
FIG. 18 is a view explaining a manufacturing process of the semiconductor device.

Subsequently, a via 541-1 to a via 541-8 are formed in a portion of the wiring 511 in the wiring layer V3 as depicted in FIG. 18. It should be noted that hereinafter, in the case where the via 541-1 to the via 541-8 do not need to be especially distinguished from one another, the via 541-1 to the via 541-8 shall be simply referred to as the via 541 as well.

Figure 19:
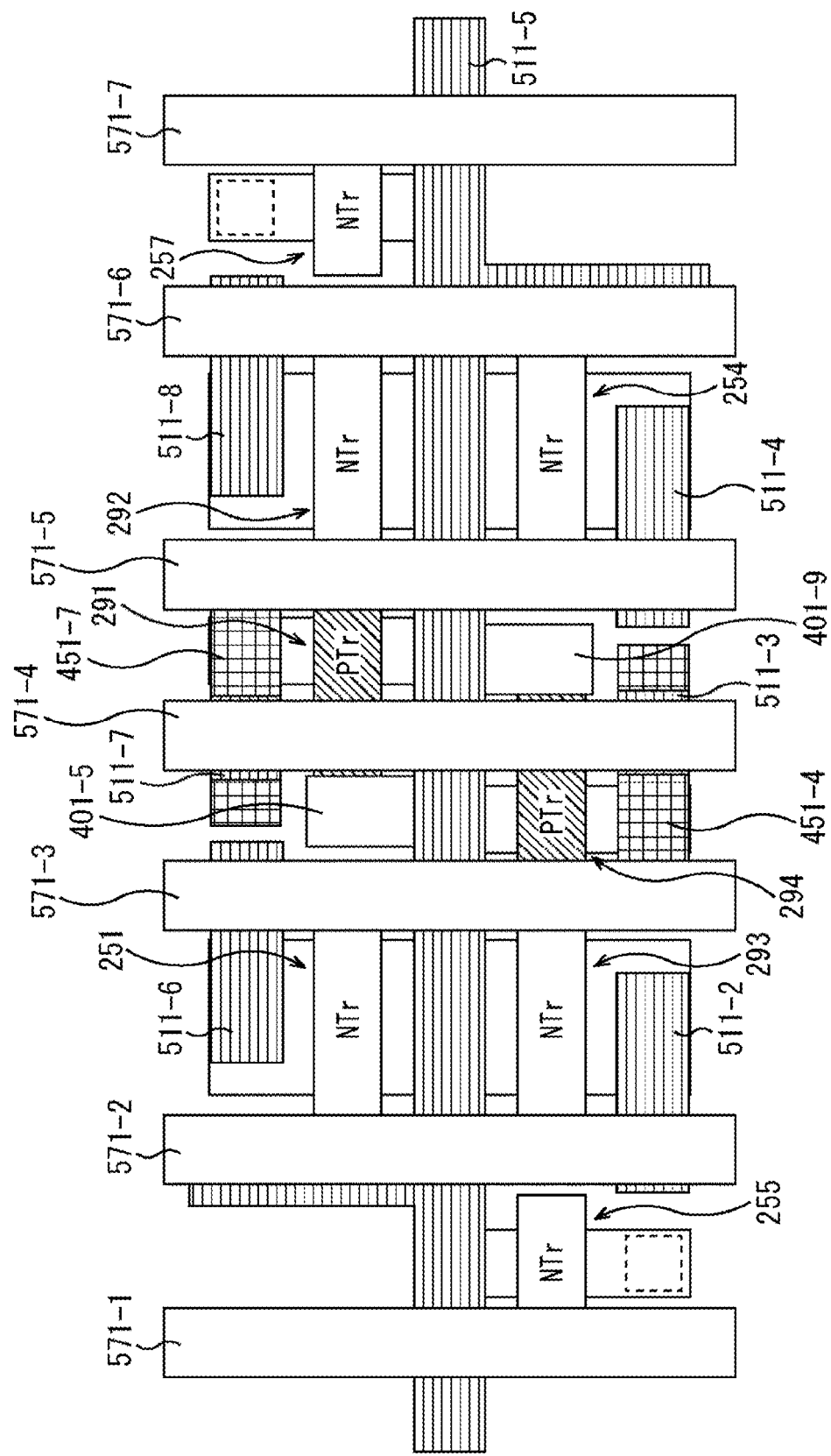
FIG. 19 is a view explaining a manufacturing process of the semiconductor device.

Moreover, as depicted in FIG. 19, a wiring 571-1 to a wiring 571-7 are formed in a portion of the via 541 in the wiring layer M4.

In this example, for example, the wiring 571-1 is electrically connected to the gate electrode 301-3 of the selection transistor 255 to be made the wiring for control for the selection transistor 255. Likewise, the wiring 571-7 is electrically connected to the gate electrode 301-8 of the selection transistor 257 to be made the wiring for control for the selection transistor 257.

In addition, for example, the wiring 571-2 and the wiring 571-6 are made the wirings which are to be connected to the ground, and the wiring 571-4 is made the wiring which is to be connected to the power source. Moreover, for example, the wiring 571-3 is connected to the diffusion region 303-1 used for the information input of the transistor 251, and the wiring 571-5 is connected to the diffusion region 302-7 used for the information input of the transistor 254.

It should be noted that hereinafter, in the case where the wiring 571-1 to the wiring 571-7 do not need to be especially distinguished from one another, the wiring 571-1 to the wiring 571-7 shall be simply referred to as the wiring 571 as well.

When the semiconductor device 211 is formed up to the wiring layer M4 in such a way, thereafter, for example, the wiring layer V4 and the wiring layer M5 are formed, and also the supporting substrate 331 is joined to the multi-layer interconnection forming portion 332. Then, for example, the contact 306 and the wiring 307 are formed, the MTJ 258 and the MTJ 256 are formed, and the control line 260 is formed to complete the semiconductor device 211.

<Modified Change 1 of Second Embodiment>
<Arrangement of MTJs for Dummy>

In addition, in the foregoing, it is explained that the MTJ 256 and the MTJ 258 are arranged on the back surface 337 side in the semiconductor substrate 335 within the region R14 of the cell of the SRAM. However, not only the MTJ 256 and the MTJ 258, but also a plurality of MTJs for dummy may also be arranged.

Figure 20:
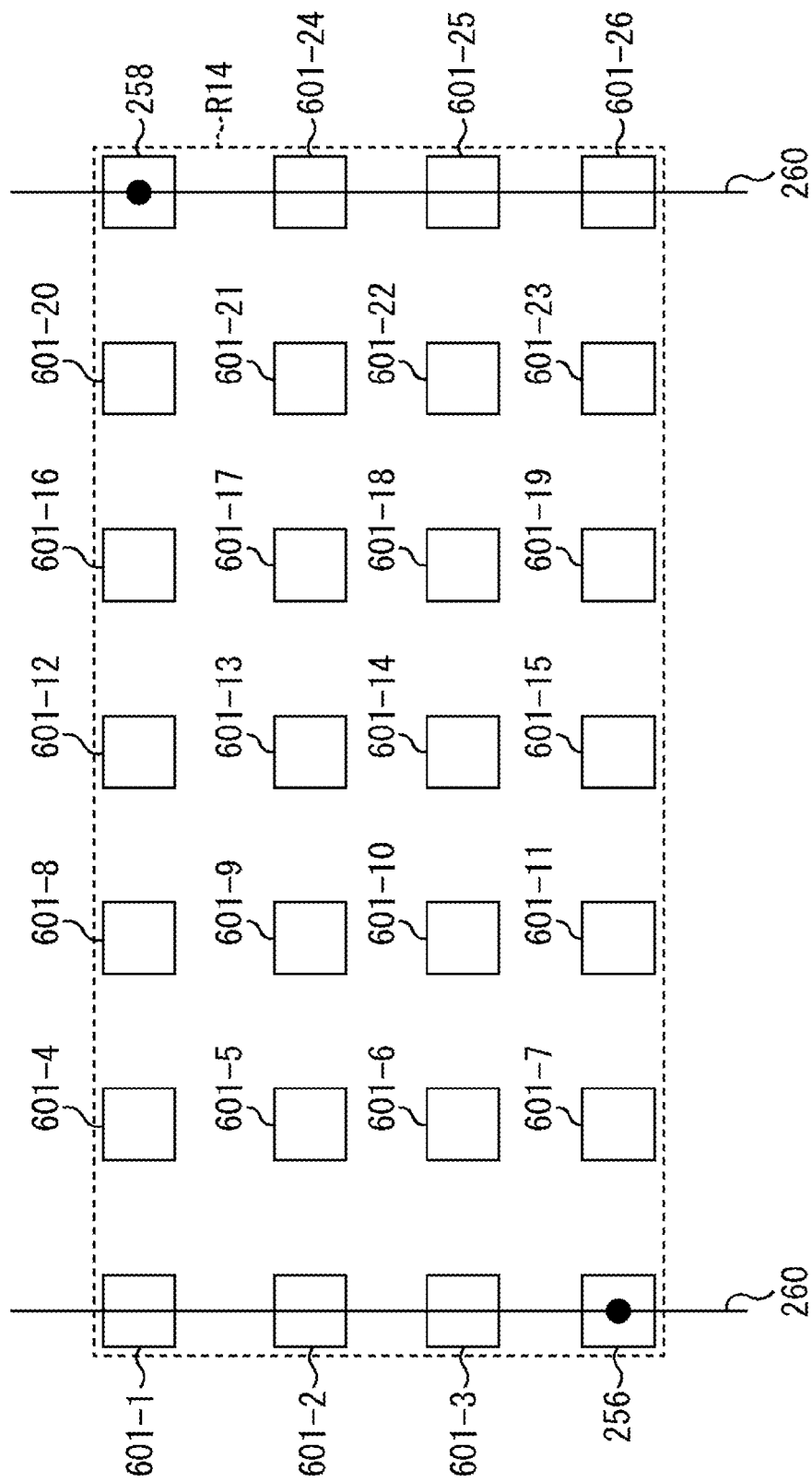
FIG. 20 is a view explaining arrangement of the MTJs.

In such a case, for example, as depicted in FIG. 20, a plurality of MTJs are regularly arranged in a horizontal direction and in a vertical direction on the surface of the insulating layer 338 within the region R14 of the cell of the SRAM. It should be noted that in FIG. 20, portions corresponding to those in the case of FIG. 10 are assigned the same reference signs, and a description thereof is suitably omitted herein.

FIG. 20 is a view when the surface of the insulating layer 338 is viewed from a direction vertical to the semiconductor substrate 335. That is to say, FIG. 20 is a view when the insulating layer 338 depicted in FIG. 11 is viewed in the downward direction from the above side in FIG. 11. It should be noted that the transistors are arranged so as to follow the arrangement style depicted in FIG. 10 on the principal surface 336 side in the semiconductor substrate 335 within the region R14.

In the example depicted in FIG. 20, within the region R14, the MTJ 256 and the MTJ 258 which are necessary for the operation of the semiconductor device 211, and an MTJ 601-1 to an MTJ 601-26 for dummy which are unnecessary for the operation of the semiconductor device 211 are regularly arranged in the longitudinal direction and in the transverse direction in the figure. That is to say, the MTJs are arranged uniformly over the region R14.

It should be noted that hereinafter, in the case where the MTJ 601-1 to the MTJ 601-26 do not need to be especially distinguished from one another, the MTJ 601-1 to the MTJ 601-26 shall be simply referred to as the MTJ 601 as well.

In such a way, not only the MTJ 256 and the MTJ 258 which are actually necessary, but also the MTJ 601 is formed on the same layer. As a result, at the time of formation of the MTJ, the processing dispersion can be more reduced than the case where the MTJs are locally arranged, and the characteristics of the MTJ 256 and the MTJ 258 can be enhanced.

Figure 21:
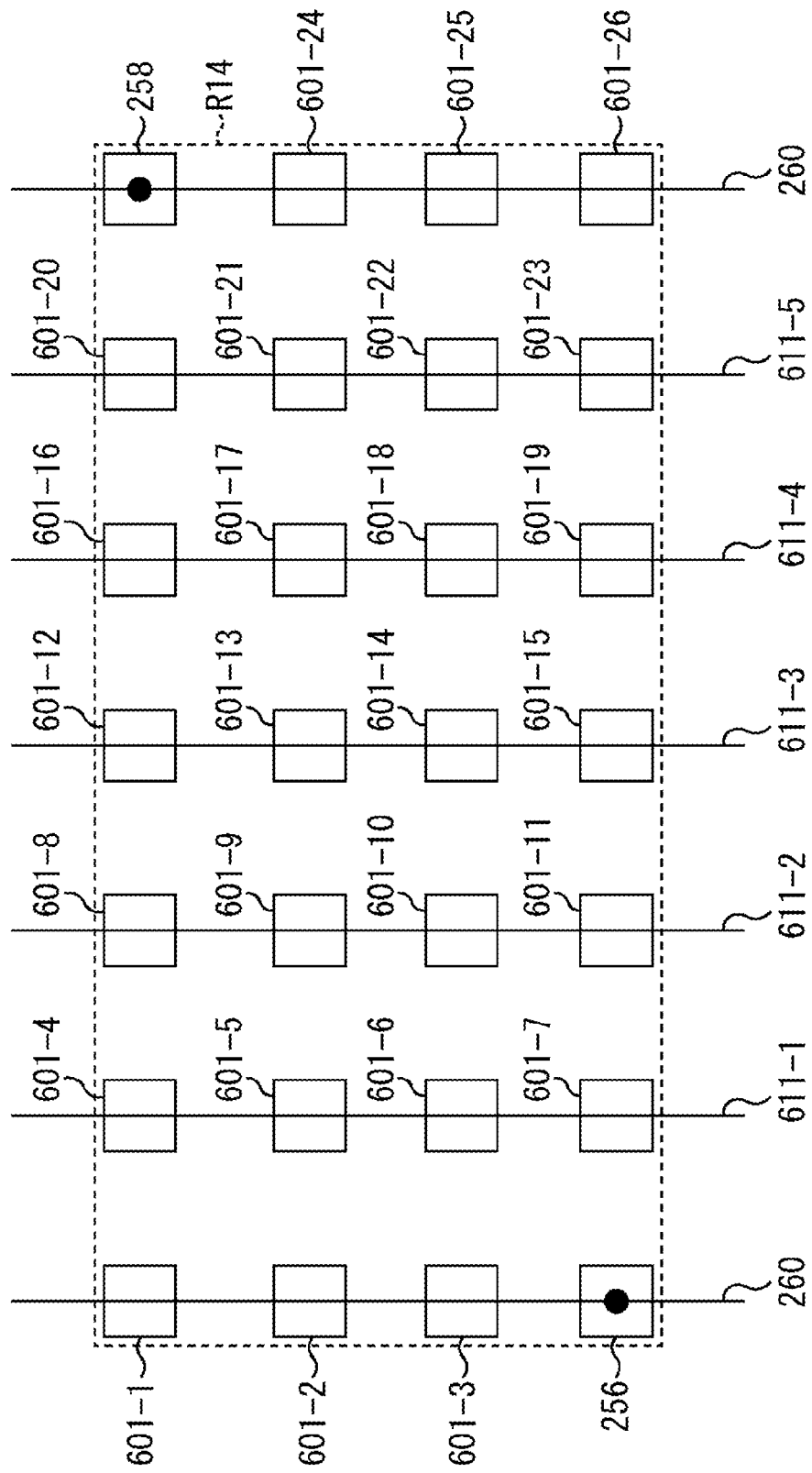
FIG. 21 is a view explaining arrangement of the MTJs.

At this time, for example, as depicted in FIG. 21, other control line different from the control line 260 is connected to some MTJs 601, and the MTJs 601 are connected to the selection transistor 255 and the selection transistor 257. As a result, these MTJs 601 can also be used as the MTJs for redundant relief for the MTJ 256 and the MTJ 258. It should be noted that in FIG. 21, portions corresponding to those in the case of FIG. 20 are assigned the same reference signs, and a description thereof is suitably omitted herein.

In this example, in the figure, a wiring 611-1 to a wiring 611-5 are provided for the MTJs 601 which are arranged side by side in the longitudinal direction. Specifically, for example, the wiring 611-1 is provided for the MTJ 601-4 to the MTJ 601-7.

At this time, for example, the wiring 611-1 and the MTJ 601-4 are electrically connected to each other, and the MTJ 601-4 is connected to the selection transistor 255. Moreover, by connecting a circuit similar to the selection circuit 27 depicted in FIG. 1 to the control line 260 and the wiring 611-1, the MTJ 601-4 can be used as the MTJ for redundant relief for the MTJ 256.

Incidentally, in this case, it is only necessary that the MTJ 601-5 to the MTJ 601-7 are electrically connected to the wiring 611-1 or not electrically connected to the wiring 611-1 as may be necessary.

<Modified Change 2 of Second Embodiment>
<Example of Layout of Transistors>

Incidentally, in the example depicted in FIG. 11, a description has been given with respect to the example in which the contact 306 is directly connected to the diffusion region 303-8 of the selection transistor 257 to draw the MTJ 258 to the layer on the back surface 337 side. However, in addition thereto, for example, a structure may also be adopted in which a contact connected to the wiring of the wiring layer M1 to extend completely through the element isolation layer 341 is formed to draw the MTJ 258 to the layer on the back surface 337 side.

Figure 22:
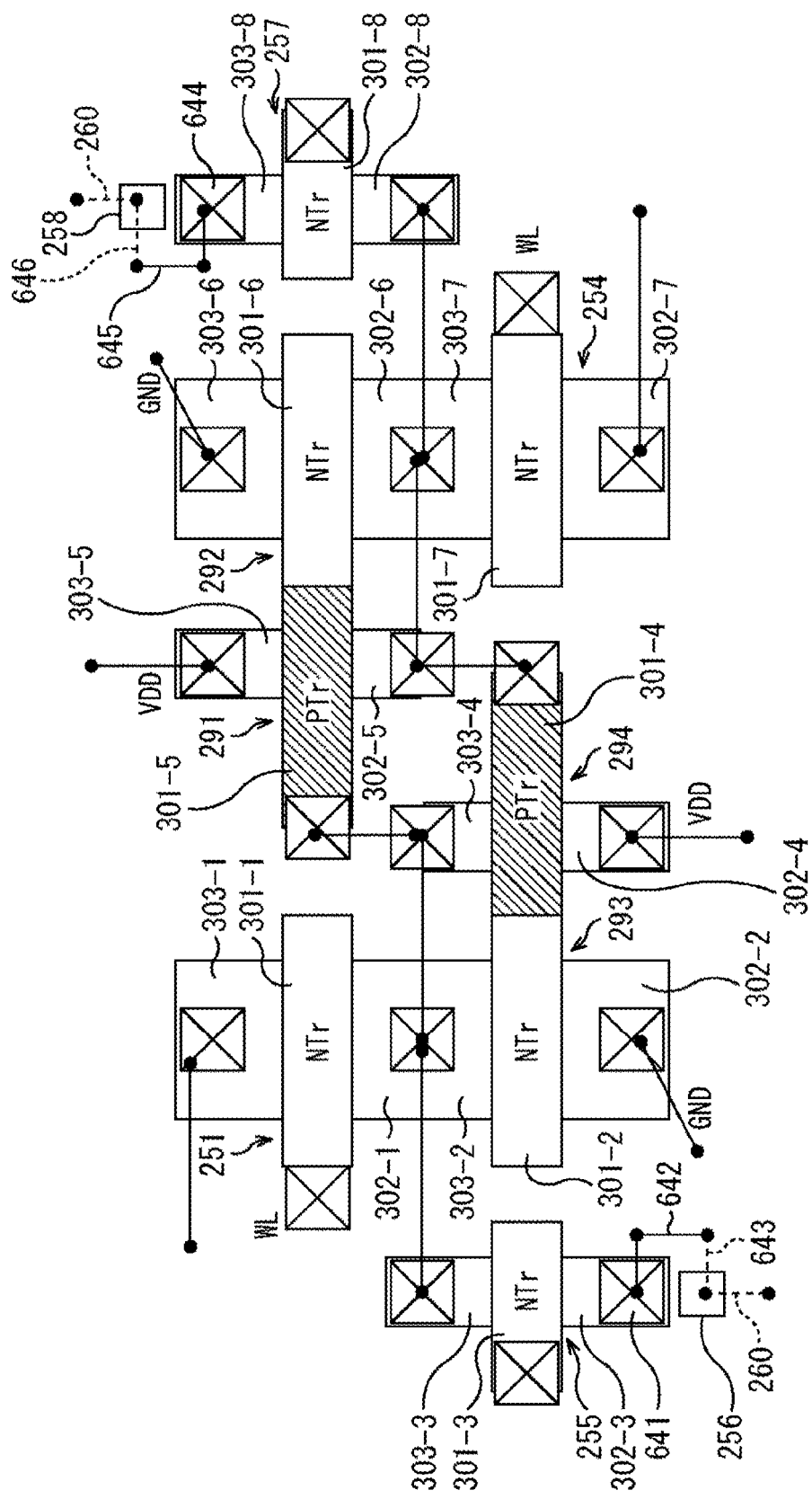
FIG. 22 is a view depicting an example of arrangement of the transistors.

In such a case, the arrangement and connection relation between the transistors and the MTJs of the semiconductor device 211, for example, are set to the arrangement and connection relation depicted in FIG. 22. It should be noted that in FIG. 22, portions corresponding to those in the case of FIG. 10 are assigned the same reference signs, and a description thereof is suitably omitted herein.

The arrangement of the transistors and the MTJs depicted in FIG. 22 is the same as the arrangement of the transistors and the MTJs depicted in FIG. 10. The example depicted in FIG. 22 is different from the example depicted in FIG. 10 only in the connection between the selection transistor and the MTJ, and is identical to the example depicted in FIG. 10 in other portions.

That is to say, in the example depicted in FIG. 22, in the semiconductor device 211, a contact 641 is connected to the diffusion region 302-3 of the selection transistor 255, and a wiring 642 provided in the wiring layer M1 is connected to the contact 641. In addition, a wiring 643 is connected to the wiring 642 through the contact extending completely through the semiconductor substrate 335, and the MTJ 256 is connected to an end of the wiring 643. Here, the wiring 643 is a wiring provided on the back surface 337 side of the semiconductor substrate 335.

Likewise, a contact 644 is connected to the diffusion region 303-8 of the selection transistor 257, and a wiring 645 provided in the wiring layer M1 is connected to the contact 644. In addition, a wiring 646 is connected to the wiring 645 through the contact extending completely through the semiconductor substrate 335, and the MTJ 258 is connected to an end of the wiring 646. Here, the wiring 646 is a wiring provided on the back surface 337 side of the semiconductor substrate 335.

Figure 23:
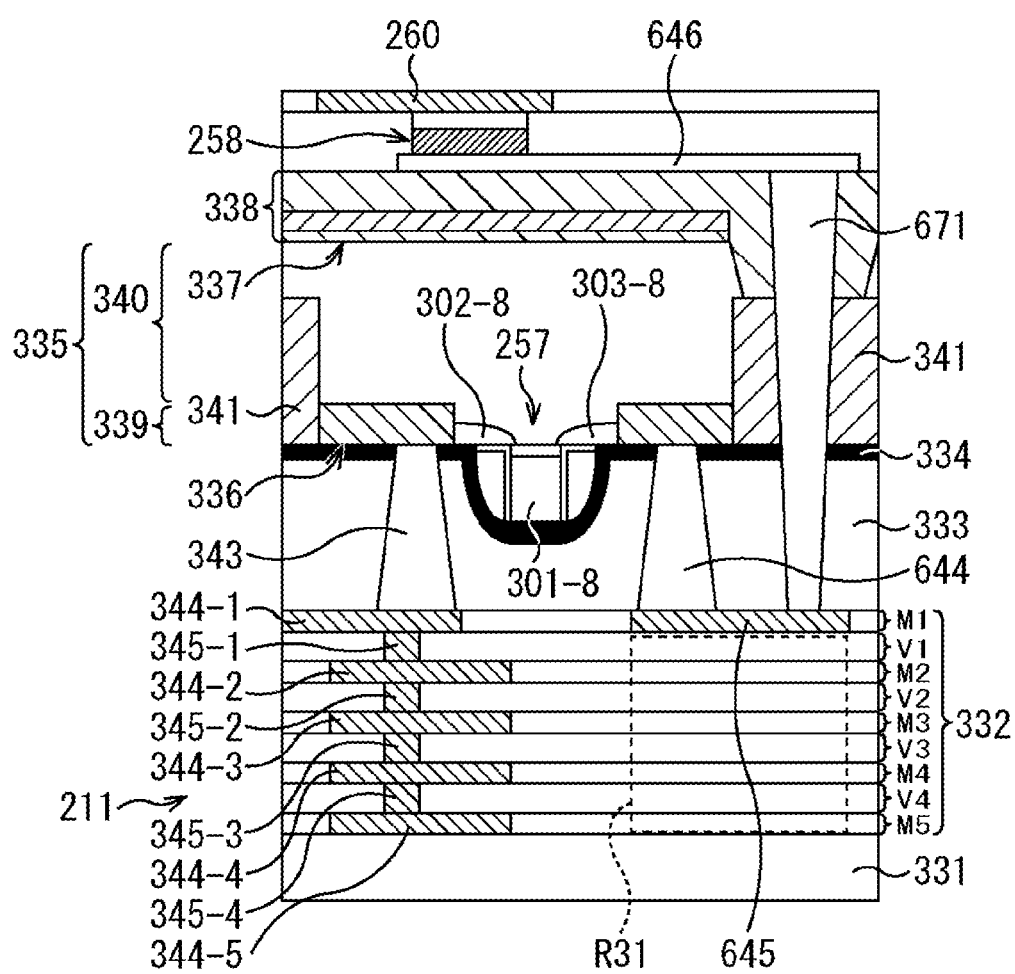
FIG. 23 is a view explaining a cross section of the semiconductor device.

More specifically, a cross section of the vicinity of the selection transistor 257 and the MTJ 258 of the semiconductor device 211 depicted in FIG. 22, for example, is as depicted in FIG. 23. It should be noted that in FIG. 23, portions corresponding to those in the case of FIG. 11 are assigned the same reference signs, and a description thereof is suitably omitted herein.

In this example, the contact 644 through which the diffusion region 303-8 of the selection transistor 257, and the wiring 645 provided in the wiring layer M1 are connected to each other is formed in the interlayer insulating layer 333. That is to say, an end on the semiconductor substrate 335 side of the contact 644 is connected to the diffusion region 303-8, and an end on the wiring layer M1 side of the contact 644 is connected to the wiring 645.

Moreover, a contact 671 which, for example, includes a metal such as Cu or W, and which extends completely through the interlayer insulating layer 333, the interlayer insulating layer 334, the semiconductor substrate 335, and the insulating layer 338 is provided in the wiring 645. The contact 671 is formed in a position surrounded by (covered with) the element isolation layer 341 in a portion of the semiconductor substrate 335. In a word, in the portion of the semiconductor substrate 335, the contact 671 extends completely through the element isolation layer 341 portion. In addition, the insulating layer 338 is provided adjacent to an upper side of the portion in which the contact 671 is provided in the figure of the element isolation layer 341.

The wiring 646 is formed on the surface on the side opposite to the semiconductor substrate 335 side in the insulating layer 338 provided on the back surface 337 side of the semiconductor substrate 335. Then, an end on the insulating layer 338 side of the contact 671 is connected to the wiring 646, and an end on the wiring layer M1 side of the contact 671 is connected to the wiring 645.

Moreover, the MTJ 258 is connected to an end on the side opposite to the side to which the contact 671 is connected in the wiring 646. Furthermore, the control line 260 is connected to the MTJ 258.

Therefore, in this example, the MTJ 258 is connected to the diffusion region 303-8 of the selection transistor 257 through the wiring 646, the contact 671, the wiring 645, and the contact 644.

Also by adopting the configuration as described above, the MTJ 256 and the MTJ 258 can be drawn to the back surface 337 side of the semiconductor substrate 335 by using the wiring, the contact and the like. Therefore, the MTJs can be formed approximately in the final process of the manufacturing process for the semiconductor device 211. As a result, the addition of the temperature to the MTJ during the process for forming the multi-layer interconnection can be reduced, and as a result, the characteristics deterioration of the MTJ can be prevented from being caused.

Moreover, the MTJs such as the MTJ 258 are arranged on the back surface 337 side of the semiconductor substrate 335. As a result, the wiring configuring the normal circuit can be freely routed on the principal surface 336 side of the semiconductor substrate 335, and thus the increase in circuit area can be suppressed. Specifically, in the semiconductor device 211, the MTJ 258 and the like are arranged on the back surface 337 side of the semiconductor substrate 335. Therefore, an arbitrary wiring can be provided in a portion of a region R31, and thus the miniaturization of the semiconductor device 211 can be realized. In a word, the more compact semiconductor device 211 can be obtained.

<Modified Change 3 of Second Embodiment>
<Example of Layout of Transistor>

Figure 24:
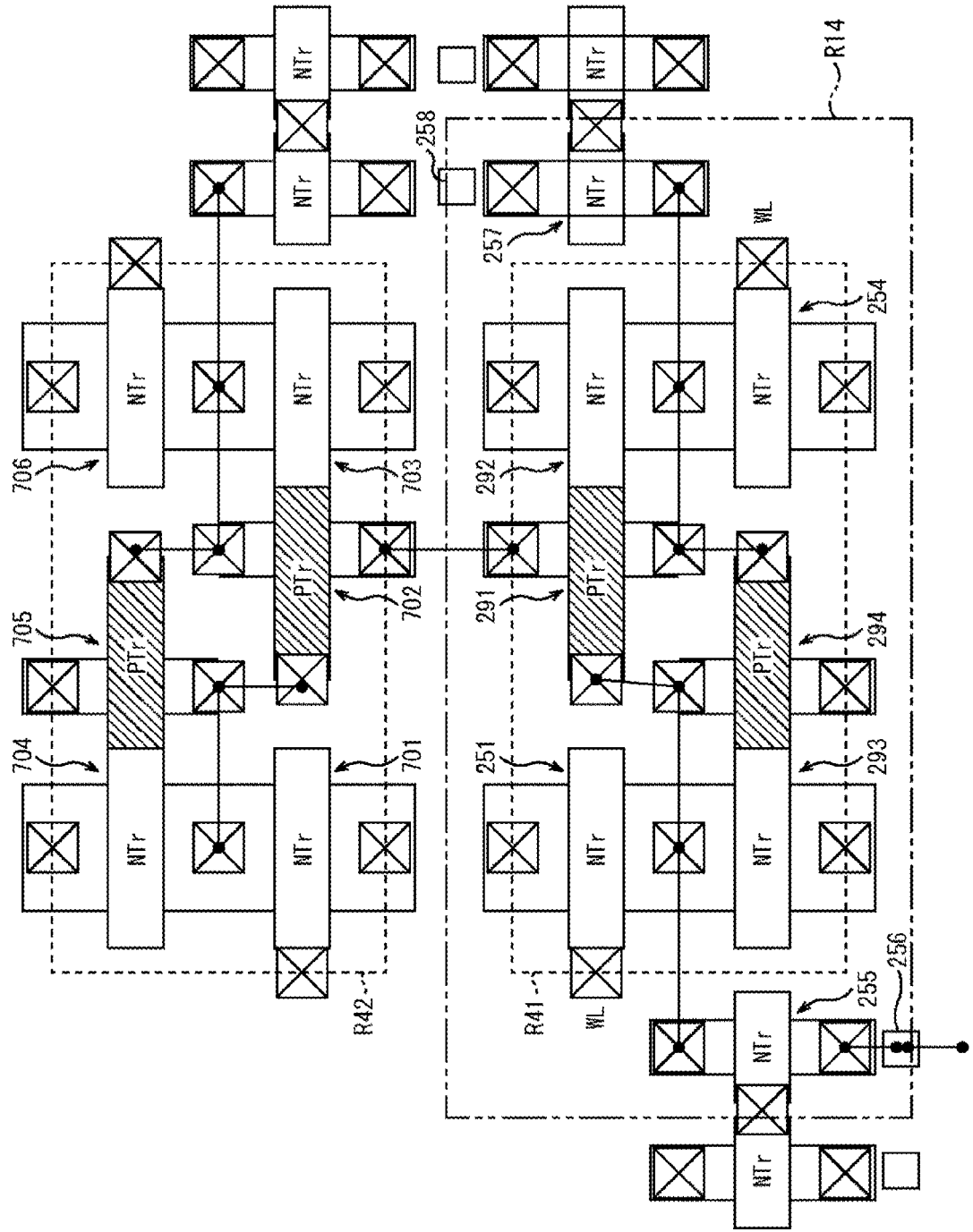
FIG. 24 is a view depicting an example of arrangement of the transistors.

In addition, in the case where a plurality of volatile logic circuits 221 are provided in the semiconductor device 211, the arrangement of the transistors configuring these volatile logic circuits 221, for example, can also be set to the arrangement depicted in FIG. 24. It should be noted that in FIG. 24, portions corresponding to those in the case of FIG. 10 are assigned the same reference signs, and a description thereof is suitably omitted herein.

In FIG. 24, the transistor 251, the transistor 291 to the transistor 294, and the transistor 254 configuring one volatile logic circuit 221 are arranged within a region R41. The arrangement of the transistors within the region R41 is the same arrangement as that of the transistors depicted in FIG. 10.

In addition, a transistor 701 to a transistor 706 configuring another one volatile logic circuit 221 are arranged in a region R42 adjacent to the region R41. Thus, the transistor 701 to the transistor 706 correspond to the transistor 251, the transistor 291 to the transistor 294, and the transistor 254, respectively.

That is to say, the transistor 701 to the transistor 706 are arranged within the region R42 in such a way that the gate electrodes of the transistor 701 to the transistor 706 are directed in the transverse direction in the figure. With respect to the region R42, the region R41 is arranged in a direction vertical to the direction in which the gate electrodes of the transistors within the region R42 are arranged side by side.

In this example, the transistors within the region R41 and the region R42 which are arranged side by side adjacent to each other are arranged so as to be symmetrical with respect to the direction in which these regions are arranged side by side. In other words, the transistors are arranged in such a way that the transistors within the region R41 and the transistors within the region R42 become line symmetry with respect to a straight line in a direction vertical to the direction in which the region R41 and the region R42 are arranged side by side, in a word, a straight line in a direction in which the gate electrodes of the transistors are arranged side by side.

<Modified Change 4 of Second Embodiment>
<Example of Layout of Transistors>

Moreover, the arrangement of the transistors of the semiconductor device 211 is by no means limited to the example depicted in FIG. 10, and any other arrangement may be adopted. For example, the arrangement depicted in FIG. 25 may be adopted. It should be noted that in FIG. 25, portions corresponding to those in the case of FIG. 10 are assigned the same reference signs, and a description thereof is suitably omitted herein.

Figure 25:
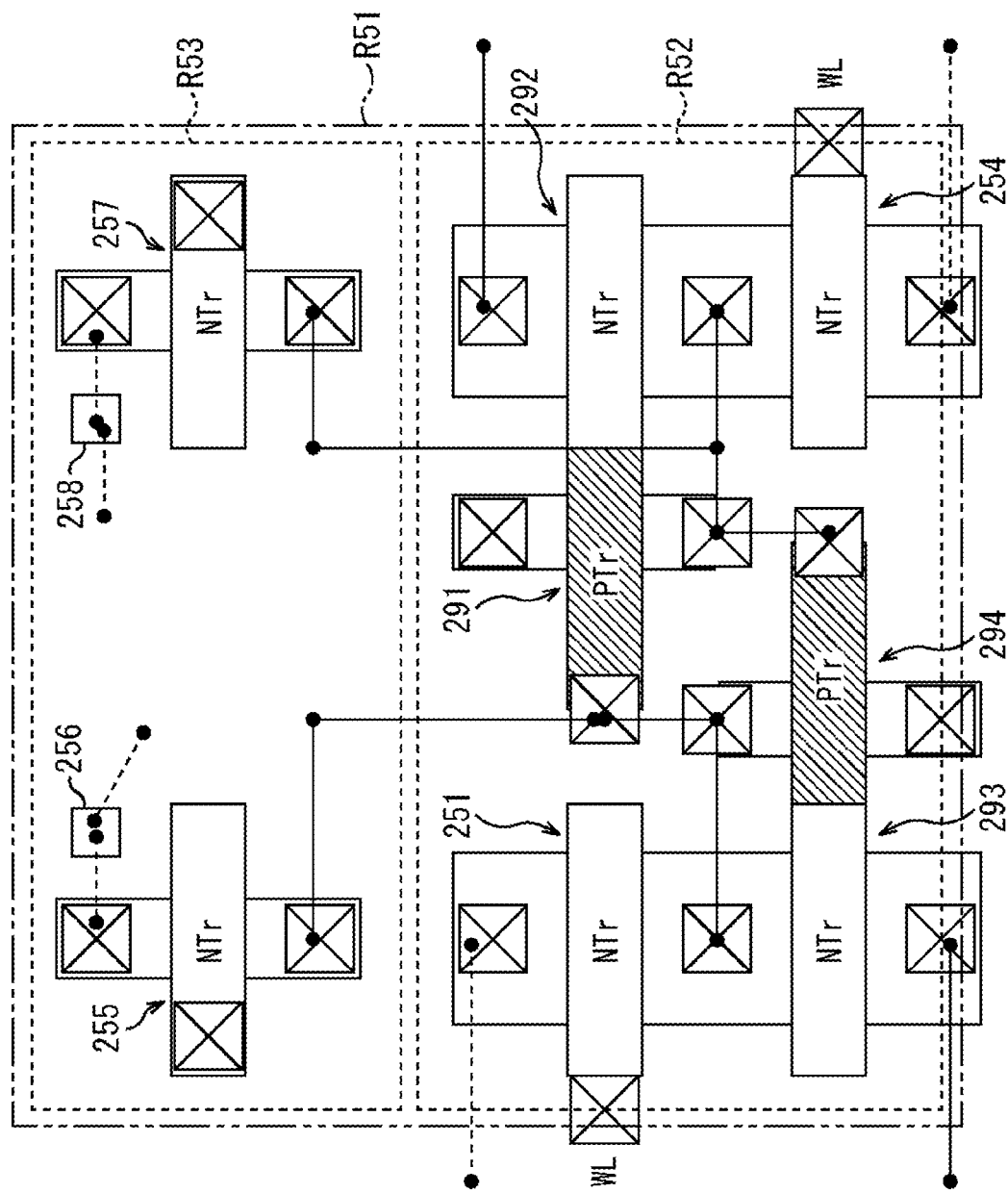
FIG. 25 is a view depicting an example of arrangement of the transistors.

In the example depicted in FIG. 25, a region R51 of the cell of the SRAM is an almost square region. The region R51 is separated into a lower side region R52 in the figure, and an upper side region R53 in the figure. In addition, the transistors configuring the volatile logic circuit 221, that is, the transistor 251, the transistor 291 to the transistor 294, and the transistor 254 are arranged in the region R52.

The transistors are arranged in such a way that, for example, the gate electrodes of the transistor 251, the transistor 291, and the transistor 292 become parallel to one another and are arranged side by side on one straight line.

In the example, the transistor 251, the transistor 291, and the transistor 292 are arranged in such a way that the longer direction of the gate electrodes of the transistors becomes the transverse direction in the figure, in a word, the paired diffusion regions of the transistors are arranged side by side in the longitudinal direction in the figure. Here, the direction in which the gate electrodes of the transistor 251, the transistor 291, and the transistor 292 are arranged side by side becomes a direction which is approximately vertical to the direction in which the region R52 and the region R53 are arranged side by side.

Likewise, the transistor 293, the transistor 294, and the transistor 254 are arranged in such a way that the gate electrodes of these transistors become parallel to one another and are arranged side by side on one straight line.

The direction in which the gate electrodes of the transistor 293, the transistor 294, and the transistor 254 are arranged side by side becomes the direction parallel to the direction in which the gate electrodes of the transistor 251, the transistor 291, and the transistor 292 are arranged side by side.

In addition, the selection transistor 255, the selection transistor 257, the MTJ 256, and the MTJ 258 are arranged within the region R53 adjacent to the region R52.

In this example, the selection transistor 255 and the selection transistor 257 are arranged in such a way that the gate electrodes of the selection transistor 255 and the selection transistor 257 become parallel to each other and are arranged side by side on one straight line. The direction in which the gate electrodes of the selection transistor 255 and the selection transistor 257 are arranged side by side becomes the direction parallel to the direction in which the gate electrodes of the transistor 251, the transistor 291, and the transistor 292 are arranged side by side.

Therefore, the transistors are arranged within the region R51 in such a way that the gate electrodes of all the transistors become parallel to one another.

In addition, in this example as well, the transistors are arranged on the principal surface 336 side of the semiconductor substrate 335, and the MTJ 256 and the MTJ 258 are arranged on the back surface 337 side of the semiconductor substrate 335. Incidentally, with regard to the method of connecting the MTJ 256 and the MTJ 258, and the selection transistor 255 and the selection transistor 257 to each other, for example, as depicted in FIG. 11, the contact 306 may be directly provided in the diffusion region 303 of the selection transistor, thereby carrying out the connection. Alternatively, as depicted in FIG. 23, the connection may be carried out through the wiring within the wiring layer M1.

<Modified Change 5 of Second Embodiment>
<Example of Layout of Transistors>

Figure 26:
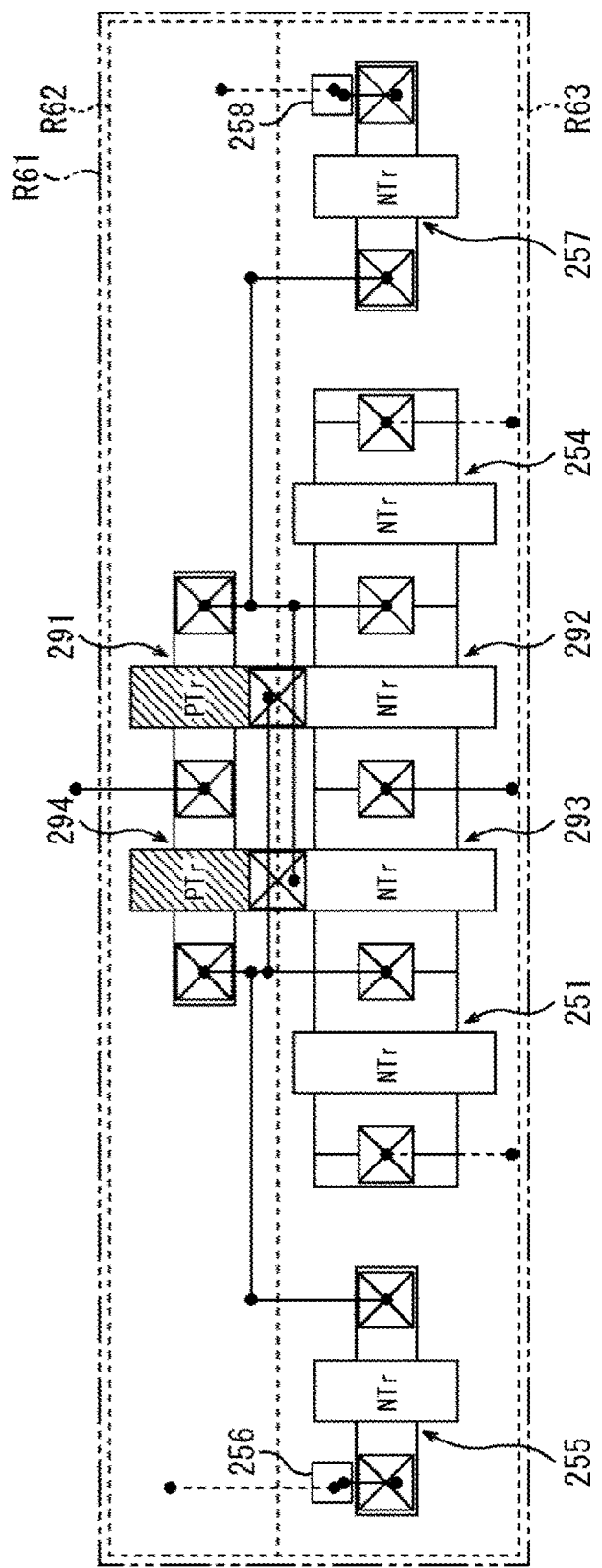
FIG. 26 is a view depicting an example of arrangement of the transistors.

Moreover, the arrangement of the transistors of the semiconductor device 211 may adopt the arrangement, for example, depicted in FIG. 26. It should be noted that in FIG. 26, portions corresponding to those in the case of FIG. 10 are assigned the same reference signs, and a description thereof is suitably omitted herein.

In the example, depicted in FIG. 26, a region R61 of the cell of the SRAM becomes a rectangular region which is long in the transverse direction in the figure. The region R61 is separated into an upper side region R62 in the figure, and a lower side region R63 in the figure.

For example, a portion of the semiconductor layer 340 in the semiconductor substrate 335 within the region R62 includes an n-type well, and a portion of the semiconductor layer 340 in the semiconductor substrate 335 within the region R63 adjacent to the region R62 includes a p-type well.

For this reason, the transistor 291 and the transistor 294 each being the pMOS transistor are arranged within the region R62. On the other hand, the selection transistor 255, the transistor 251, the transistor 293, the transistor 292, the transistor 254, and the selection transistor 257 each being the nMOS transistor are arranged within the region R63. In addition, the MTJ 256 and the MTJ 258 are also arranged in the region R63.

For example, in the region R62, the transistor 291 and the transistor 294 are arranged in such a way that the gate electrodes of the transistor 291 and the transistor 294 are arranged side by side in the transverse direction in parallel to each other in the figure. In this example, the transistor 291 and the transistor 294 are arranged in such a way that the longer direction of the gate electrodes of the transistors becomes the longitudinal direction in the figure, in a word, the paired diffusion regions of the transistors are arranged side by side in the transverse direction in the linear fashion in the figure.

Here, the direction in which the gate electrodes of the transistor 291 and the transistor 294 are arranged side by side becomes a direction which is approximately vertical to the direction in which the region R62 and the region R63 are arranged side by side.

Likewise, in the region R63, the selection transistor 255, the transistor 251, the transistor 293, the transistor 292, the transistor 254, and the selection transistor 257 are arranged in such a way that the gate electrodes of these transistors are arranged side by side in the transverse direction in parallel to one another in the figure. In this example, the selection transistor 255, the transistor 251, the transistor 293, the transistor 292, the transistor 254, and the selection transistor 257 are arranged in such a way that the longer direction of the gate electrodes of these transistors becomes the longitudinal direction in the figure, in a word, the paired diffusion regions of the transistors are arranged side by side in the transverse direction in the linear fashion in the figure.

Here, the direction in which the gate electrodes of the selection transistor 255, the transistor 251, the transistor 293, the transistor 292, the transistor 254, and the selection transistor 257 are arranged side by side becomes the direction which is approximately vertical to the direction in which the region R62 and the region R63 are arranged side by side.

In addition, in the region R61, the transistor 251, the transistor 291 to the transistor 294, and the transistor 254 configuring the volatile logic circuit 221 are collectively arranged approximately in the central region of the region R61. The selection transistor 255 and the selection transistor 257 are arranged in respective end positions of the region in which these transistors are arranged.

Specifically, the selection transistor 257 is arranged in an end portion on the right side of the region R63 in the figure within the region R63, in a word, in a portion on the right side of the region in the figure in which the transistor 251, the transistor 293, the transistor 292, and the transistor 254 configuring the volatile logic circuit 221 are arranged.

Likewise, the selection transistor 255 is arranged in an end portion on the left side of the region R63 in the figure within the region R63, in a word, in a portion on the left side of the region in the figure in which the transistor 251, the transistor 293, the transistor 292, and the transistor 254 configuring the volatile logic circuit 221 are arranged.

In such a way, within the region R61, the transistors are arranged in such a way that the gate electrodes of all the transistors become parallel to one another.

In addition, in this example as well, the transistors are arranged on the principal surface 336 side of the semiconductor substrate 335, and the MTJ 256 and the MTJ 258 are arranged on the back surface 337 side of the semiconductor substrate 335. Incidentally, with regard to the method of connecting the MTJ 256 and the MTJ 258, and the selection transistor 255 and the selection transistor 257 to each other, any method such as the method depicted in FIG. 11 or FIG. 23 may be adopted.

<Modified Change 6 of Second Embodiment>
<Example of Layout of Transistors>

Figure 27:
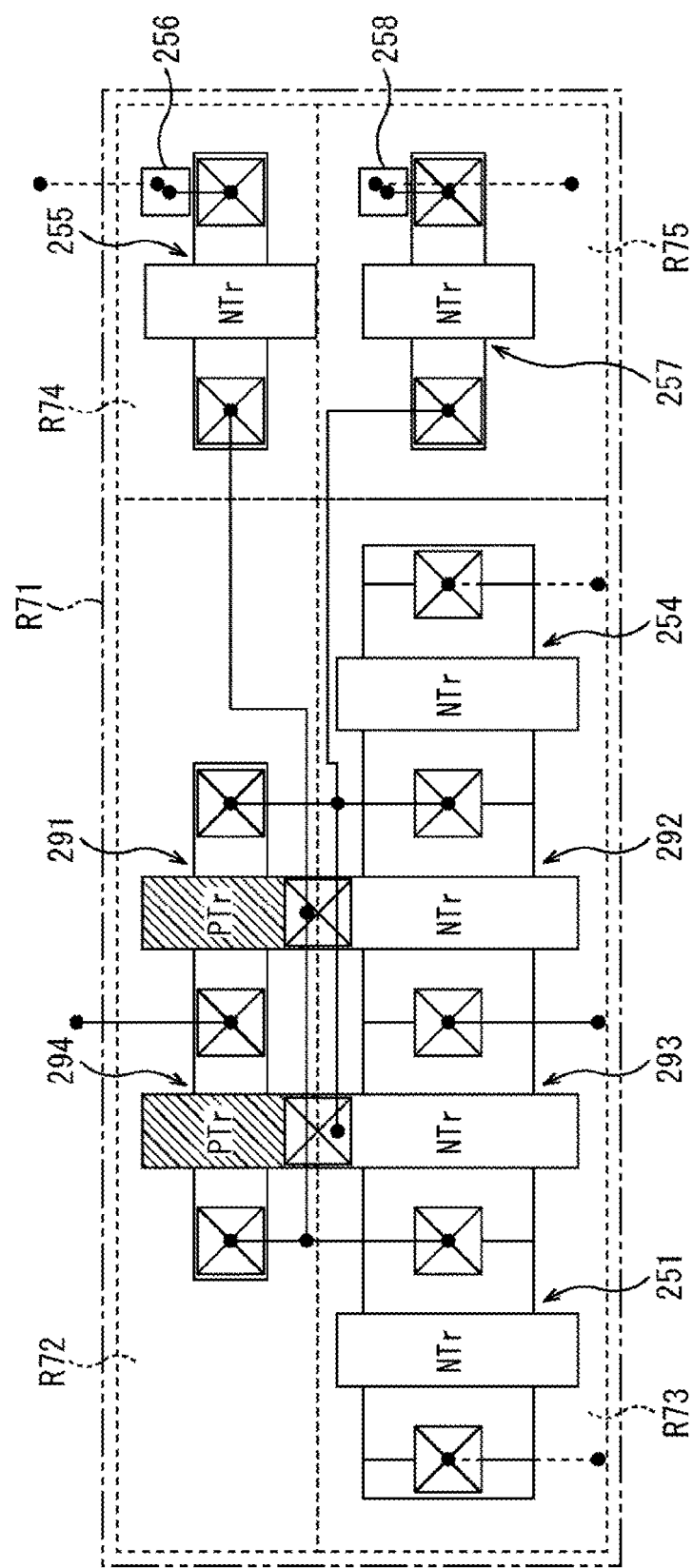
FIG. 27 is a view depicting an example of arrangement of the transistors.

Moreover, the arrangement of the transistors of the semiconductor device 211 may adopt the arrangement, for example, depicted in FIG. 27. It should be noted that in FIG. 27, portions corresponding to those in the case of FIG. 10 are assigned the same reference signs, and a description thereof is suitably omitted herein.

In the example depicted in FIG. 27, a region R71 of the cell of the SRAM becomes a rectangular region which is long in the transverse direction in the figure. The region R71 is separated into a top left region R72 in the figure, a bottom left region R73 in the figure, a top right region R74 in the figure, and a bottom right region R75 in the figure.

For example, a portion of the semiconductor layer 340 in the semiconductor substrate 335 within the region R72 includes an n-type well, and a portion of the semiconductor layer 340 in the semiconductor substrate 335 within the region R73 to the region R75 includes a p-type well.

For this reason, the transistor 291 and the transistor 294 each being the pMOS transistor are arranged within the region R72. On the other hand, the transistor 251, the transistor 293, the transistor 292, and the transistor 254 each being the nMOS transistor are arranged within the region R73.

In addition, the selection transistor 255 as the nMOS transistor, and the MTJ 256 are arranged within the region R74, and the selection transistor 257 as the nMOS transistor, and the MTJ 258 are arranged within the region R75.

For example, in the figure, in the region R72 and the region R74 which are arranged side by side adjacent to each other in the transverse direction, the transistor 294, the transistor 291, and the selection transistor 255 are arranged in such a way that the gate electrodes of these transistors are arranged side by side in the transverse direction in parallel to one another in the figure. In this example, the transistor 294, the transistor 291, and the selection transistor 255 are arranged in such a way that the longer direction of the gate electrodes of these transistors becomes the longitudinal direction in the figure, in a word, the paired diffusion regions of the transistors are arranged side by side in the transverse direction in the linear fashion in the figure.

Here, the direction in which the gate electrodes of the transistor 294, the transistor 291, and the selection transistor 255 are arranged side by side becomes the direction which is approximately vertical to the direction in which the region R72 and the region R74, and the region R73 and the region R75 are arranged side by side.

Likewise, in the region R73 and the region R75 adjacent to each other, the transistor 251, the transistor 293, the transistor 292, the transistor 254, and the selection transistor 257 are arranged in such a way that the gate electrodes of these transistors are arranged side by side in the transverse direction in parallel to one another in the figure. In this example, the transistor 251, the transistor 293, the transistor 292, the transistor 254, and the selection transistor 257 are arranged in such a way that the longer direction of the gate electrodes of these transistors becomes the longitudinal direction in the figure, in a word, the paired diffusion regions of these transistors are arranged side by side in the transverse direction in the linear fashion in the figure.

Here, the direction in which the gate electrodes of the transistor 251, the transistor 293, the transistor 292, the transistor 254, and the selection transistor 257 are arranged side by side becomes the direction which is approximately vertical to the direction in which the region R72 and the region R74, and the region R73 and the region R75 are arranged side by side.

In addition, in the region R71, the transistor 251, the transistor 291 to the transistor 294, and the transistor 254 configuring the volatile logic circuit 221 are collectively arranged in the left side region of the region R71 in the figure. The selection transistor 255 and the selection transistor 257 are arranged in the right region of these transistors in the figure.

In other words, the selection transistor 255 and the selection transistor 257 are arranged in a region adjacent in a direction approximately vertical to the direction in which the region R72 having the n-type well region and the region R73 having the p-type well region are arranged side by side to the region in which the transistors configuring the volatile logic circuit 221 in the region R71 are arranged.

Moreover, the transistors are arranged within the region R71 in such a way that the gate electrodes of all the transistors become parallel to one another.

In addition, in this example as well, the transistors are arranged on the principal surface 336 side of the semiconductor substrate 335, and the MTJ 256 and the MTJ 258 are arranged on the back surface 337 side of the semiconductor substrate 335. Incidentally, with regard to the method of connecting the MTJ 256 and the MTJ 258, and the selection transistor 255 and the selection transistor 257 to each other, any method such as the method depicted in FIG. 11 or FIG. 23 may be adopted.

<Modified Change 7 of Second Embodiment>
<Example of Layout of Transistors>

Figure 28:
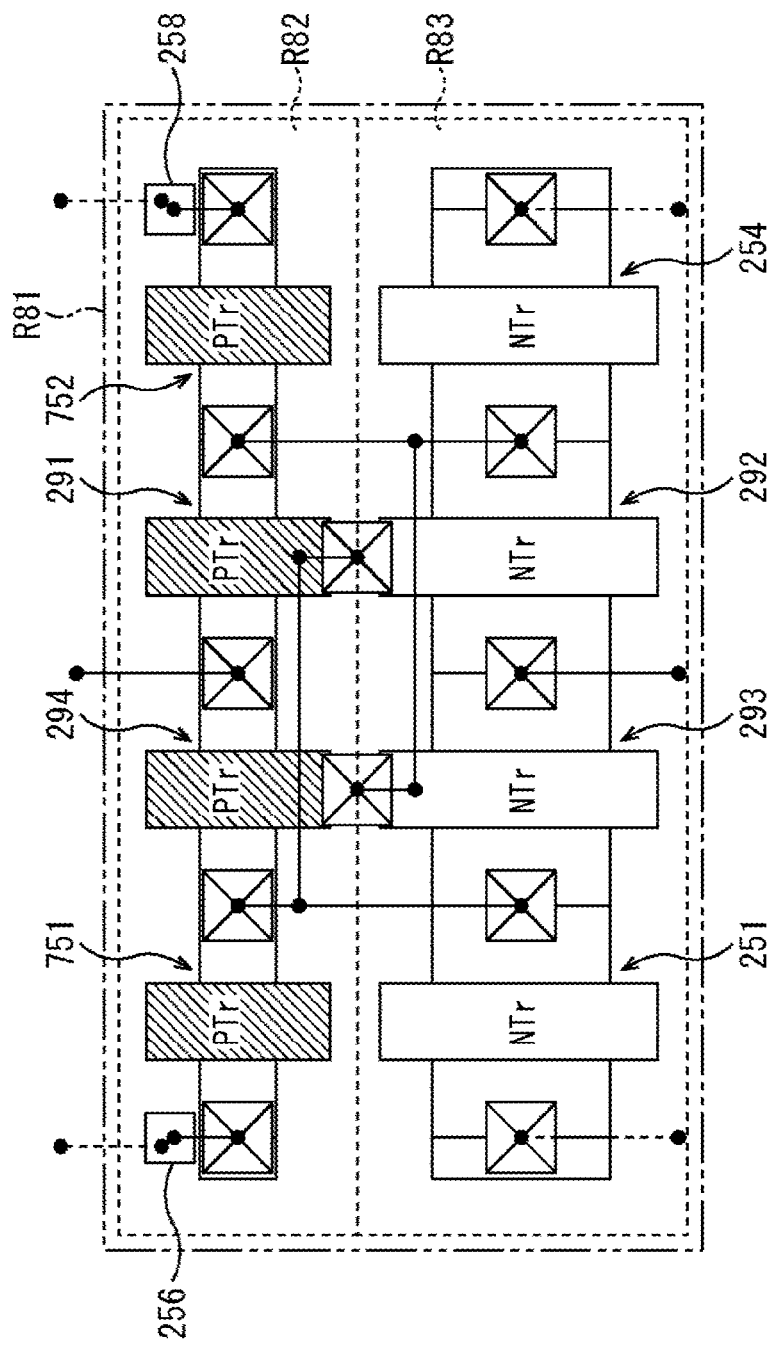
FIG. 28 is a view depicting an example of arrangement of the transistors.

Moreover, the arrangement of the transistors of the semiconductor device 211 may adopt the arrangement, for example, depicted in FIG. 28. It should be noted that in FIG. 28, portions corresponding to those in the case of FIG. 10 are assigned the same reference signs, and a description thereof is suitably omitted herein.

In the example depicted in FIG. 28, a region R81 of the cell of the SRAM becomes a rectangular region which is long in the transverse direction in the figure. The region R81 is separated into an upper side region R82 in the figure, and a lower side region R83 in the figure.

For example, a portion of the semiconductor layer 340 in the semiconductor substrate 335 within the region R82 includes an n-type well, and a portion of the semiconductor layer 340 in the semiconductor substrate 335 within the region R83 includes a p-type well.

In addition, in the example depicted in FIG. 28, instead of the selection transistor 255 and the selection transistor 257 in FIG. 10, a selection transistor 751 and a selection transistor 752 each being the pMOS transistor are provided.

The MTJ 256 is connected to one diffusion region of the selection transistor 751 through the contact and the like. In addition, the diffusion regions of the transistor 251, the transistor 293, and the transistor 294, and the gate electrodes of the transistor 291 and the transistor 292 are connected to the other diffusion region of the selection transistor 751.

Likewise, the MTJ 258 is connected to one diffusion region of the selection transistor 752 through the contact and the like. In addition, the diffusion regions of the transistor 254, the transistor 291, and the transistor 292, and the gate electrodes of the transistor 293 and the transistor 294 are connected to the other diffusion region of the selection transistor 752.

The selection transistor 751, the transistor 294, the transistor 291, and the selection transistor 752 each being the pMOS transistor, and the MTJ 256 and the MTJ 258 are arranged within the region R82.

On the other hand, the transistor 251, the transistor 293, the transistor 292, and the transistor 254 each being the nMOS transistor are arranged within the region R83.

For example, in the region R82, the selection transistor 751, the transistor 294, the transistor 291, and the selection transistor 752 are arranged in such a way that the gate electrodes of these transistors are arranged side by side in the transverse direction in parallel to one another in the figure. In this example, the selection transistor 751, the transistor 294, the transistor 291, and the selection transistor 752 are arranged in such a way that the longer direction of the gate electrodes of these transistors becomes the longitudinal direction in the figure, in a word, these transistors are arranged in such a way that the paired diffusion regions of these transistors are arranged side by side in the transverse direction in the linear fashion in the figure. Here, the direction in which the gate electrodes are arranged side by side becomes the direction which is approximately vertical to the direction in which the region R82 and the region R83 are arranged side by side.

Likewise, in the region R83, the transistor 251, the transistor 293, the transistor 292, and the transistor 254 are arranged in such a way that the gate electrodes of these transistors are arranged side by side in the transverse direction in parallel to each other in the figure. In this example, the transistor 251, the transistor 293, the transistor 292, and the transistor 254 are arranged in such a way that the longer direction of the gate electrodes of these transistors becomes the longitudinal direction in the figure, in a word, the transistors are arranged in such a way that the paired diffusion regions of the transistors are arranged side by side in the transverse direction in the linear fashion in the figure. Here, the direction in which the gate electrodes are arranged side by side becomes the direction which is approximately vertical to the direction in which the region R82 and the region R83 are arranged side by side.

Within the region R81, the transistors are arranged in such a way that the gate electrodes of all the transistors become parallel to one another. Moreover, within the region R82, the selection transistor 751 and the selection transistor 752 are arranged in respective end positions of the region in which the transistor 291 and the transistor 294 are arranged.

In addition, in this example as well, the transistors are arranged on the principal surface 336 side of the semiconductor substrate 335, and the MTJ 256 and the MTJ 258 are arranged on the back surface 337 side of the semiconductor substrate 335. Incidentally, with regard to the method of connecting the MTJ 256 and the MTJ 258, and the selection transistor 751 and the selection transistor 752 to each other, any method such as the method similar to the method, for example, depicted in FIG. 11 or FIG. 23 may be adopted.

<Modified Change 8 of Second Embodiment>
<Example of Layout of Transistors>

Figure 29:
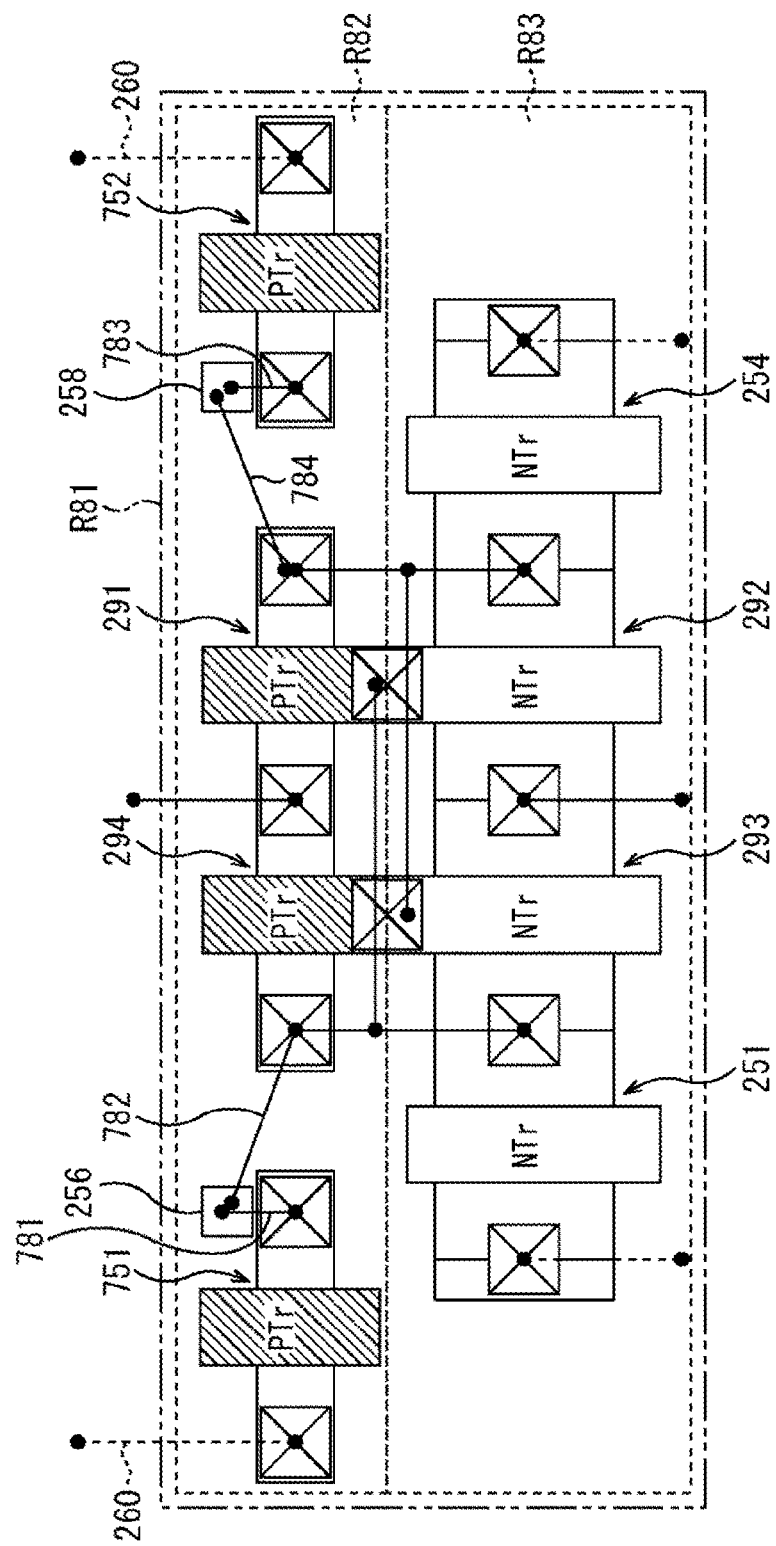
FIG. 29 is a view depicting an example of arrangement of the transistors.

Moreover, the arrangement of the transistors of the semiconductor device 211 may adopt the arrangement, for example, depicted in FIG. 29. It should be noted that in FIG. 29, portions corresponding to those in the case of FIG. 10 or FIG. 28 are assigned the same reference signs, and a description thereof is suitably omitted herein.

The arrangement of the transistors depicted in FIG. 29 is the arrangement same as the arrangement of the transistors depicted in FIG. 28. However, the example of FIG. 29 is different from the example depicted in FIG. 28 in the connection relation of the selection transistor 751 and the selection transistor 752 with other transistors.

The control line 260 is connected to one diffusion region of the selection transistor 751, and the MTJ 256 is connected to the other diffusion region of the selection transistor 751 through the contact, a wiring 781 and the like. In particular, in this example, the other diffusion region of the selection transistor 751 is connected to the pin layer of the MTJ 256 through the contact or the like through which the principal surface 336 side and the back surface 337 side of the semiconductor substrate 335 are connected to each other. Therefore, in this example, the selection transistor 751 is not directly connected to other transistors such as the transistor 294, and electrically connects the control line 260 and the MTJ 256 to each other in accordance with the ON/OFF control.

In addition, the free layer of the MTJ 256 is connected to the diffusion regions of the transistor 251, the transistor 293, the transistor 294, and the gate electrodes of the transistor 291 and the transistor 292 through the wiring 782, the contact through which the principal surface 336 side and the back surface 337 side of the semiconductor substrate 335 are connected to each other, and the like.

Likewise, the control line 260 is connected to one diffusion region of the selection transistor 752, and the MTJ 258 is connected to the other diffusion region of the selection transistor 752 through the contact, a wiring 783 and the like. In particular, in this example, the other diffusion region of the selection transistor 752 is connected to the pin layer of the MTJ 258 through the contact or the like through which the principal surface 336 side and the back surface 337 side of the semiconductor substrate 335 are connected to each other. Therefore, in this example, the selection transistor 752 is not directly connected to other transistors such as the transistor 291, and electrically connects the control line 260 and the MTJ 258 to each other in accordance with the ON/OFF control.

In addition, the free layer of the MTJ 258 is connected to the diffusion regions of the transistor 254, the transistor 291, the transistor 292, and the gate electrodes of the transistor 293 and the transistor 294 through the wiring 784, the contact through which the principal surface 336 side and the back surface 337 side of the semiconductor substrate 335 are connected to each other, and the like.

Incidentally, in this example as well, the transistors are arranged on the principal surface 336 side of the semiconductor substrate 335, and the MTJ 256 and the MTJ 258, and the control line 260 are arranged on the back surface 337 side of the semiconductor substrate 335.

Third Embodiment

<Increase in Circuit Area>

Incidentally, WO2009/028298 mentioned in the second embodiment proposes the configuration in which the MTJs are added to each of the two storage nodes of the flip flop circuit (hereinafter referred to as the FF circuit) becoming the target of the NVPG through the selection transistor.

Figure 30:
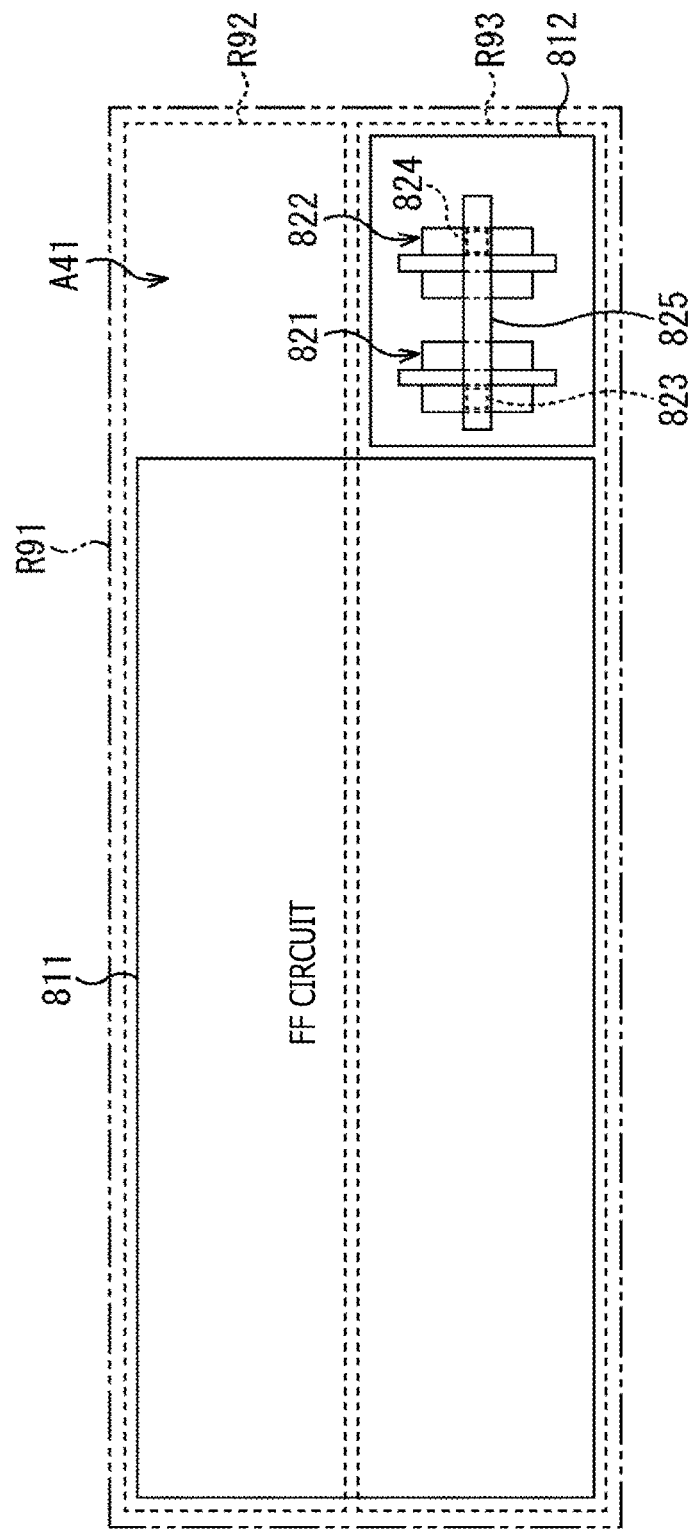
FIG. 30 is a view explaining arrangement of elements in a non-volatile storage element.

In this case, the configuration of one cell including the FF circuit, the MTJ, and the like of the non-volatile storage element, for example, is as depicted in FIG. 30.

In the example depicted in FIG. 30, a region R92 including an n-type well, and a region R93 including a p-type well are provided in a region R91 of one cell. In this example, an upper half of the region R91 in the figure is set as the region R92, and a lower half of the region R91 in the figure is set as the region R93. In a word, the region R91 is equally divided into the region R92 including the n-type well, and the region R93 including the p-type well.

An FF circuit 811 is provided on the left side of the region R91 in the figure. In addition, the pMOS transistor configuring the FF circuit 811 is arranged within the region R92 of the region R91, and the nMOS transistor configuring the FF circuit 811 is arranged within the region R93 of the region R91.

Moreover, an NVPG portion 812 connected to the FF circuit 811 is arranged within the region R93. A selection transistor 821 and a selection transistor 822 each being the nMOS transistor, an MTJ 823 and an MTJ 824, and a control line 825 are provided in the NVPG portion 812.

Here, the MTJ 823 and the MTJ 824 are connected to a storage node of the FF circuit 811 through the selection transistor 821 and the selection transistor 822, respectively. The control line 825 is a control line used to control the MTJ 823 and the MTJ 824.

In the case where in such arrangement, the FF circuit 811 and the NVPG portion 812 are arranged, nothing is arranged in a region of a portion indicated by an arrow A41 located in an upper side of the NVPG portion 812 in the region R92 in the figure. Thus, not only a useless empty region is generated, but also the area of the cell of the non-volatile storage element is increased all the more.

Then, in the present technology, even in the case where the NVPG is carried out, the more compact semiconductor device is enabled to be obtained.

<Example of Configuration of Semiconductor Device>

Hereinafter, the present technology will be more concretely described.

Figure 31:
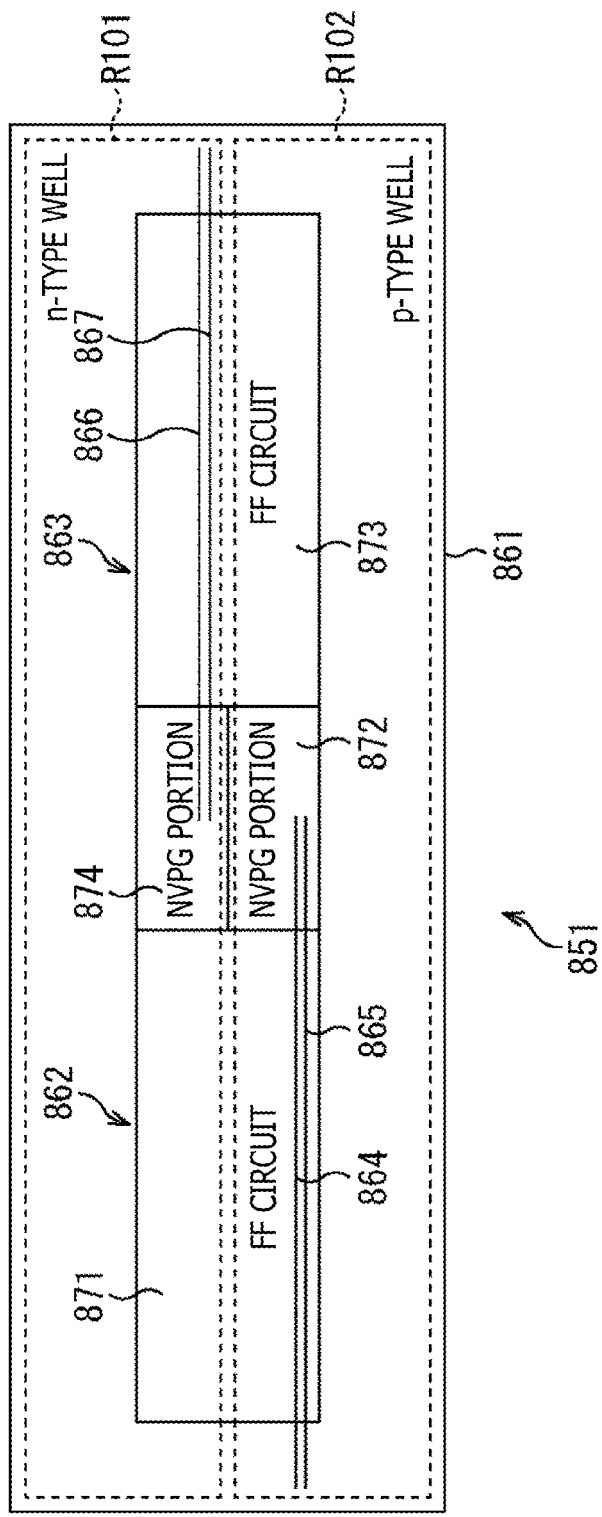
FIG. 31 is a view depicting an example of a configuration of a semiconductor device.

For example, a semiconductor device to which the present technology is applied is configured as depicted in FIG. 31.

A semiconductor device 851 depicted in FIG. 31 has a semiconductor substrate 861, and the semiconductor substrate 861 has a region R101 including an n-type well, and a region R102 including a p-type well.

For example, the semiconductor device 851 has a non-volatile storage element including a plurality of cells. In this example, the semiconductor substrate 861 is provided with two cells: a cell 862; and a cell 863 configuring the non-volatile storage element. It should be noted that although a description will be given with respect to the example in which the two cells: the cell 862; and the cell 863 are provided herein, three or more cells may be provided.

In addition, a control line 864 and a control line 865 are connected to the cell 862, and a control line 866 and a control line 867 are connected to the cell 863.

The cell 862 and the cell 863 are each a non-volatile circuit including a volatile logic circuit as a volatile storage element, a selection transistor connected to a storage node of the volatile logic circuit, and a non-volatile element connected to a storage node through the selection transistor.

The cell 862 includes an FF circuit 871 including a DFF as a volatile logic circuit, and an NVPG portion 872. Here, the FF circuit 871 is formed so as to stride the region R101 and the region R102, and the NVPG portion 872 is formed in the region R102.

The NVPG portion 872 has a selection transistor including an nMOS transistor, and an MTJ as a non-volatile element connected to a storage node within the FF circuit 871 through the selection transistor. A control line 864 is connected to the MTJ. In addition, a control line 865 is connected to a gate electrode of a selection transistor provided in the NVPG portion 872.

On the other hand, the cell 863 includes an FF circuit 873 including a DFF as a volatile logic circuit, and an NVPG portion 874. Here, the FF circuit 873 is formed so as to stride the region R101 and the region R102, and the NVPG portion 874 is formed in the region R101.

The NVPG portion 874 has a selection transistor including a pMOS transistor, and an MTJ as a non-volatile element connected to a storage node within the FF circuit 873 through the selection transistor. A control line 866 is connected to the MTJ. In addition, a control line 867 is connected to a gate electrode of a selection transistor provided in the NVPG portion 874.

In such a way, in the semiconductor device 851, the cell 862 provided with the NVPG portion 872 having the selection transistor including the nMOS transistor, and the cell 863 provided with the NVPG portion 874 having the selection transistor including the pMOS transistor are arranged alternately adjacent to each other.

As a result, the region of the empty portion generated in each of the cells can be effectively used. In other words, the empty space can be prevented from being generated, and the circuit can be finely configured. As a result, the circuit area of the semiconductor device 851 can be reduced. That is to say, the more compact semiconductor device 851 can be obtained.

In this example, an upper portion of the NVPG portion 872 configuring the cell 862 in the figure corresponds to the portion indicated by the arrow A41 of FIG. 30. However, in the semiconductor device 851, no empty region is generated because the NVPG portion 874 configuring the cell 863 is arranged in the region corresponding to the portion indicated by the arrow A41 of FIG. 30.

In such a manner, the cell 862 and the cell 863 are arranged adjacent to each other in such a way that the NVPG portion 872 and the NVPG portion 874 having the different kinds of selection transistors are alternately arranged in the p-type well region and the n-type well region. As a result, the semiconductor device 851 can be miniaturized.

<Examples of Configuration of Cell>

Subsequently, a description will be given with respect to an example of a more detailed configuration, and an operation of the cell 862 and the cell 863.

Figure 32:
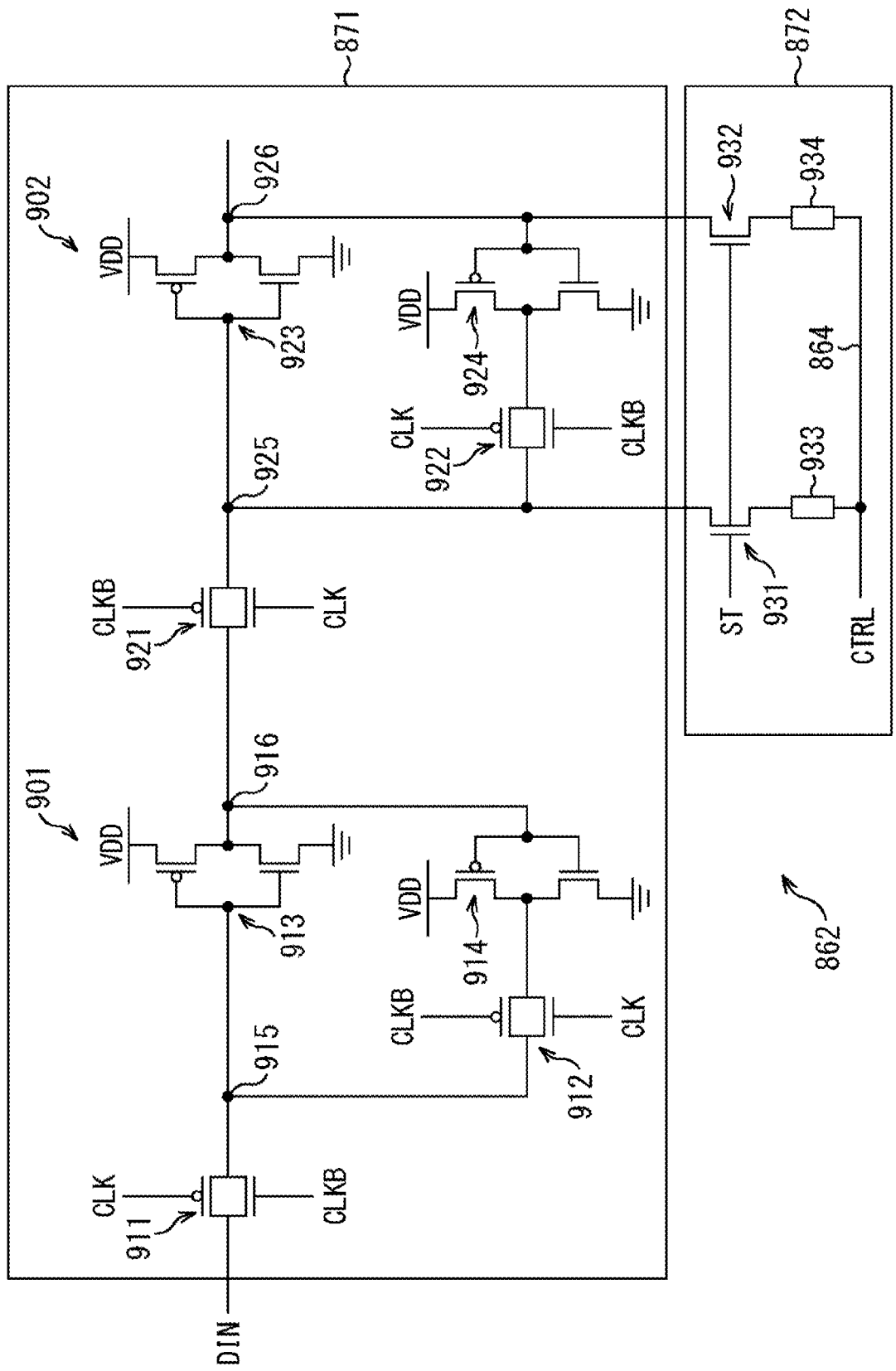
FIG. 32 is a diagram depicting an example of a configuration of a cell.

The cell 862, for example, is configured as depicted in FIG. 32 in more detail. It should be noted that in FIG. 32, portions corresponding to those in the case of FIG. 31 are assigned the same reference signs, and a description thereof is suitably omitted herein.

In the cell 862 depicted in FIG. 32, the FF circuit 871 includes a D-latch circuit 901 and a D-latch circuit 902.

The D-latch circuit 901 includes a pass gate 911, a pass gate 912, an inverter 913, and an inverter 914. In this example, a bi-stable circuit includes the inverter 913 and the inverter 914 which are connected to each other in a ring-like shape through the pass gate 912.

The pass gate 911 is connected to a storage node 915. When a clock signal CLK supplied to the pass gate 911 is set at a low level, the pass gate 911 becomes a conduction state. That is to say, the pass gate 911 is turned ON.

The pass gate 912 is connected between the storage node 915 and the inverter 914. When a clock signal CLK supplied to the pass gate 912 is set at a high level, the pass gate 912 becomes a conduction state. That is to say, the pass gate 912 is turned ON.

In addition, an input terminal of the inverter 913 is connected to the storage node 915, and an output terminal of the inverter 913 is connected to a storage node 916 and an input terminal of the inverter 914. In addition, an input terminal of the inverter 914 is connected to the storage node 916, and an output terminal of the inverter 914 is connected to the pass gate 912.

Moreover, the D-latch circuit 902 having the same configuration as that of the D-latch circuit 901 is connected to the storage node 916.

That is to say, the D-latch circuit 902 includes a pass gate 921, a pass gate 922, an inverter 923, and an inverter 924. In the D-latch circuit 902, a bi-stable circuit includes the inverter 923 and the inverter 924.

In addition, the D-latch circuit 902 has a storage node 925 and a storage node 926 corresponding to the storage node 915 and the storage node 916, respectively.

It should be noted that since the pass gate 921 to the inverter 924 correspond to the pass gate 911 to the inverter 914, respectively, and the connection relations of those are similar to each other, a description thereof is omitted herein.

However, in the D-latch circuit 902, when the clock signal CLK to be supplied to the pass gate 921 is set at the high level, the pass gate 921 becomes the conduction state. When the clock signal CLK to be supplied to the pass gate 922 is set at the low level, the pass gate 922 becomes the conduction state. In addition, in this example, the pass gate 921 of the D-latch circuit 902 is connected to the storage node 916.

Moreover, the NVPG portion 872 has a selection transistor 931 and a selection transistor 932 each being the nMOS transistor, and the MTJ 933 and the MTJ 934.

A free layer of the MTJ 933 is connected to a control line 864, and a pin layer of the MTJ 933 is connected to the storage node 925 through the selection transistor 931.

In addition, a free layer of the MTJ 934 is connected to the control line 864, and a pin layer of the MTJ 934 is connected to the storage node 926 through the selection transistor 932.

Moreover, a control signal ST is supplied to gate electrodes of the selection transistor 931 and the selection transistor 932 through the control line 865. When the control signal ST is set at the high level, the selection transistor 931 and the selection transistor 932 become the conduction state, in a word, are turned ON.

Next, a description will be given with respect to the operation of the cell 862 configured in the manner as described above.

For example, when the clock signal CLK is set at the low level, the pass gate 911 is turned ON and the pass gate 912 is turned OFF (becoming a non-conduction state). Therefore, "1" or "0" as the information inputted to the pass gate 911 is held in (written to) the storage node 915. In other words, the level of the storage node 915 is set at the high level or at the low level in response to the level on the input side of the pass gate 911.

Then, when the clock signal CLK is set at the high level, the pass gate 911 is turned OFF and the pass gate 912 is turned ON. As a result, the inputted information is held in the bi-stable circuit including the inverter 913 and the inverter 914.

In addition, when the clock signal CLK is set at the high level, the pass gate 921 is also turned ON. Therefore, the information held in the bi-stable circuit including the inverter 913 and the inverter 914 is also supplied to the bi-stable circuit including the inverter 923 and the inverter 924.

Then, when the clock signal CLK is set at the low level, the pass gate 921 is turned OFF and the pass gate 922 is turned ON. Therefore, the information supplied from the bi-stable circuit including the inverter 913 and the inverter 914 is held in the bi-stable circuit including the inverter 923 and the inverter 924. In a word, the information inputted to the D-latch circuit 901 is also held in the D-latch circuit 902. In other words, the information is held in the storage node 925 and the storage node 926 of the D-latch circuit 902.

Incidentally, more specifically, the information inputted to the D-latch circuit 901 is inverted to be held in the D-latch circuit 902. However, the information inputted to the D-latch circuit 901 is outputted from the D-latch circuit 902 to the subsequent stage as it is.

Subsequently, a description will be given with respect to the storage and the restorage of the information held in the storage node 925 and the storage node 926 in such a manner.

Firstly, a description will be given with respect to the storage operation which is carried out when the storage node 925 is at the high level, and the storage node 926 is at the low level, that is to say, when "1" is held as the information in the storage node 925, and "0" is held as the information in the storage node 926.

In this case, the control signal ST is set at the high level to turn ON the selection transistor 931 and the selection transistor 932, and the clock signal CLK is set as the low level to turn ON the pass gate 922. In addition, the voltage at the low level is applied to the control line 864. In a word, the control line 864 is set at "0."

Then, since the storage node 925 is at the high level, the current is caused to flow from the selection transistor 931 to the control line 864 through the MTJ 933, so that the MTJ 933 becomes the high resistance state. As a result, the information "1" is stored in the MTJ 933. At this time, since the storage node 926 is at the low level, no current is caused to flow through the MTJ 934.

Thereafter, when the control line 864 is set at the high level, in a word, the voltage applied to the control line 864 is changed from the low level to the high level, the current is caused to flow from the control line 864 to the selection transistor 932 through the MTJ 934, so that the MTJ 934 becomes the low resistance state. As a result, the information "0" is stored in the MTJ 934. At this time, since the storage node 925 is at the high level, no current is caused to flow through the MTJ 933.

From the above operation, the information held in the storage node 925 and the storage node 926 is stored in the MTJ 933 and the MTJ 934.

It should be noted that although a description has been given with respect to the example in which after the control line 864 is set at the low level, the level is changed over to the high level, the order of changing the voltage applied to the control line 864 may be reversed. That is to say, after the control line 864 may be set at the high level, the level may be changed over to the low level. In addition, since the storage operation in a state in which the storage node 925 is at the low level and the storage node 926 is at the high level is similar to that of the above case, a description thereof is omitted herein.

Next, a description will be given with respect to the restorage operation, in a word, the logic return of the FF circuit 871.

It is assumed that, for example, the information "1" is stored in the MTJ 933, and the information "0" is stored in the MTJ 934.

In this case, in a state in which the clock signal CLK is set at the low level to turn ON the pass gate 922, the control signal ST is set at the high level to turn ON the selection transistor 931 and the selection transistor 932. In addition, the voltage at the low level is applied to the control line 864. In other hands, the control line 864 is set at the ground level, in a word, set at "0."

In such a state, when the power source voltage VDD is changed from the low level over to the high level, since the storage node 925 and the storage node 926 are set at the low level, the current is caused to flow from the inverter 924 to the storage node 925, and the current is also caused to flow from the inverters 923 to the storage node 926.

Since in this state, the MTJ 933 is in the high resistance state, the current caused to flow from the storage node 925 to the control line 864 is small. On the other hand, since the MTJ 934 is in the low resistance state, the current caused to flow from the storage node 926 to the control line 864 is large. In addition, in a state in which the voltage of the storage node 925 is larger than the voltage of the storage node 926 due to a difference between the current caused to flow through the MTJ 933 and the current caused to flow through the MTJ 934, in a word, a difference in electrical resistance, the voltages of these storage nodes rise.

Then, the output from the inverter 923 is inverted from the high level to the low level. As a result, the storage node 925 becomes the high level state, and the storage node 926 becomes the low level state. That is to say, the information "1" is held in the storage node 925, and the information "0" is held in the storage node 926, thereby completing the restorage of the information.

Incidentally, since the restorage operation in a state in which the information "0" is stored in the MTJ 933, and the information "1" is stored in the MTJ 934 is similar to that of the above case, a description thereof is omitted herein.

Next, a description will be given with respect to the more detailed configuration and operation of the cell 863.

Figure 33:
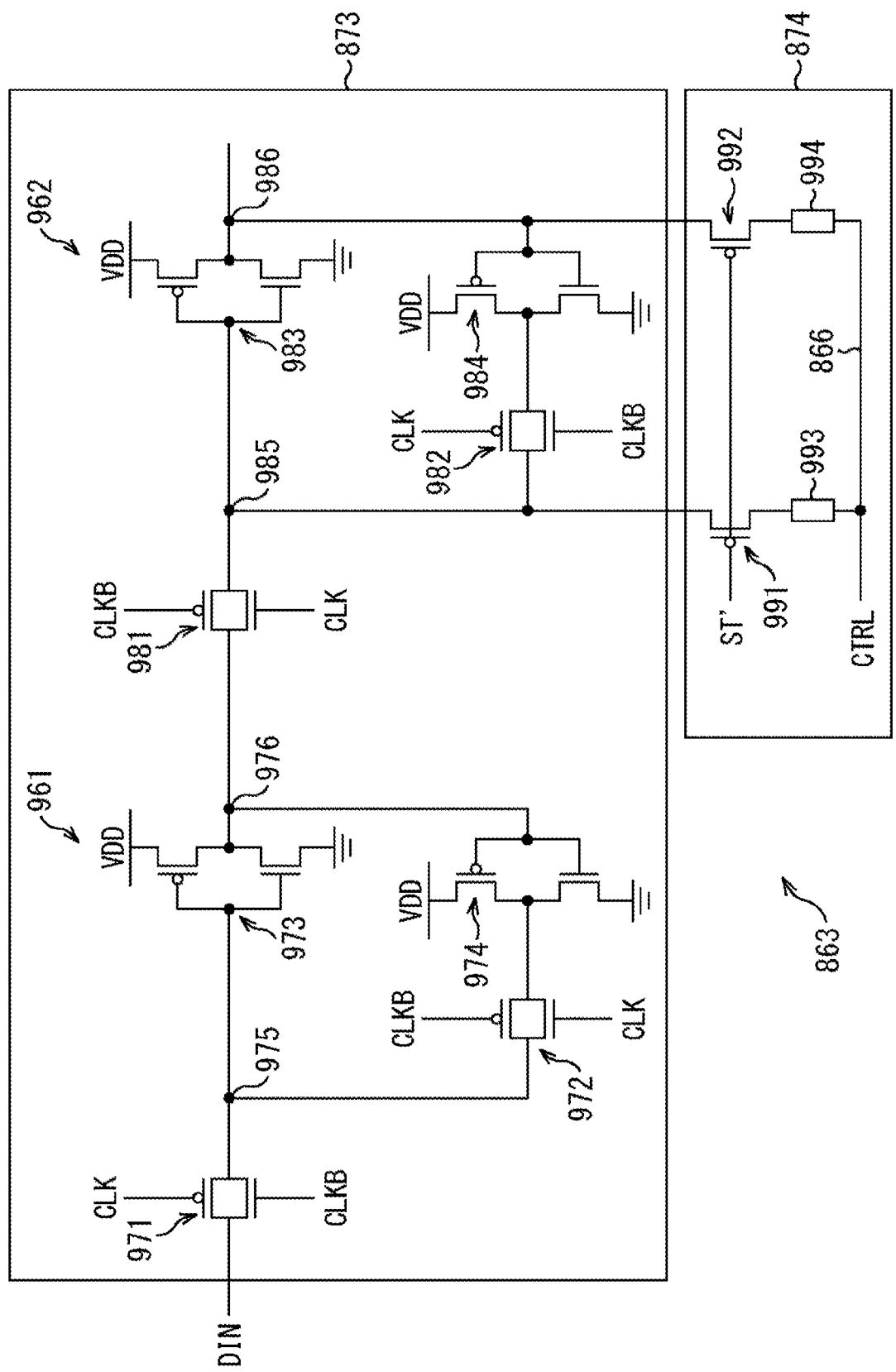
FIG. 33 is a diagram depicting an example of a configuration of a cell.

The cell 863, more specifically, for example, is configured as depicted in FIG. 33. It should be noted that in FIG. 33, portions corresponding to those in the case of FIG. 31 are assigned the same reference signs, and a description thereof is suitably omitted herein.

In the cell 863 depicted in FIG. 33, the FF circuit 873 includes a D-latch circuit 961 and a D-latch circuit 962.

The D-latch circuit 961 includes a pass gate 971, a pass gate 972, an inverter 973, and an inverter 974. Incidentally, since the pass gate 971 to the inverter 974 correspond to the pass gate 911 to the inverter 914 depicted in FIG. 32, respectively, and the connection relation and operation of those depicted in FIG. 33 are similar to those depicted in FIG. 32, a description thereof is omitted herein.

In addition, in the D-latch circuit 961, the pass gate 971, the pass gate 972, and the inverter 973 are connected to a storage node 975. The inverter 973 and the inverter 974 are connected to a storage node 976.

Moreover, the D-latch circuit 962 having the same configuration as that of the D-latch circuit 961 is connected to the storage node 976.

That is to say, the D-latch circuit 962 includes a pass gate 981, a pass gate 982, an inverter 983, and an inverter 984. In addition, the D-latch circuit 962 has a storage node 985 and a storage node 986.

Incidentally, since the pass gate 981 to the storage node 986 correspond to the pass gate 921 to the storage node 926 depicted in FIG. 32, respectively, and the connection relation and operation of those depicted in FIG. 33 are similar to those depicted in FIG. 32, a description thereof is omitted herein.

However, in the D-latch circuit 962, the nMOS transistor configuring the inverter 983 and the nMOS transistor configuring the inverter 984 are each connected to the ground through an nMOS transistor (not depicted) for functioning as a power switch. Then, the power switch is turned OFF, so that the inverter 983 and the inverter 984 are electrically disconnected from the ground, thereby realizing the PG. It should be noted that this also applies to the inverter 973 and the inverter 974.

Moreover, the NVPG portion 874 has a selection transistor 991 and a selection transistor 992 each being a pMOS transistor, and an MTJ 993 and an MTJ 994.

A pin layer of the MTJ 993 is connected to the control line 866, and a free layer of the MTJ 993 is connected to the storage node 985 through the selection transistor 991. In addition, a pin layer of the MTJ 994 is connected to the control line 866, and a free layer of the MTJ 994 is connected to the storage node 986 through the selection transistor 992.

In this manner, the connection relation between the MTJ and the control line 866 is different from that in the case depicted in FIG. 32. For this reason, the information can be prevented from being inverted at the time of the restorage.

Moreover, a control signal ST' is supplied to the gate electrodes of the selection transistor 991 and the selection transistor 992 through the control line 867. When the control signal ST' is set at the low level, the selection transistor 991 and the selection transistor 992 become the conduction state, in a word, are turned ON.

Next, a description will be given with respect to the operation of the cell 863 configured in the manner as described above.

It should be noted that since the operation at the time of the writing of the information from the outside to the cell 863 is similar to that in the case in the cell 862 described above, a description thereof is omitted herein.

Firstly, the storage operation will be described. In this case, a description will now be given with respect to the storage operation which is carried out when, for example, the storage node 985 is at the high level, and the storage node 986 is at the low level, that is, "1" is held as the information in the storage node 985, and "0" is held as the information in the storage node 986.

In this case, the control signal ST' is set at the low level to turn ON the selection transistor 991 and the selection transistor 992, and the clock signal CLK is set at the low level to turn ON the pass gate 982. In addition, the voltage at the low level is applied to the control line 866. In a word, the control line 866 is set at "0."

Then, since the storage node 985 is at the high level, the current is caused to flow from the selection transistor 991 to the control line 866 through the MTJ 993, so that the MTJ 993 becomes the low resistance state. As a result, the information "0" is stored in the MTJ 993. That is to say, the information held in the storage node 985 is inverted, and the inverted information is stored in the MTJ 993. At this time, since the storage node 986 is at the low level, no current is caused to flow through the MTJ 994.

Thereafter, when the control line 866 is set at the high level, in a word, the voltage applied to the control line 866 is switched from the low level to the high level, the current is caused to flow from the control line 866 to the selection transistor 992 through the MTJ 994, so that the MTJ 994 becomes the high resistance state. As a result, the information "1" is stored in MTJ 994. That is to say, the information held in the storage node 986 is inverted, and the inverted information is stored in the MTJ 994. At this time, since the storage node 985 is at the high level, no current is caused to flow through the MTJ 993.

From the above operation, the information held in the storage node 985 and the storage node 986 is inverted, and the inverted information is stored in the MTJ 993 and the MTJ 994.

It should be noted that also in this example, the order of changing the voltage applied to the control line 866 may be reversed. In addition, since the storage operation in a state in which the storage node 985 is set at the low level and the storage node 986 is set at the high level is similar to that in the above case, a description thereof is omitted herein.

Next, a description will be given with respect to the restorage operation, in a word, the logic return of the FF circuit 873.

It is assumed that, for example, the information "0" is stored in the MTJ 933, and the information "1" is stored in the MTJ 994.

In this case, in a state in which the clock signal CLK is set at the low level to turn ON the pass gate 982, the control signal ST' is set at the low level to turn ON the selection transistor 991 and the selection transistor 992. In addition, the voltage at the high level is applied to the control line 866. In a word, the control line 866 is set at the power source voltage level, in a word, set at "1."

Incidentally, in the sleep state by the PG, in a word, in a state in which the power source is kept OFF, the current path to the ground is cut off. Therefore, the level (voltage) of the storage node 985 and the storage node 986 rises to the level close to the power source voltage.

When in such a state, the power switch connected to the inverter 983 and the inverter 984 is turned ON, the voltage of the ground is supplied to the D-latch circuit 962. Therefore, the current is caused to flow from the control line 866 to the storage node 985 through the MTJ 993. Likewise, the current is caused to flow from the control line 866 to the storage node 986 through the MTJ 994.

Since in this example, the MTJ 993 is in the low resistance state, the current caused to flow from the control line 866 to the storage node 985 is large. Country to this, since the MTJ 994 is in the high resistance state, the current caused to flow from the control line 866 to the storage node 986 is small.

Therefore, owing to a difference between the current caused to flow through the MTJ 993 and the current caused to flow through the MTJ 994, in a word, a difference in electrical resistance, the voltage of the storage node 986 becomes smaller than the voltage of the storage node 985. As a result, the positive feedback is carried out through a loop including the inverter 983 and the inverter 984. As a result, the storage node 985 becomes the high level state, and the storage node 986 becomes the low level state.

That is to say, the information "0" stored in the MTJ 993 is inverted, and the information "1" obtained by the inversion is held in the storage node 985. Moreover, the information "1" stored in the MTJ 994 is inverted, and the information "0" obtained by the inversion is held in the storage node 986. As a result, the information "1" is held in the storage node 985 and the information "0" is held in the storage node 986, thereby completing the restorage of the information.

It should be noted that since the restorage operation in the state in which the information "1" is stored in the MTJ 993 and the information "0" is stored in the MTJ 994 is also similar to the above case, a description thereof is omitted herein.

<Example of Arrangement of Elements>

Figure 34:
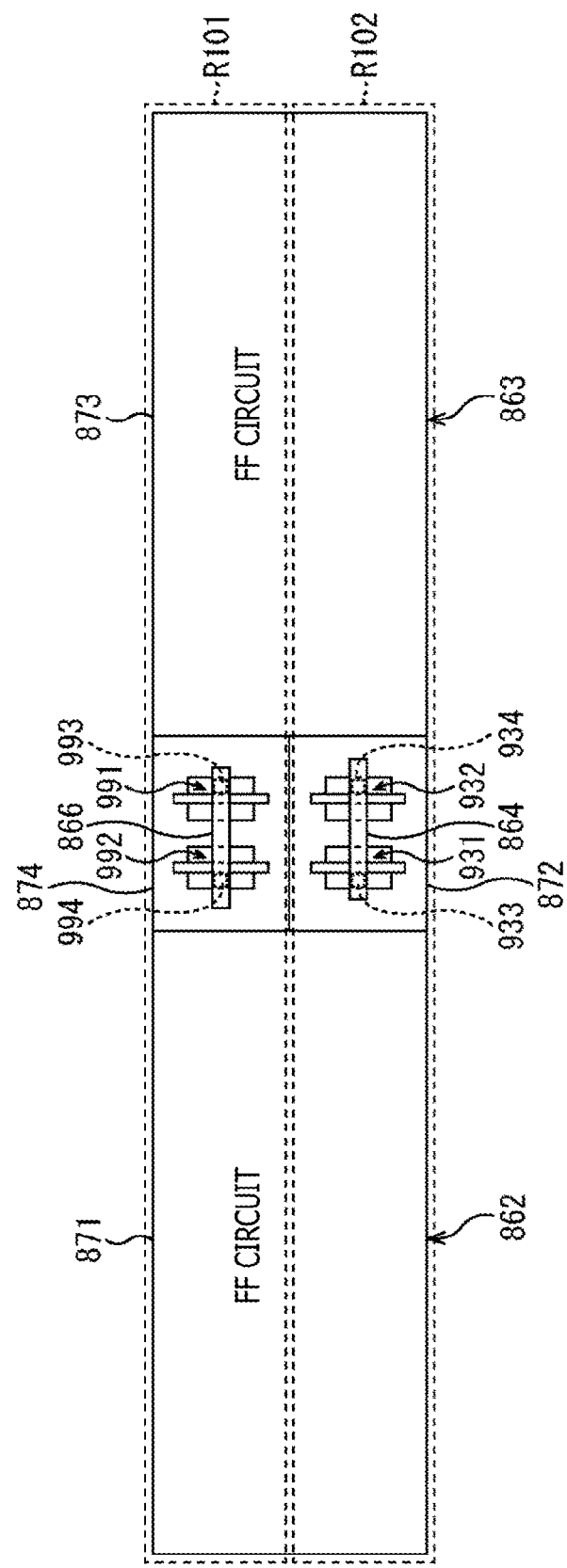
FIG. 34 is a view explaining arrangement of cells.

In the case where the cell 862 and the cell 863 which are provided in the semiconductor device 851 depicted in FIG. 31 as described above adopt the circuit configurations depicted in FIG. 32 and FIG. 33, respectively, it is only necessary that the elements in the NVPG portion, for example, adopt the arrangement depicted in FIG. 34. It should be noted that in FIG. 34, portions corresponding to those in any one of cases in FIG. 31 to FIG. 33 are assigned the same reference signs, and a description thereof is suitably omitted herein.

In the example depicted in FIG. 34, the NVPG portion 872 is arranged in the region R102, and the selection transistor 931 and the selection transistor 932 each being the nMOS transistor, and the MTJ 933 and the MTJ 934 connected to the respective selection transistors are arranged within the NVPG portion 872.

On the other hand, the NVPG portion 874 is arranged in the region R101, and the selection transistor 991 and the selection transistor 992 each being the pMOS transistor, and the MTJ 993 and the MTJ 994 connected to the respective selection transistors are arranged within the NVPG portion 874.

As described above, the voltages applied to the control lines, in a word, to the MTJs at the time of the restorage are different between the cell 862 and the cell 863. Therefore, the control lines need to be individually provided for the cell 862 and the cell 863. Then, in the semiconductor device 851, the control line 864 is connected to the MTJ 933 and the MTJ 934 within the cell 862, and the control line 866 is connected to the MTJ 993 and the MTJ 994 within the cell 863.

In addition, the voltages applied to the respective selection transistors are different between the cell 862 and the cell 863. For this reason, for the selection transistor 931 and the selection transistor 932 within the cell 862, and the selection transistor 991 and the selection transistor 992 within the cell 863, the control lines connected to the gate electrodes of these selection transistors are individually provided.

That is to say, although not illustrated herein, the control line 865 depicted in FIG. 31 is connected to the gate electrodes of the selection transistor 931 and the selection transistor 932. In addition, the control line 867 depicted in FIG. 31 is connected to the gate electrodes of the selection transistor 991 and the selection transistor 992.

<Modified Change 1 of Third Embodiment>
<Back Surface Side Arrangement of MTJs and Control Lines>

In addition, the semiconductor device 851 can be further miniaturized.

Since in the cell of the non-volatile storage element, for example, depicted in FIG. 30, the MTJ 823 and the MTJ 824 are low in heat resistance, the MTJ 823 and the MTJ 824 need to be formed in the vicinity of the uppermost layer. In this case, as described above, for example, with reference to FIG. 7, other wiring cannot be arranged in the region of the via and the wiring used to draw the MTJ up to the upper layer, in a word, in the region of the stack via. In addition, other wiring cannot be arranged in a portion as well of the control line 825. As a result, the circuit area of the nonvolatile storage element becomes large.

Then, in the semiconductor device 851 as well, similarly to the case of the second embodiment, the MTJs are arranged on the back surface side of the semiconductor substrate, thereby enabling the semiconductor device 851 to be further miniaturized.

Figure 35:
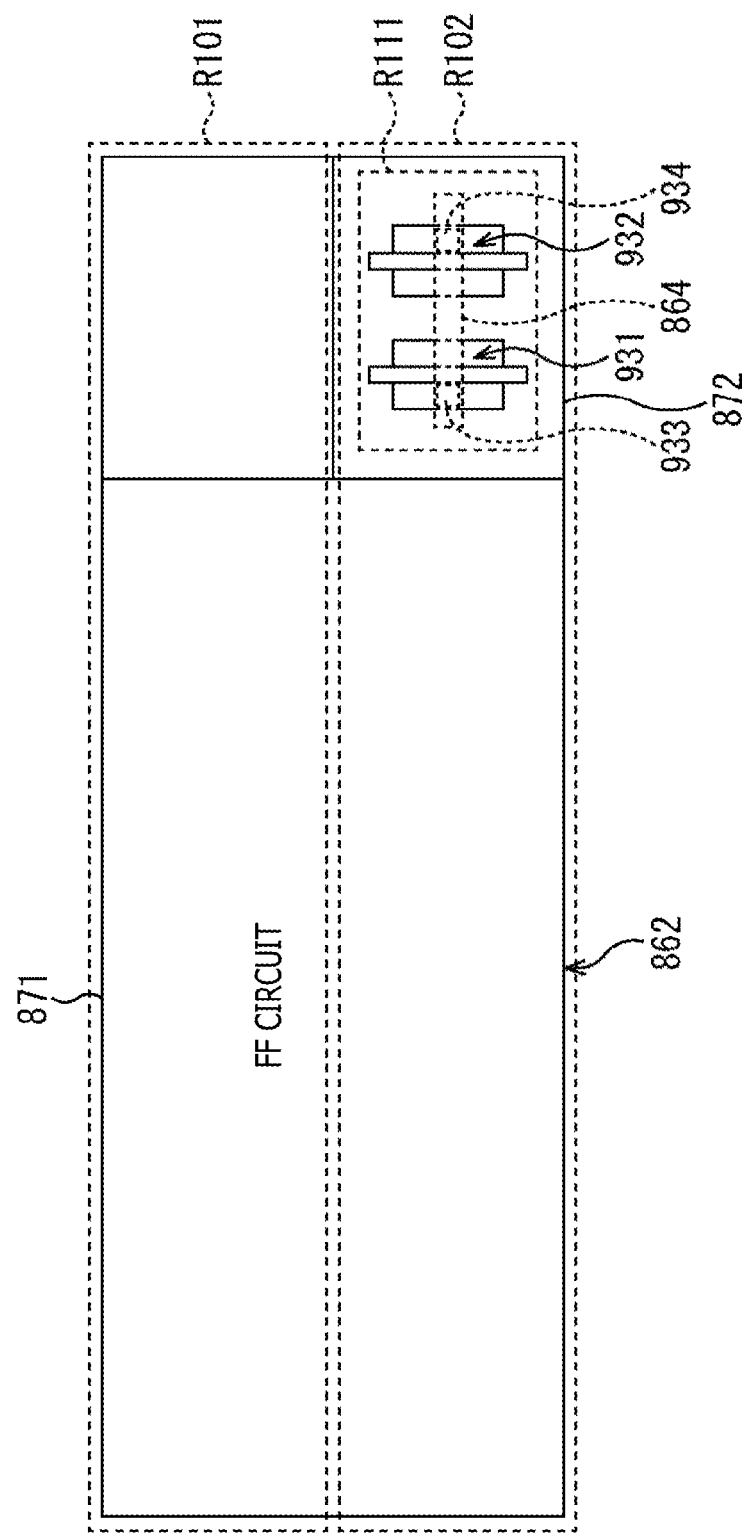
FIG. 35 is a view explaining arrangement of elements in a cell.

In this case, the arrangement of the elements in the NVPG portion 872 of the cell 862, for example, is as depicted in FIG. 35. It should be noted that in FIG. 35, portions corresponding to those in the case of FIG. 34 are assigned the same reference signs, and a description thereof is suitably omitted herein.

FIG. 35 is a view when the NVPG portion 872 of the cell 862 is viewed from the principal surface side of the semiconductor substrate 861 configuring the semiconductor device 851. In this example, the selection transistor 931 and the selection transistor 932 are formed on the principal surface side of the semiconductor substrate 861.

In addition, since the MTJ 933, the MTJ 934, and the control line 864 are arranged on the back surface side of the semiconductor substrate 861, the MTJ 933, the MTJ 934, and the control line 864 are drawn by a dotted line.

Therefore, an arbitrary wiring can be arranged in a portion on this side of the selection transistor 931 and the selection transistor 932 in a region R111 in the figure on the principal surface side of the semiconductor substrate 861 configuring the semiconductor device 851. As a result, the semiconductor device 851 can be miniaturized.

Figure 36:
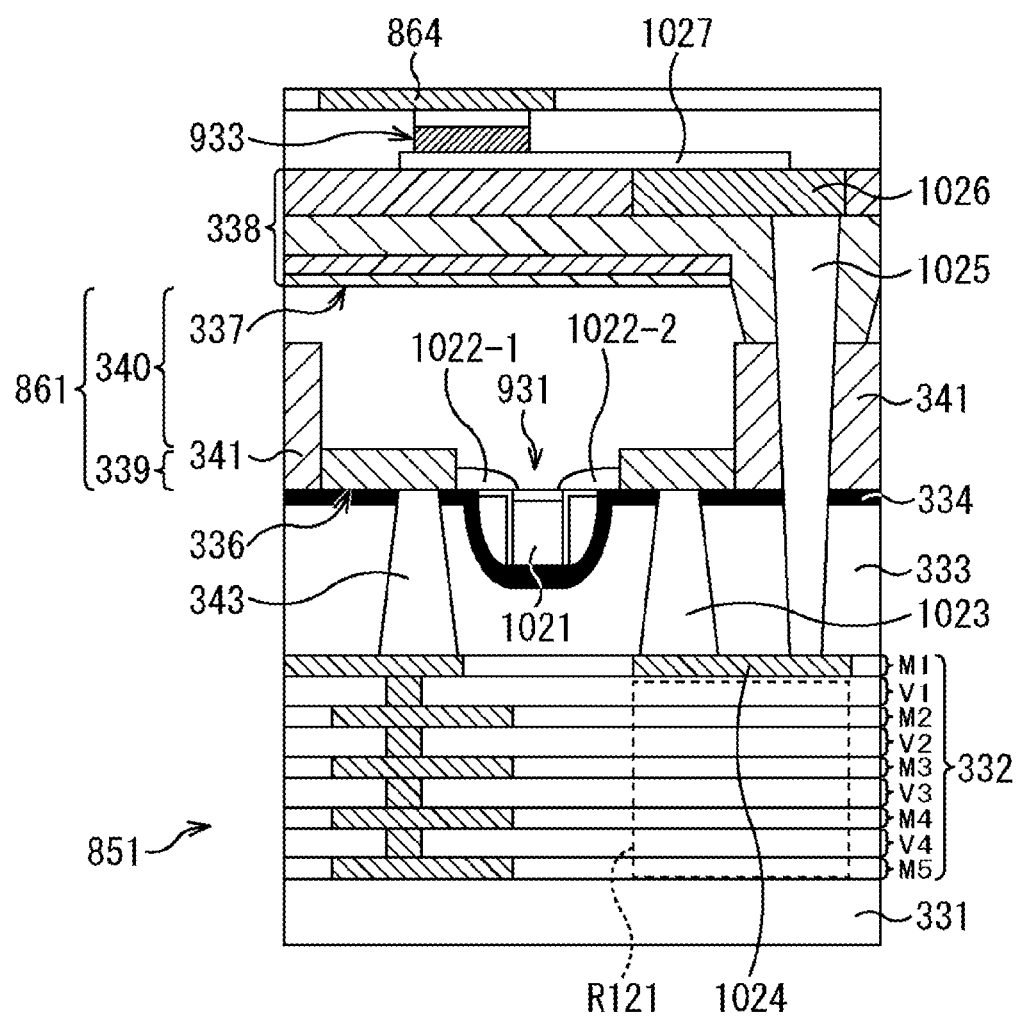
FIG. 36 is a view explaining a cross section of the semiconductor device.

More specifically, a cross section of a portion of the selection transistor 931 in the semiconductor device 851, for example, is as depicted in FIG. 36. It should be noted that in FIG. 36, portions corresponding to those in the case of FIG. 23 or FIG. 35 are assigned the same reference signs, and a description thereof is suitably omitted herein.

In this example, the semiconductor device 851 has the semiconductor substrate 861. The semiconductor substrate 861 has the semiconductor layer 339, the semiconductor layer 340, and the element isolation layer 341 similarly to the case of the semiconductor substrate 335 depicted in FIG. 23. In addition, the selection transistor 931 is formed on the principal surface 336 side of the semiconductor substrate 861.

That is to say, a gate electrode 1021 of the selection transistor 931 is formed on the principal surface 336 side of the semiconductor substrate 861. In addition, a diffusion region 1022-1 and a diffusion region 1022-2 becoming a source region or a drain region of the selection transistor 931 are formed in the semiconductor layer 339 of the semiconductor substrate 861.

It should be noted that hereinafter, in the case where the diffusion region 1022-1 and the diffusion region 1022-2 do not need to be especially distinguished from each other, the diffusion region 1022-1 and the diffusion region 1022-2 shall be simply referred to as the diffusion region 1022 as well.

In addition, a contact 1023 connected to the diffusion region 1022-2 of the selection transistor 931 is formed in the interlayer insulating layer 333. A wiring 1024 provided in the wiring layer M1 is connected to an end on a side opposite to the side of the diffusion region 1022-2 of the contact 1023.

Moreover, a contact 1025 which extends completely through the interlayer insulating layer 333, the interlayer insulating layer 334, and the semiconductor substrate 861 to electrically connect the principal surface 336 side and the back surface 337 side of the semiconductor substrate 861 to each other is provided in the wiring 1024. The contact 1025 is formed so as to be surrounded by (covered with) the element isolation layer 341 in a portion of the semiconductor substrate 861. In a word, in the portion of the semiconductor substrate 861, the contact 1025 extends completely through the element isolation layer 341 portion.

In addition, a wiring 1026 is connected to an end of the contact 1025 in the insulating layer 338 provided on the back surface 337 side of the semiconductor substrate 861. A wiring 1027 is connected to the wiring 1026, and the MTJ 933 is connected to an end of the wiring 1027. Moreover, the control line 864 is connected to the MTJ 933.

In such a way, the transistors such as the selection transistor 931, and the wirings are formed on the principal surface 336 side of the semiconductor substrate 861, and the MTJ 933 and the control line 864 are formed on the back surface 337 side of the semiconductor substrate 861. As a result, an arbitrary wiring can be provided in a portion of, for example, a region R121 on the principal surface 336 side of the semiconductor substrate 861. As a result, the semiconductor device 851 can be miniaturized.

In addition, by arranging the MTJ 933 and the control line 864 on the back surface 337 side, the MTJs can be formed approximately in the final process of the manufacturing process for the semiconductor device 851. Therefore, the addition of the temperature to the MTJ during the process for forming the multi-layer interconnection can be reduced, and as a result, the characteristics deterioration of the MTJ can be prevented from being caused. As a result, the yield of the semiconductor device 851 can also be enhanced.

It should be noted that although it is explained here that the MTJ 933 and the MTJ 934, and the control line 864 are arranged on the back surface 337 side, in this case, the MTJ 993, the MTJ 994, and the control line 866 are also arranged on the back surface 337 side of the semiconductor substrate 861. Therefore, for example, the MTJ 993 and the MTJ 994, similarly to the case in the MTJ 933, are connected to the selection transistor 991 and the selection transistor 992 by a contact similar to the contact 1025.

Figure 37:
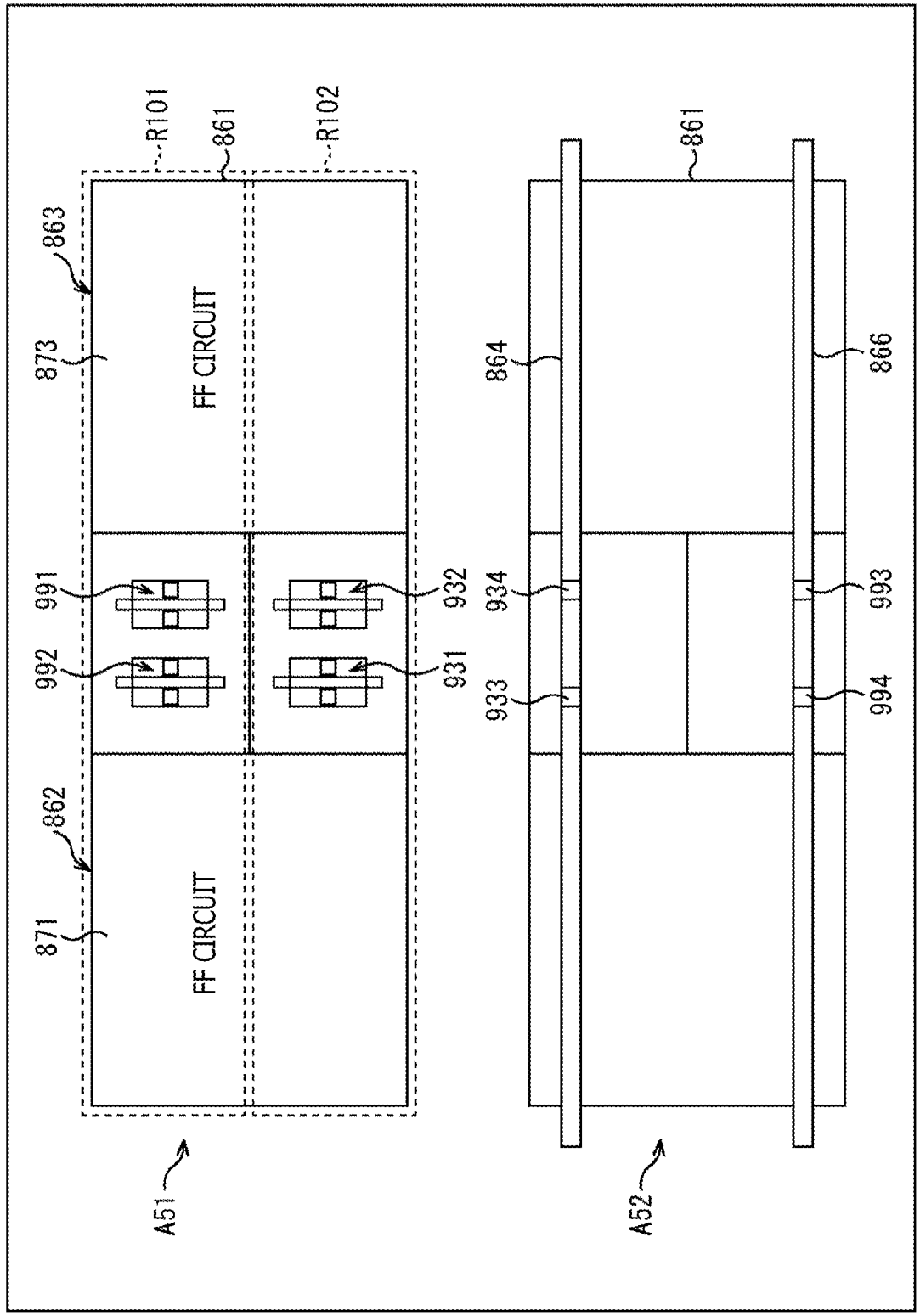
FIG. 37 is a view explaining arrangement of elements in a cell.

Therefore, the arrangement (layout) of the elements when the semiconductor substrate 861 configuring the semiconductor device 851 is viewed from the principal surface 336 side and the back surface 337 side, for example, is as depicted in FIG. 37. It should be noted that in FIG. 37, portions corresponding to those in the case of FIG. 34 or FIG. 36 are assigned the same reference signs, and a description thereof is suitably omitted herein.

As indicated by an arrow A51 in FIG. 37, the FF circuit 871, and the selection transistor 931 and the selection transistor 932 configuring the NVPG portion 872 are arranged on the principal surface 336 side of the semiconductor substrate 861 configuring the semiconductor device 851.

In addition, the FF circuit 873, and the selection transistor 991 and the selection transistor 992 configuring the NVPG portion 874 are arranged on the principal surface 336 side of the semiconductor substrate 861. Besides, although not illustrated, the control line 865 and the control line 867, for example, depicted in FIG. 31 are also arranged on the principal surface 336 side of the semiconductor substrate 861.

On the other hand, as indicated by an arrow A52, the MTJ 933, the MTJ 934, the control line 864, the MTJ 993, the MTJ 994, and the control line 866 are arranged on the back surface 337 side of the semiconductor substrate 861 configuring the semiconductor device 851.

Fourth Embodiment

<Example of Configuration of Semiconductor Device>

Incidentally, in the case where for realizing the NVPG, the MTJ is connected as the non-volatile element to the volatile logic circuit through the transistor, owing to the processing dispersion, the characteristics failure due to the dispersion in the write characteristics and the read characteristics, or the characteristics failure due to the dust, the damage or the like are generated in the MTJs in some cases.

For this reason, it is important to adopt the circuit configuration with which in the case where the characteristics failure is generated in the MTJ, the MTJ which is connected to the volatile logic circuit and in which the characteristics failure is generated can be replaced with another MTJ.

Figure 38:
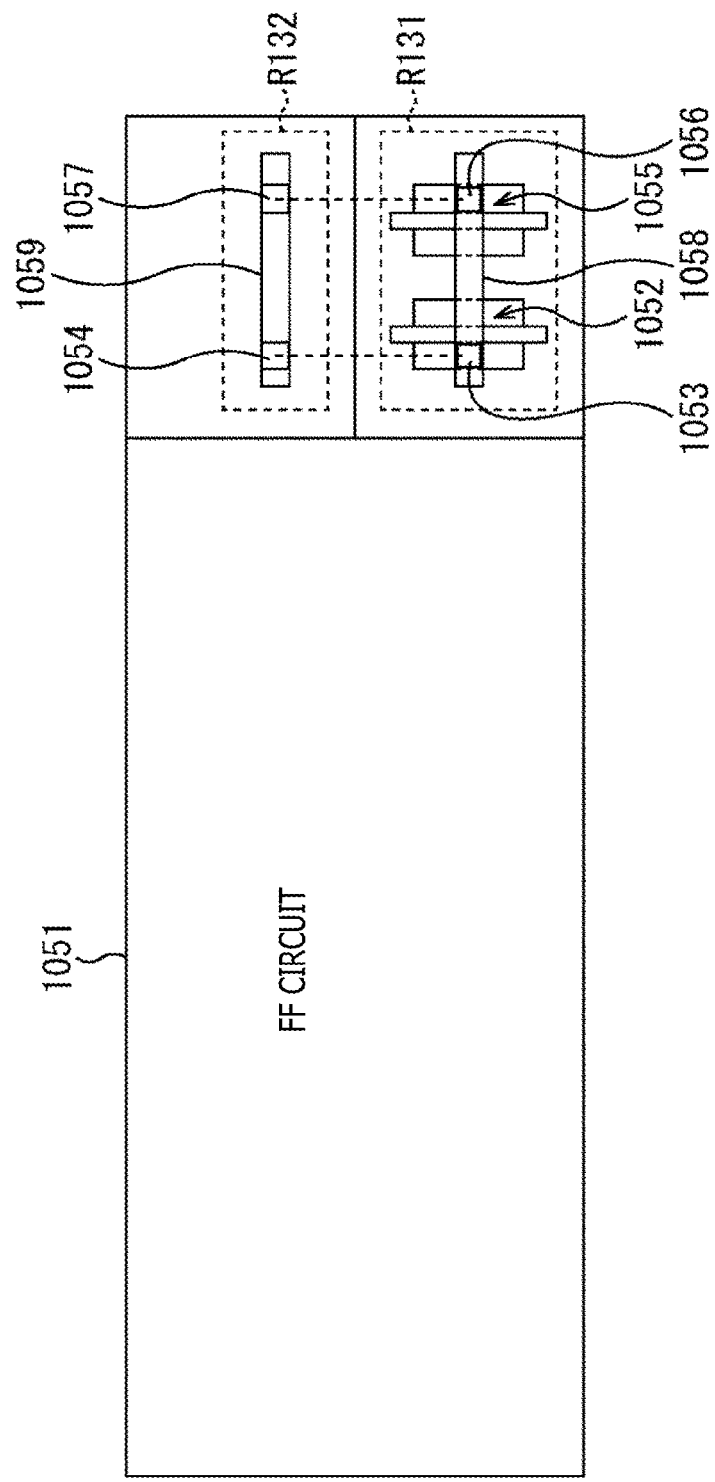
FIG. 38 is a view explaining arrangement of MTJs and redundant relief.

For such a configuration, it is assumed that, for example, as depicted in FIG. 38, an MTJ 1053 and an MTJ 1054 are connected to an FF circuit 1051 through a selection transistor 1052, and an MTJ 1056 and an MTJ 1057 are connected to the FF circuit 1051 through a selection transistor 1055. In addition, it is assumed that a control line 1058 is connected to the MTJ 1053 and the MTJ 1056, and a control line 1059 is connected to the MTJ 1054 and the MTJ 1057.

Here, the MTJ 1054 is an MTJ for redundant relief for the MTJ 1053, and the MTJ 1057 is an MTJ for redundant relief for the MTJ 1056.

If such a circuit configuration is adopted, then, even in the case where, for example, the characteristics failure is generated in the MTJ 1053, the normal operation can be carried out by using the MTJ 1054 instead of the MTJ 1053.

However, in the case where such a configuration is adopted, other wirings cannot be provided not only in a region R131 in which the MTJ 1053 and the MTJ 1056, and the control line 1058 are provided, but also in a region R132 in which the MTJ 1054, the MTJ 1057, and the control line 1059 are provided.

That is to say, for example, as described above with reference to FIG. 7, for drawing of the MTJ up to the upper layer, the via and the wiring, in a word, the stack via needs to be formed. In this case, other wiring cannot be arranged in the region of the stack via, and other wiring cannot be arranged in a portion as well of the control line connected to the MTJ. As a result, the circuit area becomes large. Moreover, in this example, since the MTJs for redundant relief are also formed, the circuit area becomes large due to the formation of these MTJs and the control lines themselves.

Then, in the present technology, by arranging the MTJs on the back surface side of the semiconductor substrate, the more compact semiconductor device is enabled to be obtained.

Figure 39:
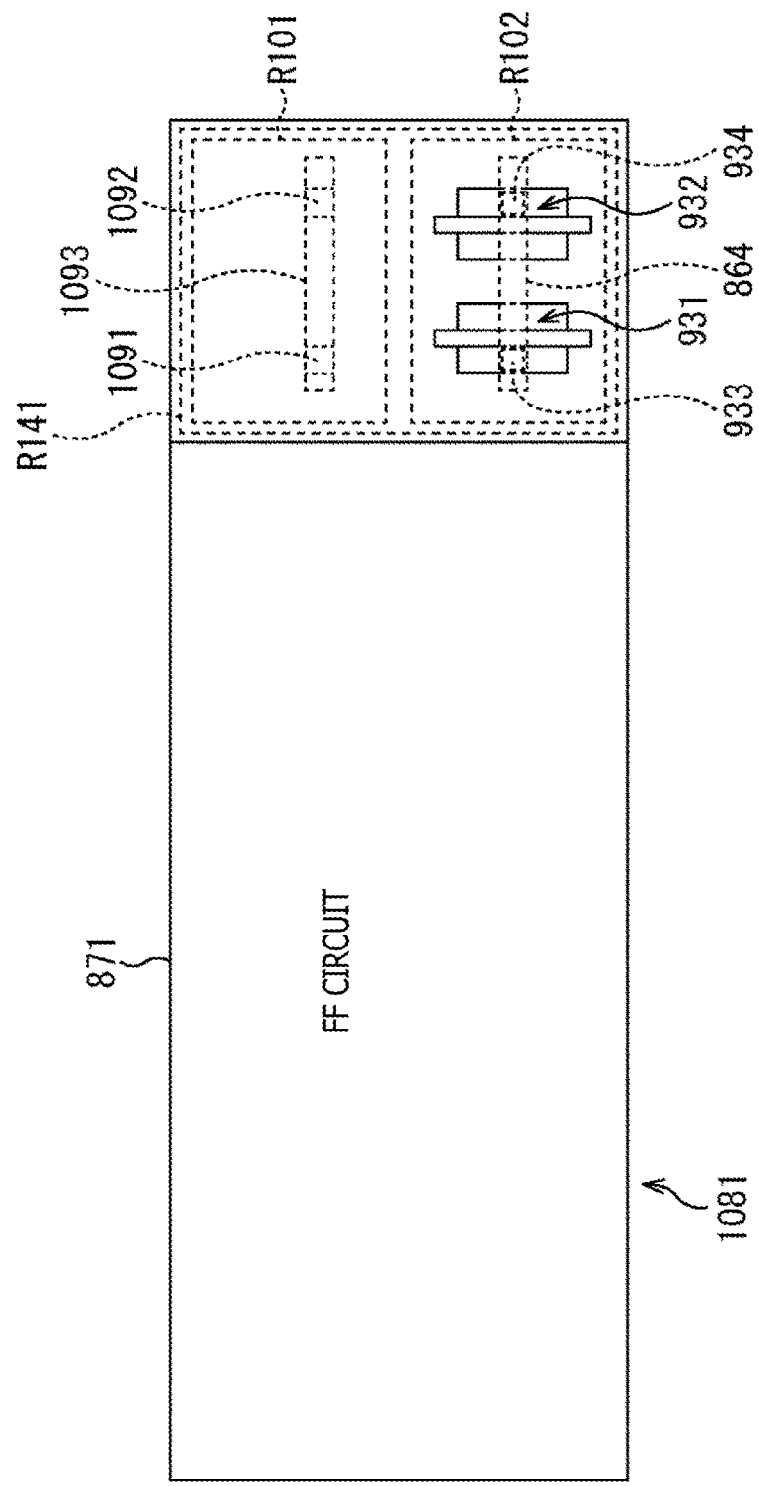
FIG. 39 is a view depicting an example of a configuration of a semiconductor device.

FIG. 39 depicts an example of a configuration of a semiconductor device to which the present technology is applied. It should be noted that in FIG. 39, portions corresponding to those in the case of FIG. 35 are assigned the same reference signs, and a description thereof is suitably omitted herein.

In the example depicted in FIG. 39, a semiconductor device 1081 has the FF circuit 871, the selection transistor 931, the selection transistor 932, the MTJ 933, the MTJ 934, an MTJ 1091, an MTJ 1092, the control line 864, and a control line 1093.

The MTJ 933 and the MTJ 1091 are connected to the FF circuit 871 through the selection transistor 931. Here, the MTJ 1091 is an MTJ for redundant relief for the MTJ 933.

Therefore, the storage and the restorage with respect to the storage node 925 configuring the FF circuit 871 are carried out by using only one of the MTJ 933 and the MTJ 1091.

In addition, the MTJ 934 and the MTJ 1092 are connected to the FF circuit 871 through the selection transistor 932. Here, the MTJ 1092 is an MTJ for redundant relief for the MTJ 934. Therefore, the storage and the restorage with respect to the storage node 926 configuring the FF circuit 871 are carried out by using only one of the MTJ 934 and the MTJ 1092.

Moreover, the control line 864 used to control the MTJ 933 and the MTJ 934 is connected to the MTJ 933 and the MTJ 934. The control line 1093 used to control the MTJ 1091 and the MTJ 1092 is connected to the MTJ 1091 and the MTJ 1092.

In the semiconductor device 1081, the FF circuit 871, the selection transistor 931, and the selection transistor 932 are provided on the principal surface side of the semiconductor substrate configuring the semiconductor device 1081.

On the other hand, in the semiconductor device 1081, the MTJ 933, the MTJ 934, the control line 864, the MTJ 1091, the MTJ 1092, and the control line 1093 are provided on the back surface side of the semiconductor substrate configuring the semiconductor device 1081. For this reason, in FIG. 39, the MTJ 933, the MTJ 934, the control line 864, the MTJ 1091, the MTJ 1092, and the control line 1093 are drawn by a dotted line.

Therefore, on the principal surface side of the semiconductor substrate configuring the semiconductor device 1081, an arbitrary wiring can be arranged in a portion on this side in a region R141 in the figure. As a result, the semiconductor device 1081 can be miniaturized.

More specifically, for example, the configuration of the vicinity of the selection transistor 931 of the semiconductor device 1081 is the same as the configuration depicted in FIG. 36.

That is to say, the semiconductor device 1081 has the semiconductor substrate 861. For example, as indicated by an arrow A61 of FIG. 40, the FF circuit 871, the selection transistor 931, and the selection transistor 932 are arranged on the principal surface 336 side of the semiconductor substrate 861. Therefore, an arbitrary wiring can be freely provided in the region of the portion other than the selection transistor 931 and the selection transistor 932 in the region R141.

Figure 40:
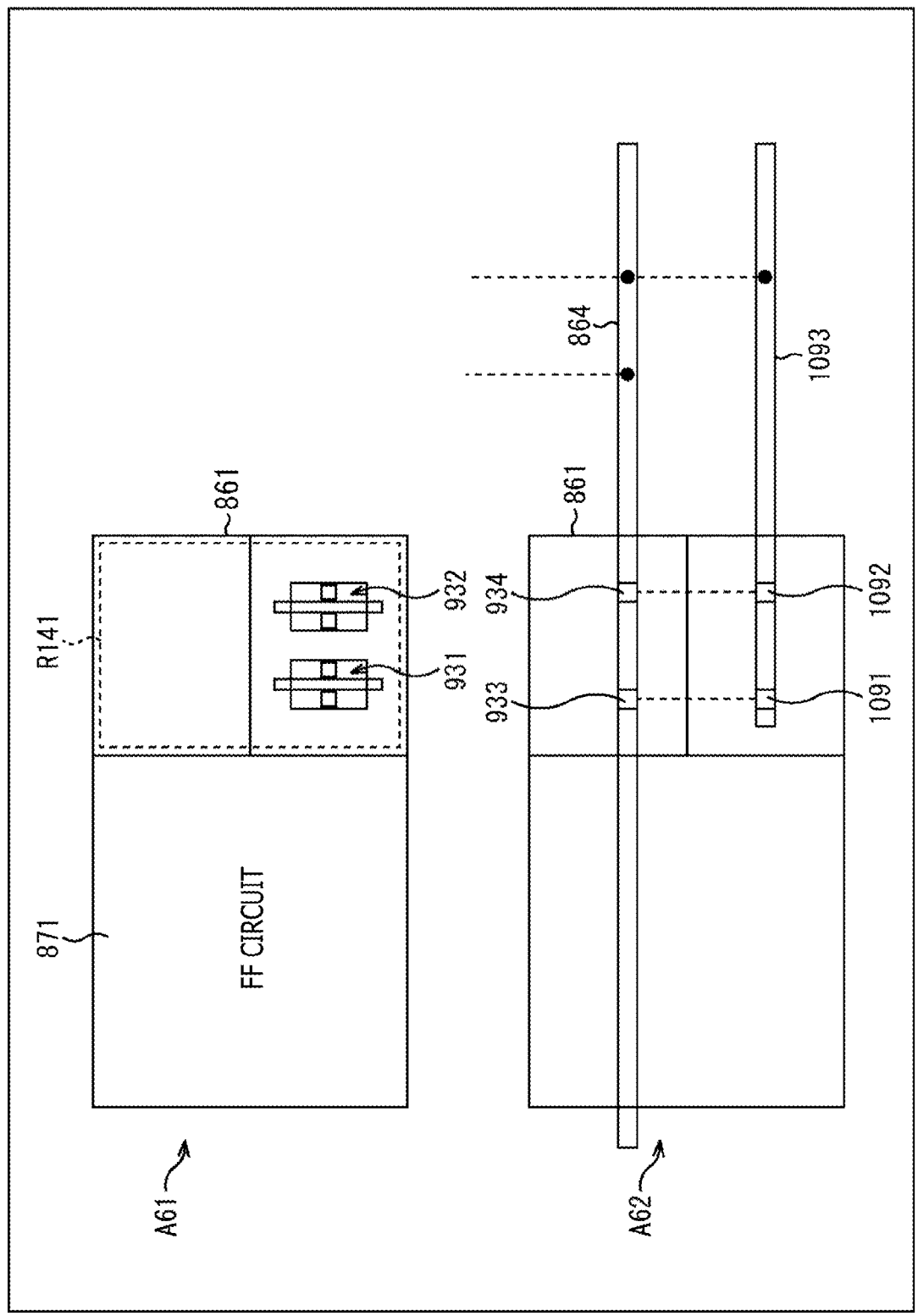
FIG. 40 is a view explaining arrangement of elements in a semiconductor device.

It should be noted that in FIG. 40, portions corresponding to those in the case of FIG. 37 or FIG. 39 are assigned the same reference signs, and a description thereof is suitably omitted herein.

In addition, as indicated by an arrow A62, the MTJ 933, the MTJ 934, the control line 864, the MTJ 1091, the MTJ 1092, and the control line 1093 are arranged on the back surface 337 side of the semiconductor substrate 861 configuring the semiconductor device 1081.

Since the wiring and the like are not especially arranged except for the MTJs and the control lines on the back surface 337 side of the semiconductor substrate 861, the MTJ 1091 and the MTJ 1092 for redundant relief, the control line 1093, and the like can be freely arranged.

Therefore, for example, as the MTJ for redundant relief for the MTJ 933, not only the MTJ 1091, but also a plurality of MTJs including the MTJ 1091 can be connected to the selection transistor 931, and these MTJs can also be arranged on the back surface 337 side of the semiconductor substrate 861. Likewise, as the MTJ for redundant relief for the MTJ 934, a plurality of MTJs including the MTJ 1092 can be connected to the selection transistor 932, and these MTJs can be arranged on the back surface 337 side of the semiconductor substrate 861.

Even in such a case, since a sufficient region is secured on the back surface 337 side of the semiconductor substrate 861, the circuit of the semiconductor device 1081 is prevented from becoming large.

<Modified Change 1 of Fourth Embodiment>
<Example of Configuration of Semiconductor Device>

In addition, similarly to the case of the semiconductor device 851, not only the FF circuit 871, but also the FF circuit 873, the selection transistor 991, the selection transistor 992, the MTJ 993, and the MTJ 994 may be provided in the semiconductor device 1081 depicted in FIG. 39. Moreover, the MTJs for redundant relief for the MTJ 993 and the MTJ 994 may also be provided.

In such a case, the arrangement of the elements on the principal surface 336 side of the semiconductor substrate 861 of the semiconductor device 1081, for example, becomes identical to the arrangement depicted in FIG. 37.

Figure 41:
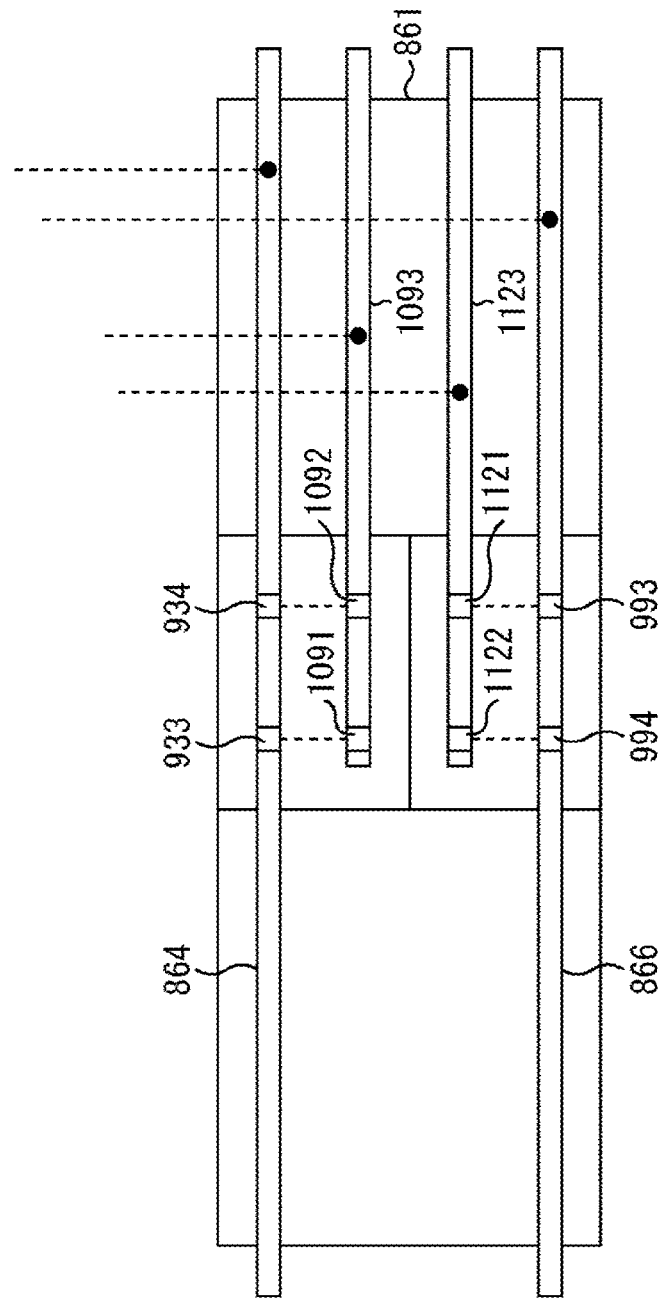
FIG. 41 is a view explaining arrangement of elements in a semiconductor device.

In addition, the arrangement of the MTJ and the like on the back surface 337 side of the semiconductor substrate 861 of the semiconductor device 1081, for example, is as depicted in FIG. 41. It should be noted that in FIG. 41, portions corresponding to those in the case of FIG. 37 or FIG. 40 are assigned the same reference signs, and a description thereof is suitably omitted herein.

In the example depicted in FIG. 41, in addition to the MTJ 933, the MTJ 934, the control line 864, the MTJ 1091, the MTJ 1092, and the control line 1093 depicted in FIG. 40, the MTJ 993, the MTJ 994, the control line 866, an MTJ 1121, an MTJ 1122, and a control line 1123 are arranged.

Here, the MTJ 1121 and the MTJ 1122 are MTJs for redundant relief. The MTJ 1121 is connected to the storage node 985 of the FF circuit 873 through the selection transistor 991, and the MTJ 1122 is connected to the storage node 986 of the FF circuit 873 through the selection transistor 992. In addition, the control line 1123 used to control the MTJ 1121 and the MTJ 1122 is connected to the MTJ 1121 and the MTJ 1122.

In this example as well, nothing is arranged on the left side in the back surface 337 of the semiconductor substrate 861 in the figure, and thus the MTJ for redundant relief, and the like can be further arranged in this region.

Fifth Embodiment

<Arrangement of MTJ for Dummy>

In addition, similarly to the example described with reference to FIG. 20, even in the semiconductor device 851 described in the modified change 1 of the third embodiment, or even in the semiconductor device 1081 described in the fourth embodiment, a plurality of MTJs for dummy may be arranged on the back surface 337 side of the semiconductor substrate 861.

Figure 42:
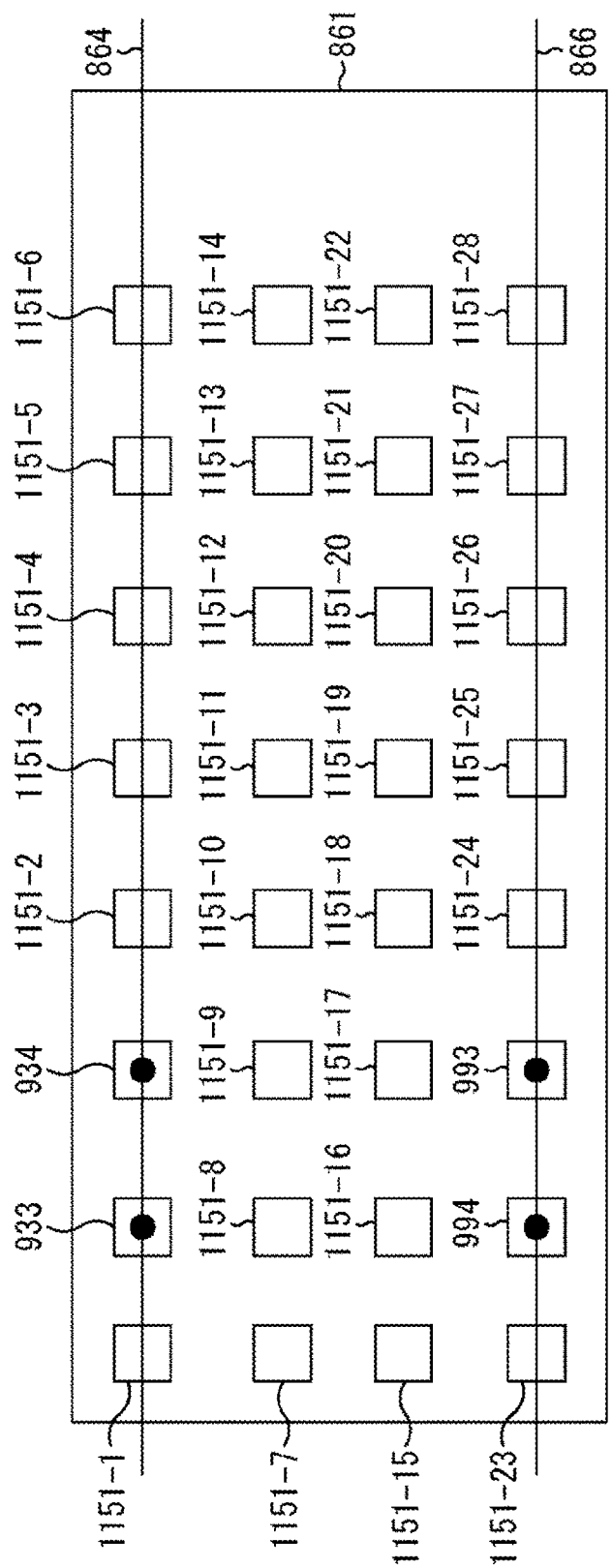
FIG. 42 is a view explaining arrangement of MTJs.

For example, in the case where the MTJs for dummy are arranged in the semiconductor device 851, as depicted in FIG. 42, a plurality of MTJs are arranged regularly in the horizontal direction and in the vertical direction on the surface of the insulating layer 338 in the semiconductor substrate 861 within the region R101 and the region R102 of the semiconductor device 851. It should be noted that in FIG. 42, portions corresponding to those in the case of FIG. 37 are assigned the same reference signs, and a description thereof is suitably omitted herein.

FIG. 42 is a view when the surface of the insulating layer 338 is viewed from the direction vertical to the semiconductor substrate 861. In the example depicted in FIG. 42, the MTJ 933, the MTJ 934, the MTJ 993, and the MTJ 994 which are necessary for the operation of the semiconductor device 851, and an MTJ 1151-1 to an MTJ 1151-28 for dummy which are unnecessary for the operation of the semiconductor device 851 are regularly arranged in the longitudinal direction and in the transverse direction in the figure.

It should be noted that hereinafter, in the case where the MTJ 1151-1 to the MTJ 1151-28 do not need to be especially distinguished from one another, the MTJ 1151-1 to the MTJ 1151-28 shall be simply referred to as the MTJ 1151 as well.

Not only the MTJ 933, the MTJ 934, the MTJ 993, and the MTJ 994 which become actually necessary, but also the MTJs 1151 are formed on the same layer in such a way, whereby the processing dispersion can be further reduced at the time of formation of the MTJs than in the case where the MTJs are locally arranged. As a result, the characteristics of the MTJ can be enhanced.

Figure 43:
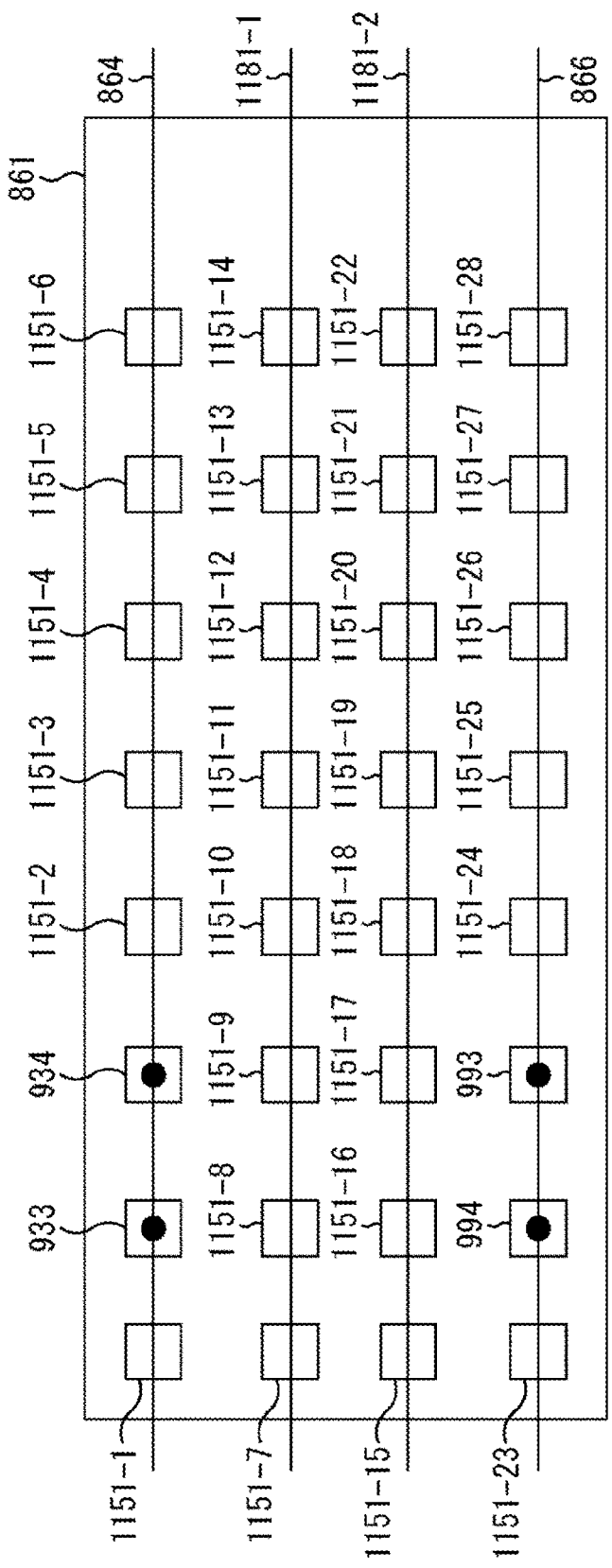
FIG. 43 is a view explaining arrangement of MTJs.

At this time, for example, as depicted in FIG. 43, any one of a control line 1181-1 and a control line 1181-2 is connected to some of the MTJs 1151, and the MTJs 1151 are connected to the selection transistor 931, the selection transistor 932, the selection transistor 991, the selection transistor 992 and the like. As a result, these MTJs 1151 can also be used as the MTJs for redundant relief. It should be noted that in FIG. 43, portions corresponding to those in the case of FIG. 42 are assigned the same reference signs, and a description thereof is suitably omitted herein.

In this case as well, similarly to the example depicted in FIG. 21, a circuit similar to the selection circuit 27 depicted in FIG. 1 is provided as may be necessary, thereby enabling an arbitrary MTJ 1151 to be set as the MTJ for redundant relief.

The present technology which has been described so far can be applied to the overall various kinds of electronic apparatuses such as an image pickup apparatus such as a digital still camera or a video camera, and a mobile terminal apparatus.

In addition, embodiments of the present technology are by no means limited to the embodiments described above, and various changes can be made without departing from the subject matter of the present technology.

Moreover, the present technology can also adopt the following constitutions.

(1)

A semiconductor device, including:

a volatile logic circuit;

a plurality of non-volatile elements connected to the volatile logic circuit through a same connection gate; and each of a plurality of control lines connected to the respective non-volatile elements.

(2)

The semiconductor device according to (1), in which the plurality of non-volatile elements are connected every storage node within the volatile logic circuit through the connection gate.

(3)

The semiconductor device according to (1) or (2), in which the non-volatile elements are each either a ferromagnetic tunnel junction element or a resistance variable element.

(4)

The semiconductor device according to any one of (1) to (3), in which the plurality of non-volatile elements have the same size.

(5)

The semiconductor device according to any one of (1) to (3), in which the plurality of non-volatile elements have sizes different from one another.

(6)

The semiconductor device according to any one of (1) to (3), in which the plurality of non-volatile elements include the non-volatile elements having the same size, and the non-volatile elements having sizes different from one another.

(7)

The semiconductor device according to any one of (1) to (6), in which the plurality of non-volatile elements include a non-volatile element for redundant relief.

(8)

The semiconductor device according to any one of (1) to (7), in which the plurality of non-volatile elements are provided in layers different from one another.

(9)

A semiconductor device, including:
a volatile storage element; and
a non-volatile element provided on a back surface side opposite to a principal surface side on which the volatile storage element is provided in a substrate, and connected to a storage node of the volatile storage element by a contact through which the principal surface side and the back surface side of the substrate are connected to each other.

(10)

The semiconductor device according to (9), in which a control line for control for the non-volatile element is provided on the back surface side of the substrate.

(11)

The semiconductor device according to (9) or (10), in which a selection transistor for electrically connecting the non-volatile element and the storage node to each other is provided on the principal surface side of the substrate, one diffusion region of the selection transistor is connected to the contact, and another diffusion region of the selection transistor is connected to the storage node.

(12)

The semiconductor device according to any one of (9) to (11), in which the non-volatile element is a ferromagnetic tunnel junction element.

(13)

The semiconductor device according to any one of (9) to (11), in which the non-volatile element is a resistance variable memory.

(14)

The semiconductor device according to (11), in which a plurality of transistors configuring the volatile storage element and the selection transistor are provided in such a way that gate electrodes of the transistors and a gate electrode of the selection transistor become parallel to each other, and the gate electrodes are arranged side by side in a linear fashion, and two selection transistors as the selection transistor are arranged in diagonal positions opposing to each other so as to be adjacent to a region in which the plurality of transistors are provided.

(15)

The semiconductor device according to (11), in which a plurality of transistors configuring the volatile storage element are arranged in a predetermined region in such a way that gate electrodes of the plurality of transistors become parallel to one another, and the selection transistor and the non-volatile element are arranged in a region adjacent to the predetermined region, and the selection transistor is arranged in such a way that a gate electrode of the selection transistor becomes parallel to the gate electrodes of the transistors.

(16)

The semiconductor device according to (11), in which the substrate has a p-type well region and an n-type well region adjacent to each other, a plurality of transistors configuring the volatile storage element are arranged in the p-type well region and the n-type well region, and the selection transistor is arranged in both end positions of a region in which the transistors are arranged in the p-type well region, and the plurality of transistors and the selection transistors are arranged in such a way that gate electrodes of the transistors and gate electrodes of the selection transistors become parallel to each other.

(17)

The semiconductor device according to (11), in which the substrate has a p-type well region and an n-type well region adjacent to each other, a plurality of transistors configuring the volatile storage element are arranged in the p-type well region and the n-type well region, the selection transistor is arranged in a region adjacent in a direction approximately vertical to a direction in which the p-type well region and the n-type well region are arranged side by side with respect to a region in which the plurality of transistors configuring the volatile storage element are arranged, and the plurality of transistors and the selection transistor are arranged in such a way that gate electrodes of the transistors and a gate electrode of the selection transistor become parallel to each other.

(18)

The semiconductor device according to (11), in which the substrate has a p-type well region and an n-type well region adjacent to each other, a plurality of transistors configuring the volatile storage element are arranged in the p-type well region and the n-type well region, and the selection transistor is arranged in both end positions of a region in which the transistors are arranged in the n-type well region, and the plurality of transistors and the selection transistors are arranged side by side in a direction approximately vertical to a direction in which the p-type well region and the n-type well region are arranged side by side in such a way that gate electrodes of the plurality of transistors and gate electrodes of the selection transistors become parallel to each other.

(19)

The semiconductor device according to (10), in which a selection transistor for electrically connecting the non-volatile element and the control line to each other is provided on the principal surface side of the substrate, one end of the non-volatile element is connected to the contact, and another end of the non-volatile element is connected to the selection transistor.

(20)

The semiconductor device according to (19), in which the substrate has a p-type well region and an n-type well region adjacent to each other, a plurality of transistors configuring the volatile storage element are arranged in the p-type well region and the n-type well region, and the selection transistor is arranged in both end positions of a region in which the transistors are arranged in the n-type well region, and the plurality of transistors and the selection transistors are arranged side by side in a direction approximately vertical to a direction in which the p-type well region and the n-type well region are arranged side by side in such a way that gate electrodes of the plurality of transistors and gate electrodes of the selection transistors become parallel to each other.

(21)

The semiconductor device according to any one of (9) to (17), in which the plurality of non-volatile elements including the non-volatile element connected to the storage node are provided on the back surface side of the substrate.

(22)

The semiconductor device according to (18), in which some of the plurality of non-volatile elements are non-volatile elements for redundant relief.

(23)

A semiconductor device, including:

a volatile storage element;

a selection transistor connected to a storage node of the volatile storage element; and a non-volatile element connected to the storage node through the selection transistor, in which a plurality of transistors configuring the volatile storage element and the selection transistor are provided in such a way that gate electrodes of the transistors and a gate electrode of the selection transistor become parallel to each other, and the gate electrodes are arranged side by side in a linear fashion, and two selection transistors as the selection transistor are arranged in diagonal positions opposing to each other so as to be adjacent to a region in which the plurality of transistors are provided.

(24)

A semiconductor device, including:

a first non-volatile circuit having a volatile storage element, a first selection transistor connected to a storage node of the volatile storage element, and a non-volatile element connected to the storage node through the first selection transistor, and a second non-volatile circuit having the volatile storage element, a second selection transistor which is different in kind from the first selection transistor and is connected to the storage node of the volatile storage element, and the non-volatile element connected to the storage node through the second selection transistor.

(25)

The semiconductor device according to (24), in which the first non-volatile circuit and the second non-volatile circuit are provided adjacent to each other.

(26)

The semiconductor device according to (24) or (25), in which the first selection transistor is an nMOS transistor, and the second selection transistor is a pMOS transistor.

(27)

The semiconductor device according to any one of (24) to (26), in which the first selection transistor and the second selection transistor are connected to control lines different from each other.

(28)

The semiconductor device according to (26), in which a first control line is connected to the non-volatile element provided in the first non-volatile circuit, and a second control line different from the first control line is connected to the non-volatile element provided in the second non-volatile circuit.

(29)

The semiconductor device according to (28), in which at a time of storage of information held in the storage node, a voltage at a high level, and a voltage at a low level are applied in order to the first control line and the second control line, and at a time of restorage of the information, a voltage at a low level is applied to the first control line, and a voltage at a high level is applied to the second control line.

(30)

The semiconductor device according to (28) or (29), in which the volatile storage element, the first selection transistor, and the second selection transistor are provided on a principal surface side in a substrate, and the non-volatile element, the first control line, and the second control line are provided on a back surface side opposite to the principal surface side of the substrate, and the first selection transistor and the second selection transistor, and the non-volatile element of the first non-volatile circuit and the non-volatile element of the second non-volatile circuit are connected to each other by a contact through which the principal surface side and the back surface side of the substrate are connected to each other.

(31)

The semiconductor device according to (30), in which the plurality of non-volatile elements including the non-volatile element connected to the storage node are provided on the back surface side of the substrate.

(32)

The semiconductor device according to (31), in which some of the plurality of non-volatile elements are non-volatile elements for redundant relief.

REFERENCE SIGNS LIST

11 . . . Semiconductor device, 21 . . . Volatile logic circuit, 22 . . . Transistor, 23-1, 23-2, 23 . . . MTJ, 24-1, 24-2, 24 . . . MTJ, 25 . . . Transistor, 27 . . . Selection circuit, 211 . . . Semiconductor device, 221 . . . Volatile logic circuit, 222 . . . Connection gate, 223 . . . Non-volatile element, 255 . . . Selection transistor, 256 . . . MTJ, 257 . . . Selection transistor, 258 . . . MTJ, 306 . . . Contact, 335 . . . Semiconductor substrate, 644 . . . Contact, 645 . . . Wiring, 671 . . . Contact, 851 . . . Semiconductor device, 862 . . . Cell, 863 . . . Cell, 871 . . . FF circuit, 872 . . . NVPG portion, 873 . . . FF circuit, 874 . . . NVPG portion

What is claimed is:

1. A semiconductor device, comprising:
    a volatile logic circuit;
    a plurality of non-volatile elements connected to the volatile logic circuit through a same connection gate; and
    each of a plurality of control lines connected to the respective non-volatile elements,
    wherein the plurality of non-volatile elements include the non-volatile elements having the same transverse diameter size, and the non-volatile elements having diameter sizes different from one another including three or more different diameter sizes from each other.

2. The semiconductor device according to claim 1, wherein the plurality of non-volatile elements are connected to every storage node within the volatile logic circuit through the connection gate.

3. The semiconductor device according to claim 1, wherein the non-volatile elements are each either a ferromagnetic tunnel junction element or a resistance variable element.

4. The semiconductor device according to claim 1, wherein the plurality of non-volatile elements include a non-volatile element for redundant relief.

5. The semiconductor device according to claim 1, wherein the plurality of non-volatile elements are provided in layers different from one another.

6. A semiconductor device, comprising:
- a volatile storage element;
- first and second selection transistors each connected to a storage node of the volatile storage element; and
- a non-volatile element connected to the storage node through each of the first and second selection transistors,
- wherein a plurality of rows of a plurality of transistors configuring the volatile storage element and the first and second selection transistors are provided in such a way that gate electrodes of a first row of the plurality of transistors and a gate electrode of the first selection transistor in the first row are parallel to each other, and the gate electrodes of the first row of the plurality of transistors and the first selection transistor are arranged side by side in a straight line across the first row,
- wherein the gate electrodes of a second row of the plurality of transistors and a gate electrode of the second selection transistor arranged either below or above the first row of the plurality of transistors and the first selection transistor are parallel to each other, and the gate electrodes of the second row of the plurality of transistors and the second selection transistor are arranged side by side in a straight line across the second row, and
- wherein the first and second selection transistors are arranged in diagonal positions at opposing ends of the first and second rows of the plurality of transistors.

* * * * *